(12) United States Patent
Fukuhara et al.

(10) Patent No.: US 7,790,351 B2
(45) Date of Patent: Sep. 7, 2010

(54) POSITIVE RESIST COMPOSITION AND PATTERN MAKING METHOD USING THE SAME

(75) Inventors: Toshiaki Fukuhara, Shizuoka (JP); Shinichi Kanna, Shizuoka (JP); Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/363,303

(22) Filed: Jan. 30, 2009

(65) Prior Publication Data

US 2009/0136870 A1 May 28, 2009

Related U.S. Application Data

(63) Continuation of application No. 11/636,633, filed on Dec. 11, 2006, now Pat. No. 7,504,194.

(30) Foreign Application Priority Data

Dec. 9, 2005 (JP) ............... 2005-356716
Mar. 17, 2006 (JP) ............... 2006-075069
Sep. 22, 2006 (JP) ............... 2006-257554

(51) Int. Cl.
G03F 7/00 (2006.01)
G03F 7/004 (2006.01)

(52) U.S. Cl. .............. 430/270.1; 430/311; 430/905; 430/913; 430/914; 430/945

(58) Field of Classification Search .......... 430/270.1, 430/905, 311, 945, 913, 914
See application file for complete search history.

(56) References Cited

U.S. PATENT DOCUMENTS

| | | | |
|---|---|---|---|
| 4,480,910 A | 11/1984 | Takanashi et al. | |
| 6,051,362 A | 4/2000 | Choi et al. | |
| 6,653,048 B2 | 11/2003 | Brock et al. | |
| 6,770,419 B2 | 8/2004 | Khojasteh et al. | |
| 6,994,946 B2 | 2/2006 | Hatakeyama et al. | |
| 7,232,638 B2 | 6/2007 | Hatakeyama et al. | |
| 7,279,256 B2 | 10/2007 | Son | |
| 7,541,131 B2 * | 6/2009 | Kawanishi | 430/270.1 |

FOREIGN PATENT DOCUMENTS

| | | |
|---|---|---|
| EP | 1 164 433 A1 | 12/2001 |
| EP | 1 500 977 A1 | 1/2005 |
| EP | 1 566 693 A2 | 8/2005 |
| JP | 57-153433 A | 9/1982 |
| JP | 2002-303978 A | 10/2002 |
| WO | 02/082184 A1 | 10/2002 |
| WO | 2004-068242 A1 | 8/2004 |
| WO | 2005/003198 | 1/2005 |

OTHER PUBLICATIONS

B. J.Lin Semiconductor foundry, lithography, and partners:, SPIE Proc 4688, 11 (200).
J. A. Hoffnagle et al., "Liquid immersion deep-ultraviolet interferometric lithography", Vac. Sci. Technology B17 (1999).
European Search Report dated Mar. 20, 2007.
* cited by examiner

*Primary Examiner*—Amanda C. Walke
(74) *Attorney, Agent, or Firm*—Sughrue Mion, PLLC

(57) ABSTRACT

A positive resist composition comprising: (A) a resin showing an increase in the solubility in an alkali developer by the action of an acid; (B) a compound being capable of generating an acid when irradiated with an actinic ray or a radiation; (C) a resin having a silicon-containing repeating unit of a specific structure and being stable to acids but insoluble in an alkali developer; and (D) a solvent; and a pattern making method using the same.

12 Claims, 1 Drawing Sheet

POSITIVE RESIST COMPOSITION AND PATTERN MAKING METHOD USING THE SAME

This is a continuation of application Ser. No. 11/636,633 filed Dec. 11, 2006, now U.S. Pat. No. 7,504,194. The entire disclosure of the prior application is considered part of the disclosure of this continuation application and is hereby incorporated by reference.

BACKGROUND OF THE INVENTION

1. Field of the Invention

This invention relates to a positive resist composition which is usable in the course of producing semiconductors such as ICs, producing liquid crystals or circuit boards such as thermal heads and lithographing other photoapplications, and a pattern making method using the same. In particular, it relates to a positive resist composition appropriately usable in exposure with the use of an immersion type projection exposure device wherein far-ultraviolet light having a wavelength of 300 nm or less is employed as the light source, and a pattern making method using the same.

2. Description of the Related Art

With the recent fine patterning in semiconductors, attempts have been made to shorten the wavelength of an exposure light source and elevate the numerical aperture (high NA) of a projector lens. At present, there has been developed an exposure device with NA 0.84 using an ArF excimer laser beam having a wavelength of 193 nm as a light source. It is widely known that such devices can be indicated by the following formulae.

(Resolution)=$k_1(\lambda/NA)$ (Focal depth)=$\pm k_2 \lambda/NA^2$

In the above formulae, $\lambda$ represents the wavelength of an exposure light source; NA represents the numerical aperture of a projector lens; and $k_1$ and $k_2$ represent coefficients relating to the process.

To further shorten the wavelength and elevate the resolution, studies have been made to employ an exposure device with the use of an F2 excimer laser beam having a wavelength of 157 nm as a light source. In this case, however, the lens material and the resist material to be used in the exposure device for shortening the wavelength are highly restricted. Thus, it becomes very difficult to stabilize the production costs of the device and the materials as well as the qualities thereof. As a result, it is feared that an exposure device and a resist having sufficient performance and stability could not be obtained on time.

As a technique for elevating the resolution of an optical microscope, there has been known a so-called immersion method wherein the space between a projector lens and a sample is filled with a liquid having a high refractive index (hereinafter also called "immersion liquid").

Concerning this "immersion effect", the resolution and focal depth as described above can be indicated by the following formulae, wherein $\lambda_0$ represents the wavelength of the exposure light in air, n represents the air refractive index of the immersion liquid, $\theta$ represents the convergence half angle of the light, and $NA_0$ is referred to as $\sin\theta$.

(Resolution)=$k_1(\lambda_0/n)NA_0$ (Focal depth)=$\pm k_2(\lambda_0/n)NA_0^2$

Namely, the immersion effect is equivalent to using exposure light of the wavelength 1/n. In other words, the immersion makes it possible to elevate n-fold the focal depth in the case of using a projection optical system of the same NA. This is effective on any patterns and, moreover, can be combined with the super-resolution techniques under study, for example, the phase-shift method and the distortion illumination method.

An example of a device in which the above effect is applied to the minute pattern transfer is proposed by, for example, JP-A-57-153433.

Recent advances in the immersion exposure technique are reported by SPIE Proc 4688, 11 (2002), J. Vac. Sci. Technol. B 17 (1999), SPIE Proc 3999, 2 (2000) and so on. In the case of using an ArF excimer laser beam as a light source, it is considered that purified water is the most desirable immersion liquid from the viewpoints of safety in handling, the transmittance and refractive index at 193 nm (refractive index at 193 nm: 1.44). In the case of using an F2 excimer laser beam as a light source, attempts have been made to use a fluorine-containing solution by taking the balance between the transmittance and refractive index at 157 nm into consideration, though no sufficient liquid has been found out so far from the viewpoints the environmental safety and refractive index. Based on the extent of the immersion effect and the achievement level of resists, it is expected that the immersion exposure technique will be applied first to ArF exposure devices.

After the development of a resist for a KrF excimer laser beam (248 nm), use has been made a so-called chemical amplification image forming method that is a resist image forming method for compensating for lowering in sensitivity caused by light absorption. In the positive chemical amplification method for forming an image, for example, an acid-generating agent is decomposed upon exposure in an exposed part to form an acid. In baking after the exposure (PEB: post exposure bake), the acid thus generated is utilized as a reaction catalyst and thus an alkali-insoluble group is converted into an alkali-soluble group. Thus, the exposed part is removed by the alkali development to thereby form an image. As resist compositions of the chemical amplification type, for example, resist compositions comprising a mixture of two or more resins having definite structures are proposed by WO 2005/003198 and JP-A-2002-303978. Although ArF excimer resists using the chemical amplification mechanism have become mainstream in these days, they suffer from a problem that a pattern becomes misshapen when exposed at an ultrafine mask size. Thus, it has been required to overcome this problem.

When a chemical amplification resist is applied to immersion exposure, the resist layer comes into contact with an immersion liquid at the exposure. It is pointed out that, in this step, the resist layer is denatured and a component exerting an undesirable effect on the immersion liquid oozes from the resist layer. According to WO 2004-068242, when a resist for ArF exposure is immersed in water before and after the exposure, the resist performance alters, which is pointed out as a problem in the immersion exposure.

In the case of using a scanning type immersion exposure machine in the immersion exposure process, it is feared that the exposure speed is lowered and thus the productivity is adversely affected unless the immersion liquid follows up the movement of a lens. When water is employed as the immersion liquid, it is required that a resist film has a hydrophobic nature and well follows-up to water.

SUMMARY OF THE INVENTION

Under the problems encountering in the related art as discussed above, the invention aims at providing a positive resist composition, which shows relieved pattern misshaping caused by usual exposure or immersion exposure and has excellent follow-up to water in immersion exposure, and a pattern making method using the same.

Accordingly, the invention is as follows.

(1) A positive resist composition which comprises:

(A) a resin that increases its solubility in an alkali developer by the action of an acid;

(B) a compound being capable of generating an acid when irradiated with an actinic ray or a radiation;

(C) a resin having a silicon-containing repeating unit represented by the following general formula (I) and/or a silicon-containing repeating unit represented by the following general formula (II) and being stable to acids but insoluble in an alkali developer; and (D) a solvent:

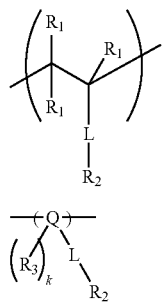

In the general formulae (I) and (II), L represents a single bond or a divalent linking group;

$R_1$'s independently represent each a hydrogen atom, a halogen atom, an alkyl group, a cycloalkyl group, an alkoxy group or an alkoxycarbonyl group;

$R_2$ represents a monovalent organic group having at least one silicon atom;

$R_3$ represents a hydrogen atom, a halogen atom, a cyano group or a monovalent organic group;

Q represents an alicyclic structure; and k represents an integer of from 0 to 3.

(2) A positive resist composition according to the above (1) wherein the resin of the component (A) has a monocyclic or polycyclic alicyclic hydrocarbon structure.

(3) A positive resist composition according to the above (1) or (2) wherein the resin of the component (A) has a repeating unit having an alicyclic hydrocarbon structure substituted by a hydroxyl group or a cyano group.

(4) A positive resist composition according to any one of the above (1) to (3) wherein the resin of the component (A) has an alkali-soluble group which is protected by a group represented by the following general formula (pB):

In the general formula (pB), $R_6$, $R_7$ and $R_8$ independently represent each an alkyl group or a cycloalkyl group.

(5) A positive resist composition according to the above (4) wherein at least one of $R_6$, $R_7$ and $R_8$ in the general formula (pB) represents a cycloalkyl group.

(6) A positive resist composition according to any one of the above (1) to (5) wherein the resin of the component (A) has a repeating unit (A1) having a lactone structure and a cyano group.

(7) A positive resist composition according to the above (6) wherein the repeating unit (A1) having a lactone structure and a cyano group has a structure represented by the following general formula (A2):

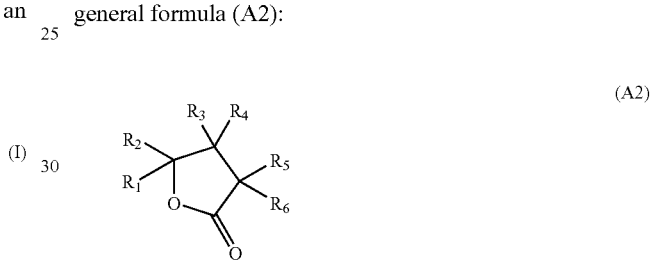

In the general formula (A2), $R_1$ to $R_6$ independently represent each a single bond, a hydrogen atom or a substituent, or at least two of $R_1$ to $R_6$ may be bonded together to form a cyclic group, provided that at least one of $R_1$ to $R_6$ represents a cyano group or a substituent having a cyano group.

(8) A positive resist composition according to the above (6) wherein the repeating unit (A1) having a lactone structure and a cyano group has a structure represented by the following general formula (A6):

In the general formula (A6), $R_{18}$ represents a single bond, a hydrogen atom or a substituent; and $L_1$ represents a linking group which links between the carbon atom at the 2-position of the lactone ring and the oxygen atom in the lactone to thereby form a lactone ring structure, provided that $R_{18}$ and $L_1$ may be bonded together to form a cyclic structure.

(9) A positive resist composition according to any one of the above (1) to (8) wherein the general formula (I) is represented by the following general formula (III):

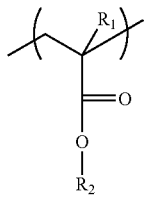
(III)

In the general formula (III), $R_1$ represents a hydrogen atom, a halogen atom, an alkyl group, a cycloalkyl group, an alkoxy group or an alkoxycarbonyl group; and $R_2$ represents a monovalent organic group having at least one silicon atom.

(10) A positive resist composition according to any one of the above (1) to (8) wherein the general formula (I) is represented by the following general formula (IV):

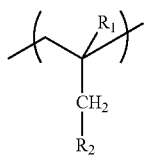
(IV)

In the general formula (IV), $R_1$ represents a hydrogen atom, a halogen atom, an alkyl group, a cycloalkyl group, an alkoxy group or an alkoxycarbonyl group; and $R_2$ represents a monovalent organic group having at least one silicon atom.

(11) A positive resist composition according to any one of the above (1) to (8) wherein the general formula (I) is represented by the following general formula (V):

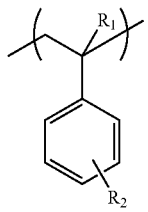
(V)

In the general formula (V), $R_1$ represents a hydrogen atom, a halogen atom, an alkyl group, a cycloalkyl group, an alkoxy group or an alkoxycarbonyl group; and $R_2$ represents a monovalent organic group having at least one silicon atom.

(12) A positive resist composition according to any one of the above (1) to (11) wherein the monovalent organic group having at least one silicon atom represented by $R_2$ has a cyclic siloxane structure.

(13) A positive resist composition according to any one of the above (1) to (11) wherein the monovalent organic group having at least one silicon atom represented by $R_2$ has a group represented by the following general formula (VI):

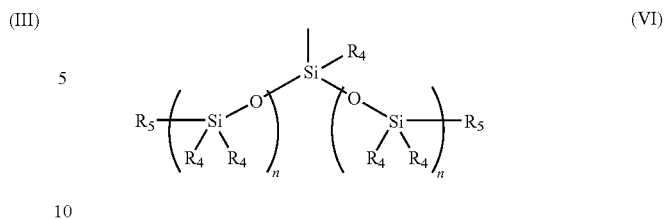
(VI)

In the general formula (VI), $R_4$'s independently represent each a hydrogen atom, an alkyl group or an alkoxy group;

$R_5$'s independently represent each a hydrogen atom, an alkyl group or an alkoxy group, provided that two $R_5$'s may be bonded together to form a cyclic structure; and n's independently represent each an integer of from 0 to 5.

(14) A positive resist composition according to any one of the above (1) to (11) wherein the monovalent organic group having at least one silicon atom represented by $R_2$ has from 1 to 3 Si atoms.

(15) A positive resist composition according to any one of the above (1) to (11) wherein the monovalent organic group having at least one silicon atom represented by $R_2$ is represented by the following general formula (S1):

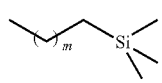
(S1)

In the general formula (S1), m represents an integer of from 0 to 20.

(16) A positive resist composition according to any one of the above (1) to (15) which further contains a basic compound (E).

(17) A positive resist composition according to any one of the above (1) to (16) which further contains a surfactant (F).

(18) A positive resist composition according to any one of the above (1) to (17) the exposure wavelength of which is 200 nm or less.

(19) A pattern making method comprising forming a resist film by using a positive resist composition according to any one of the above (1) to (18), exposing the resist film to light and then developing.

(20) A pattern making method according to the above (19) wherein the resist film is exposed to light via an immersion liquid.

Next, preferred modes for carrying out the invention will be illustrated.

(21) A positive resist composition according to any one of the above (1) to (18) wherein the resin of the component (A) has a repeating unit represented by the following general formula (R1), a repeating unit represented by the following general formula (R2) and a repeating unit represented by the following general formula (R3):

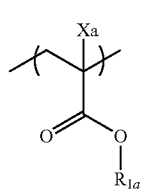
(R1)

-continued

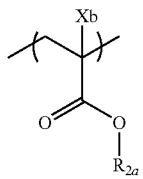
(R2)

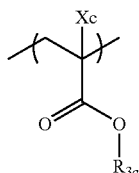
(R3)

In the general formulae (R1) to (R3), Xa, Xb and Xc independently represent each a hydrogen atom or a methyl group;

$R_{1a}$ represents a group having a lactone structure;

$R_{2a}$ represents an organic group substituted by a hydroxyl group or a cyano group; and $R_{3a}$ represents a group leaving by the action of an acid.

(22) A positive resist composition according to any one of the above (1) to (18) and (21) wherein the content of the resin of the component (C) is from 0.1 to 5.0% by mass based on the total solid concentration.

(23) A positive resist composition according to any one of the above (1) to (18) and (21) to (22) wherein the weight-average molecular weight of the resin of the component (A) is from 5,000 to 10,000 and the degree of dispersion thereof is from 1.2 to 3.0.

(24) A positive resist composition according to any one of the above (1) to (18) and (21) to (23) wherein the compound of the component (B) has a triphenylsulfonium cation structure.

(25) A positive resist composition according to any one of the above (1) to (18) and (21) to (24) wherein the solvent of the component (D) contains two types or more of solvents and at least one of them is propylene glycol monomethyl ether acetate.

(26) A positive resist composition according to any one of the above (1) to (18) and (21) to (25) wherein the solid concentration is from 3.0 to 10.0% by mass.

Figure 1:
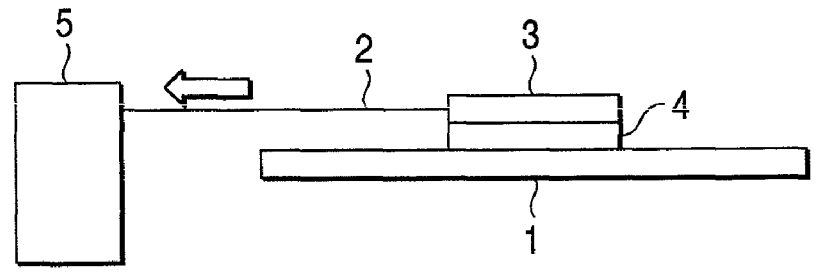
FIG. 1 is a schematic diagram which shows the states in the evaluation of the follow-up to water to a quartz plate.

1 denotes a wafer coated with positive resist composition; 2 denotes a kite string; 3 denotes a quartz plate; 4 denotes a distilled water; 5 denotes a motor; 6 denotes an area having distilled water remaining under quartz plate; and 7 denotes an area having air entering under quartz plate.

DETAILED DESCRIPTION OF THE INVENTION

In illustrating groups (atomic groups) herein, those which are not indicated as being substituted or unsubstituted include both of groups having no substituent and those having a substituent. For example, the term "alkyl group" includes an alkyl group having no substituent (an unsubstituted alkyl group) as well as an alkyl group having a substituent (a substituted alkyl group).

[1] (A) Resin that Increases its Solubility in an Alkali Developer by the Action of Acid The resin that increases its solubility in an alkali developer by the action of an acid to be used in the positive resist composition of the invention is a resin which has a group that can be decomposed by an acid (hereinafter sometimes referred to as "acid-decomposable group") in the main chain or a side chain of the resin or both of the main chain and a side chain thereof. Among all, a resin having a group that can be decomposed by an acid in a side chain is preferred.

As the group that can be decomposed by an acid, those wherein a hydrogen atom of an alkali-soluble group (for example, —COOH or —OH) has been substituted (protected) by a group leaving by the action of an acid are preferable.

Examples of the group leaving by the action of an acid include —C($R_{36}$)($R_{37}$)($R_{38}$), —C($R_{36}$)($R_{37}$)(O$R_{39}$), —C($R_{01}$)($R_{02}$)(O$R_{39}$) and so on. In these formulae, $R_{36}$ to $R_{39}$ independently represent each an alkyl group, a cycloalkyl group, an aryl group, an aralkyl group or an alkenyl group. $R_{36}$ and $R_{37}$ or $R_{36}$ and $R_{39}$ may be bonded together to form a ring. $R_{01}$ to $R_{02}$ independently represent each a hydrogen atom, an alkyl group, a cycloalkyl group, an aryl group, an aralkyl group or an alkenyl group.

In the invention, an acetal group or a tertiary ester group is preferred as the acid-decomposable group.

It is preferable that the resin of the component (A) has, as an acid-decomposable group, an alkali-soluble group protected by a group represented by the following general formula (pB):

(pB)

In the general formula (pB), $R_6$, $R_7$ and $R_8$ independently represent each an alkyl group or a cycloalkyl group.

As the alkyl groups represented by $R_6$, $R_7$ and $R_8$ in the general formula (pB), alkyl groups having from 1 to 20 carbon atoms are preferred and these alkyl groups may have a hetero atom. The alkyl groups $R_6$, $R_7$ and $R_8$ may be substituted by a fluorine atom or the like.

As the cycloalkyl groups represented by $R_6$, $R_7$ and $R_8$, cycloalkyl groups having from 3 to 20 carbon atoms are preferred and these cycloalkyl groups may have a hetero atom. As the cycloalkyl groups $R_6$, $R_7$ and $R_8$, polycyclic cycloalkyl groups such as an adamantyl group and a norbornyl group are preferred.

In the general formula (pB), it is preferable that at least one of $R_6$, $R_7$ and $R_8$ is a cycloalkyl group.

It is preferable that the repeating unit having an acid-decomposable group is a repeating unit represented by the following general formula (R3):

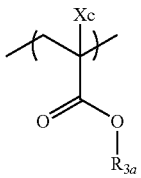

(R3)

In the general formula (R3), Xc represents a hydrogen atom or a methyl group; and $R_{3a}$ represents a group leaving by the action of an acid.

The methyl group represented by Xc in the general formula (R3) may be substituted by a halogen atom (preferably a fluorine atom), a hydroxyl group or the like.

As specific examples of the repeating unit represented by the general formula (R3), there can be enumerated the same repeating units as those which will be cited hereinafter as examples of the repeating unit represented by the general formula (pA).

In the case of irradiating the positive resist composition of the invention with an ArF excimer laser beam, it is preferable that the resin of the component (A) has a monocyclic or polycyclic alicyclic hydrocarbon structure and shows an increase in the solubility in an alkali developer by the action of an acid.

It is preferable that the resin of the component having a monocyclic or polycyclic alicyclic hydrocarbon structure and increasing its solubility in an alkali developer (hereinafter sometimes referred to as "alicyclic hydrocarbon type acid-decomposable resin") is a resin that has at least one repeating unit selected from the group consisting of the repeating units having a partial structure containing an alicyclic hydrocarbon structure selected from among those represented by the following general formula (pI) to the general formula (pV) and a repeating unit represented by the following general formula (II-AB):

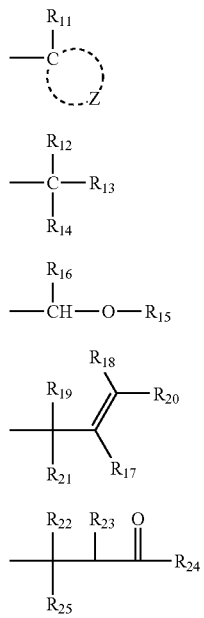

(pI)
(pII)
(pIII)
(pIV)
(pV)

In the general formulae (pI) to (pV), $R_{11}$ represents a methyl group, an ethyl group, an n-propyl group, an isopropyl group, an n-butyl group, an isobutyl group or a sec-butyl group; and Z represents an atomic group required in forming a cycloalkyl group together with a carbon atom.

$R_{12}$ to $R_{16}$ independently represent each a linear or branched alkyl or cycloalkyl group having from 1 to 4 carbon atoms, provided that at least one of $R_{12}$ to $R_{14}$ or one of $R_{15}$ and $R_{16}$ is a cycloalkyl group.

$R_{17}$ to $R_{21}$ independently represent each a hydrogen atom or a linear or branched alkyl or cycloalkyl group having from 1 to 4 carbon atoms, provided that at least one of $R_{17}$ to $R_{21}$ is a cycloalkyl group and one of $R_{19}$ and $R_{21}$ is a linear or branched alkyl or cycloalkyl group having from 1 to 4 carbon atoms.

$R_{22}$ to $R_{25}$ independently represent each a hydrogen atom or a linear or branched alkyl or cycloalkyl group having from 1 to 4 carbon atoms, provided that at least one of $R_{22}$ to $R_{25}$ is a cycloalkyl group and $R_{23}$ and $R_{24}$ may be bonded together to from a ring.

(II-AB)

In the general formula (II-AB), $R_{11}'$ and $R_{12}'$ independently represent each a hydrogen atom, a cyano group, a halogen atom or an alkyl group.

Z' represents an atomic group containing two carbon atoms bonded together (C—C) for forming an alicyclic structure.

It is more preferable that the general formula (II-AB) as described above is the following general formula (II-AB1) or the following general formula (II-AB2).

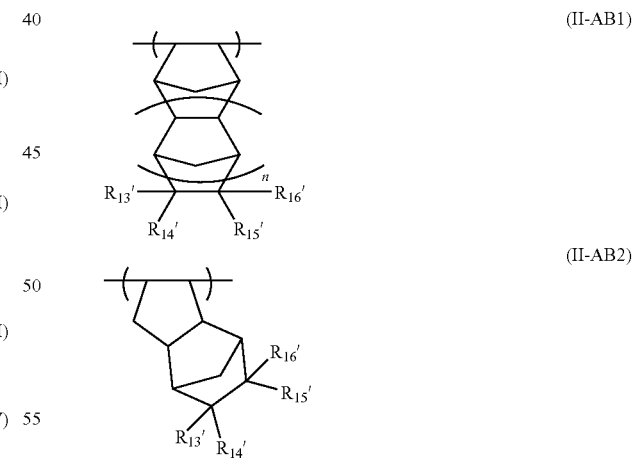

(II-AB1)
(II-AB2)

In the general formulae (II-AB1) and (II-AB2), $R_{13}'$ to $R_{16}'$ independently represent each a hydrogen atom, a halogen atom, a cyano group, a hydroxyl group, —COOH, —COOR$_5$, a group being decomposed by the action of an acid, —C(=O)—X-A'-R$_{17}'$, an alkyl group or a cycloalkyl group, provided that at least two of $R_{13}'$ to $R_{16}'$ may be bonded together to form a ring.

$R_5$ as described above represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

R$_6$ represents an alkyl group or a cycloalkyl group.

n represents 0 or 1.

In the general formulae (pI) to (pV), the alkyl groups represented by $R_{12}$ to $R_{25}$ mean linear or branched alkyl groups having from 1 to 4 carbon atoms such as methyl, ethyl, propyl, n-butyl, sec-butyl and t-butyl groups.

The cycloalkyl groups $R_{12}$ to $R_{25}$ or the cycloalkyl group formed by Z with a carbon atom may be either monocyclic or polycyclic. As specific examples thereof, there can be enumerated groups having a monocyclo, bicyclo, tricyclo or tetracyclo structure. These cycloalkyl groups preferably have from 6 to 30, more preferably from 7 to 25, carbon atoms.

As preferable examples of the cycloalkyl groups, there can be enumerated adamantyl, noradamantyl, decaline residue, tricyclodecanyl, tetracyclododecanyl, norbornyl, cedrol, cyclopentyl, cyclohexyl, cycloheptyl, cyclooctyl, cyclodecanyl and cyclododecanyl groups. As more preferable examples thereof, there can be enumerated adamantyl, norbornyl, cyclohexyl, cyclopentyl and tetracyclododecanyl groups.

These alkyl and cycloalkyl groups may further have a substituent. As examples of the substituent for the alkyl and cycloalkyl groups, there can be enumerated an alkyl group (having from 1 to 4 carbon atoms), a halogen atom, a hydroxyl group, an alkoxy group (having from 1 to 4 carbon atoms), a carboxyl group and an alkoxycarbonyl group (having from 2 to 6 carbon atoms). The alkyl, alkoxy and alkoxycarbonyl group as described above may further have a substituent. As examples of the substituent that may be attached to the alkyl, alkoxy and alkoxycarbonyl groups, there can be enumerated a hydroxyl group, a halogen atom and an alkoxy group.

The structures represented by the general formulae (pI) to (pV) in the above resin are usable in protecting the alkali-soluble group. As the alkali-soluble group, there can be enumerated various groups having been publicly known in the technical field.

More specifically speaking, there can be enumerated structures wherein a hydrogen atom in a carboxylate group, a sulfonate group, a phenol group or a thiol group is substituted by a structure represented by one of the general formulae (pI) to (pV). Preferable examples thereof include structures wherein a hydrogen atom in a carboxylate group or a sulfonate group is substituted by a structure represented by one of the general formulae (pI) to (pV).

As the repeating unit having an alkali-soluble group protected by the structure represented by one of the general formulae (pI) to (pV), a repeating unit represented by the following general formula (pA) is preferred.

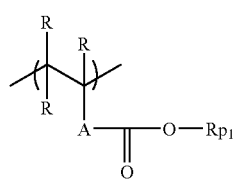

(pA)

In the general formula (pA), R represents a hydrogen atom, a halogen atom or a linear or branched alkyl group having from 1 to 4 carbon atoms. Multiple R's may be either the same or different from each other.

A represents a single bond or one or more groups selected from a group consisting of alkylene, ether, thioether, carbonyl, ester, amide, sulfonamide, urethane and urea groups and a combination thereof. It is preferable that A is a single bond.

$R_{p1}$ represents one of the groups represented by the above general formulae (pI) to (pV).

It is particularly preferable that the repeating unit represented by the general formula (pA) is a repeating unit comprising 2-alkyl-2-adamantyl (meth)acrylate or dialkyl(1-adamantyl)methyl (meth)acrylate.

Next, specific examples of the repeating unit represented by the general formula (pA) will be given.

(In the following formulae, $R_x$ represents H, CH$_3$, CF$_3$ or CH$_2$OH; and $R_{xa}$ and $R_{xb}$ represent each an alkyl group having from 1 to 4 carbon atoms.)

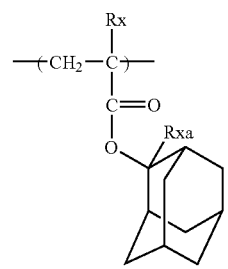

1

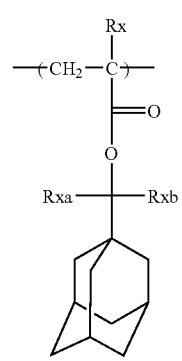

2

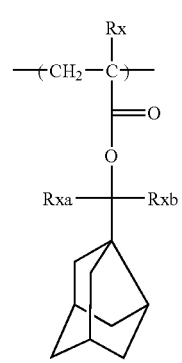

3

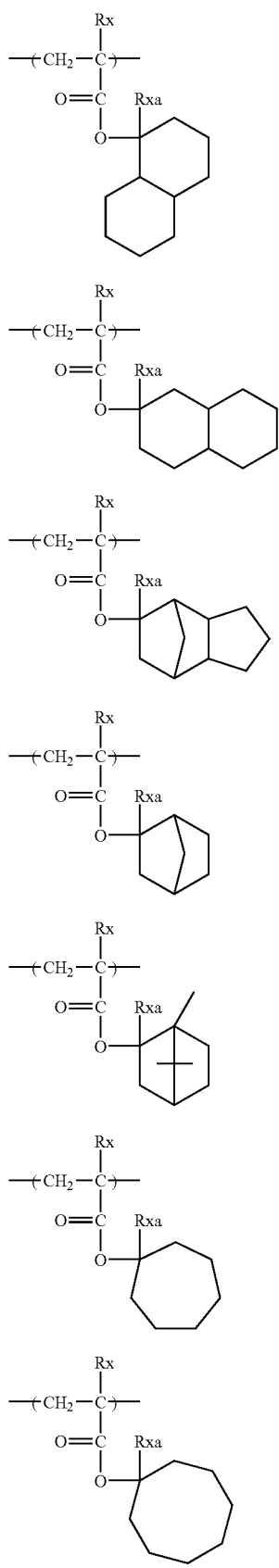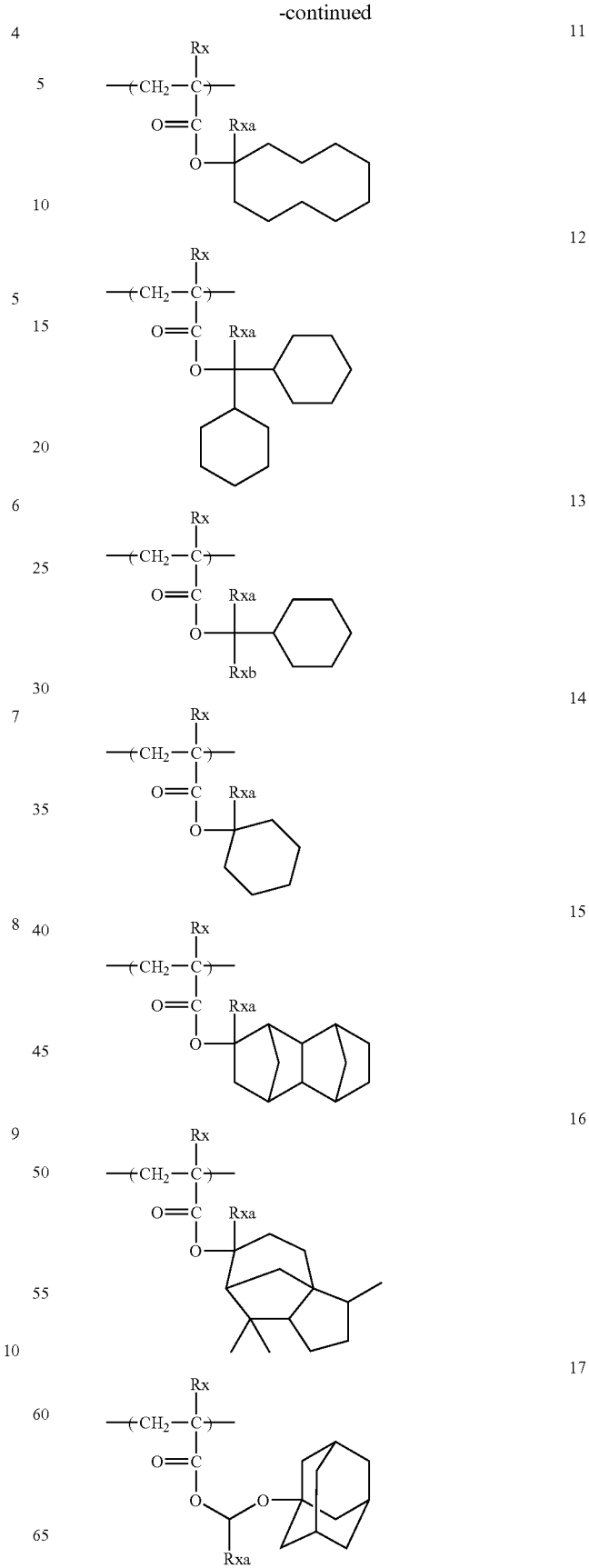

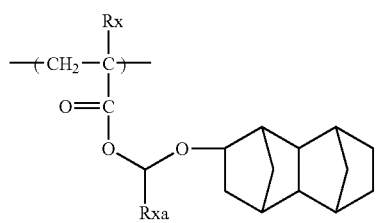
18

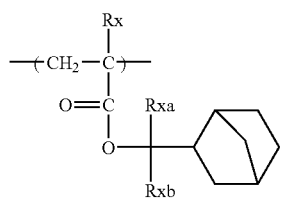
19

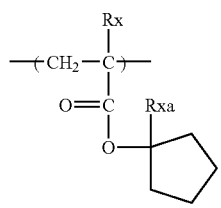
20

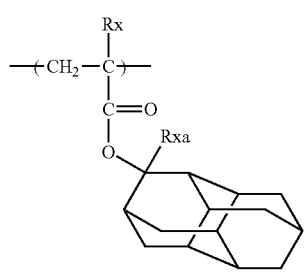
21

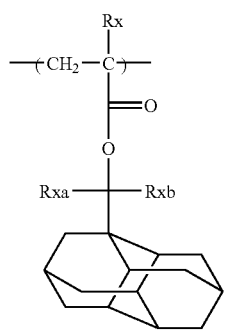
22

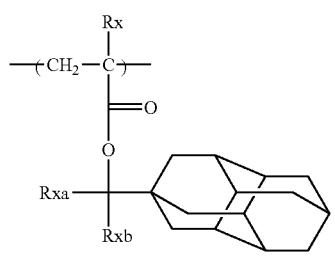
23

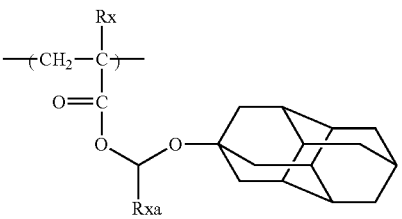
24

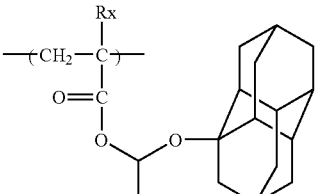
25

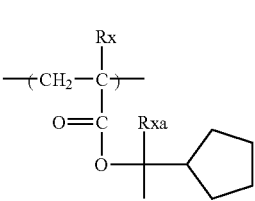
26

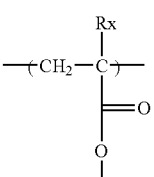
27

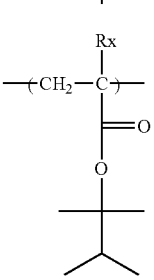
28

As the halogen atoms represented by $R_{11}'$ and $R_{12}'$ in the general formula (II-AB), there can be enumerated a chlorine atom, a bromine atom, a fluorine atom, an iodine atom and so on.

As the alkyl groups represented by $R_{11}'$ and $R_{12}'$ in the general formula (II-AB), an linear or branched alkyl group having from 1 to 10 carbon atoms is preferable and examples thereof include a methyl group, an ethyl group, an n-propyl group, an isopropyl group, a linear or branched butyl group, a pentyl group, a hexyl group, a heptyl group and so on.

The atomic group for forming the alicyclic structure Z' as described above is an atomic group forming a repeating unit of an alicyclic hydrocarbon, which may have a substituent, in the resin. In particular, an atomic group for forming a crosslinked alicyclic structure forming a crosslinked alicyclic hydrocarbon repeating unit is preferred.

As the skeleton of the alicyclic hydrocarbon thus formed, there can be enumerated the same ones as the cycloalkyl groups represented by $R_{12}$ to $R_{25}$ in the general formulae (pI) to (pVI).

The skeleton of the alicyclic hydrocarbon as described above may have a substituent. As examples of the substituent, there can be enumerated $R_{13}'$ to $R_{16}'$ in the above general formula (II-AB1) or (II-AB2).

In the alicyclic hydrocarbon type acid-decomposable resin of the invention, the group decomposable by the action of an acid can have at least one repeating unit selected from among a repeating unit having a partial structure containing an alicyclic hydrocarbon represented by one of the above general formulae (pI) to (pV), a repeating unit represented by the general formula (II-AB) and a repeating unit of a copolymerizable component as will be discussed hereinafter.

Each of the substituents of $R_{13}'$ to $R_{16}'$ in the above general formula (II-AB1) or (II-AB2) may serve as a substituent of the atomic group for forming an alicyclic structure in the above general formula (II-AB) or the atomic group Z for forming a crosslinked alicyclic structure.

Next, specific examples of the repeating unit represented by the above general formula (II-AB1) or (II-AB2) will be presented, though the invention is not restricted to these specific examples.

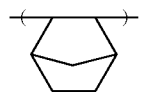
[II-1]

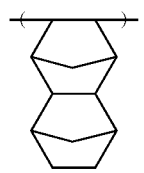
[II-2]

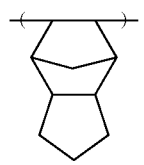
[II-3]

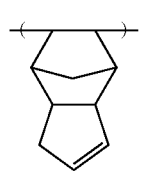
[II-4]

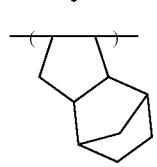
[II-5]

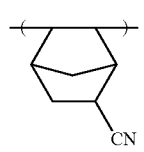
[II-6]

-continued

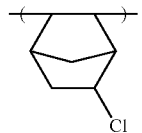
[II-7]

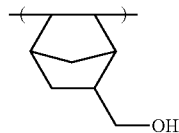
[II-8]

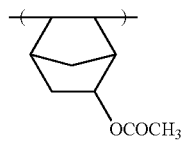
[II-9]

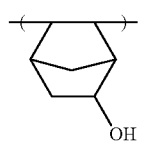
[II-10]

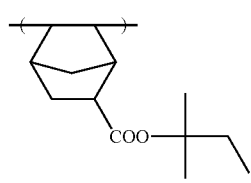
[II-11]

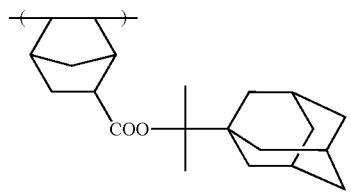
[II-12]

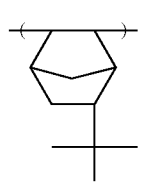
[II-13]

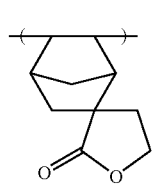
[II-14]

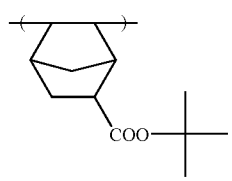
[II-15]

-continued
[II-16]
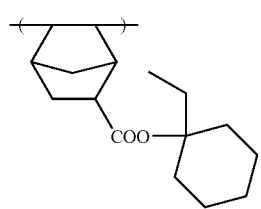
[II-17]
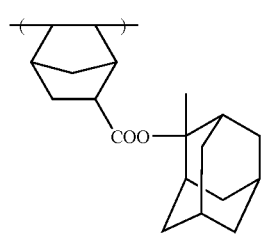
[II-18]
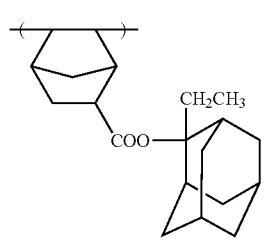
[II-19]
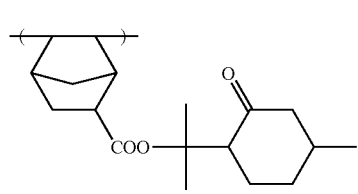
[II-20]
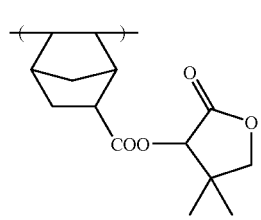
[II-21]
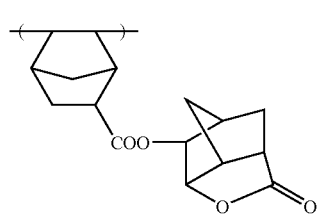
[II-22]
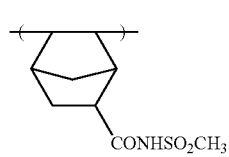
-continued
[II-23]
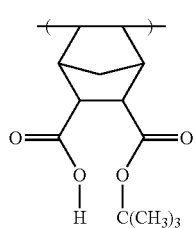
[II-24]
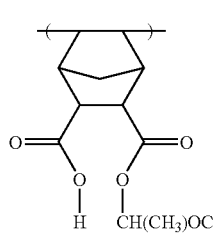
[II-25]
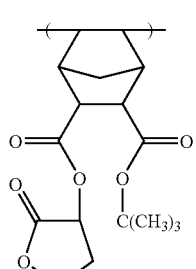
[II-26]
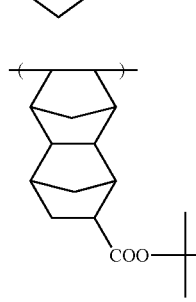
[II-27]
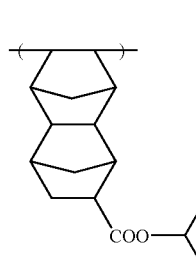
[II-28]
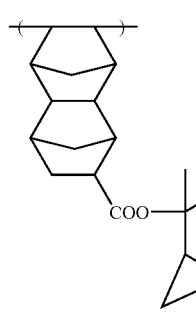

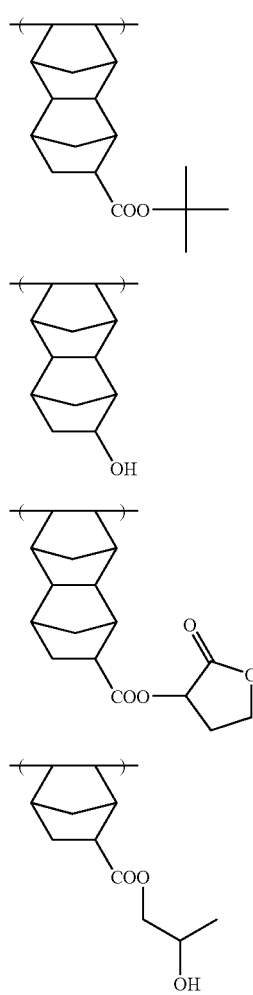

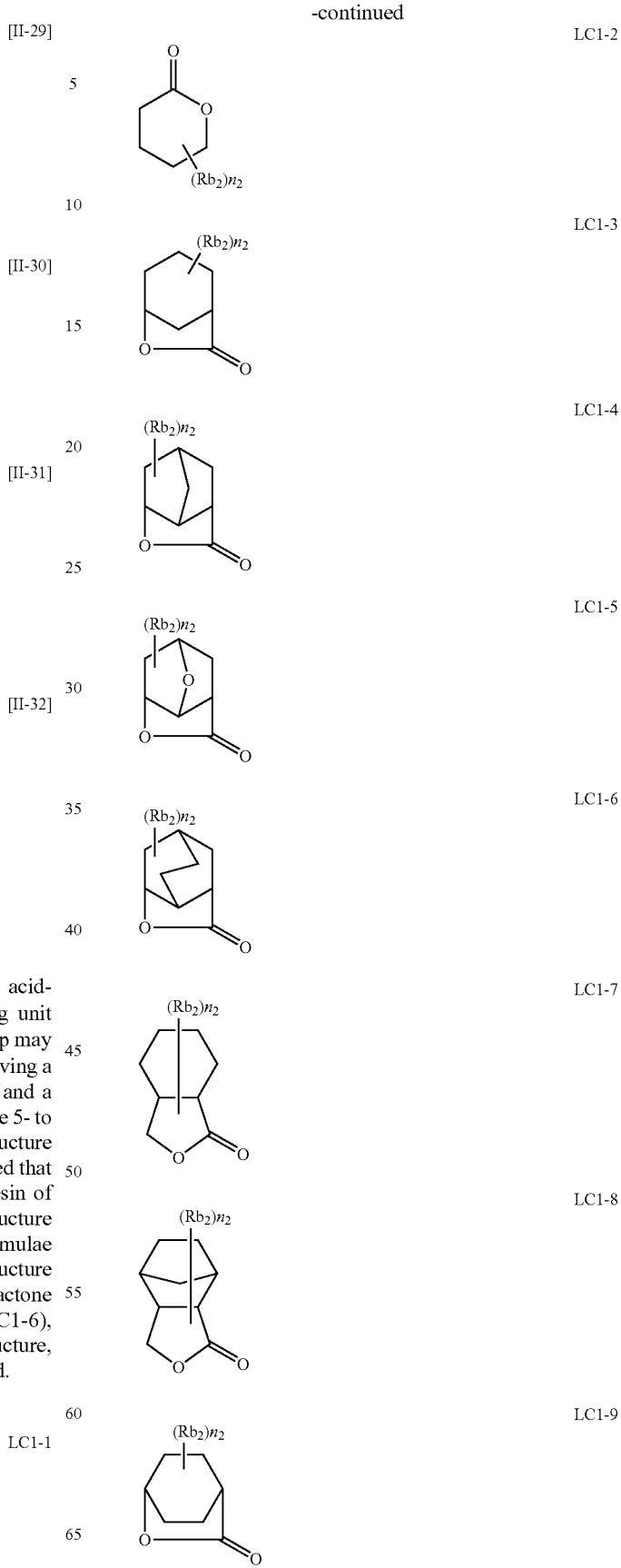

It is preferred that the alicyclic hydrocarbon type acid-decomposable resin of the invention has a repeating unit having a lactone group. As the lactone group, any group may be used so long as it has a lactone structure. A group having a 5- to 7-membered lactone ring structure is preferred and a group in which another cyclic structure is fused with the 5- to 7-membered lactone ring structure to form a bicyclo structure or a spiro structure is still preferred. It is more preferred that the alicyclic hydrocarbon type acid-decomposable resin of the invention has a repeating unit having a lactone structure represented by any one of the following general formulae (LC1-1) to (LC1-16). The group having a lactone structure may be attached directly to the main chain. Preferable lactone structures include (LC1-1), (LC1-4), (LC1-5), (LC1-6), (LC1-13) and (LC1-14). By using a specific lactone structure, line edgeness and under development can be improved.

-continued

LC1-10
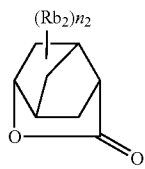

LC1-11
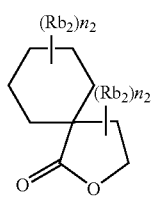

LC1-12
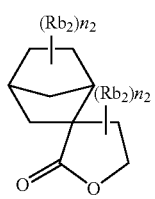

LC1-13
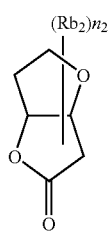

LC1-14
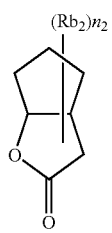

LC1-15
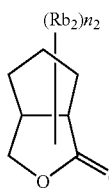

LC1-16
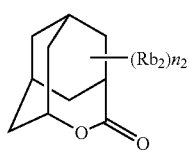

The lactone ring structure may or may not have a substituent ($Rb_2$). As preferable examples of the substituent $Rb_2$ include an alkyl group having from 1 to 8 carbon atoms, a cycloalkyl group having from 3 to 7 carbon atoms, an alkoxy group having from 1 to 8 carbon atoms, an alkoxycarbonyl group having from 2 to 8 carbon atoms, a carboxyl group, a halogen atom, a hydroxyl group, a cyano group, an acid-decomposable group and so on. $n_2$ represents an integer of from 0 to 4. In the case where $n_2$ is an integer of 2 or more, two or more $Rb_2$'s may be either the same or different. Also, two or more $Rb_2$'s may be bonded together to form a ring.

As examples of the repeating unit having a lactone structure represented by any one of the general formulae (LC1-1) to (LC1-16), there can be enumerated a repeating unit where in at least one of $R_{13}'$ to $R_{16}'$ in the above general formula (II-AB1) or (II-AB2) has a group represented by one of the general formulae (LC1-1) to (LC1-16) (for example, one wherein $R_5$ in —$COOR_5$ is a group represented by one of the general formulae (LC1-1) to (LC1-16)), a repeating unit represented by the following general formula (AI) and so on.

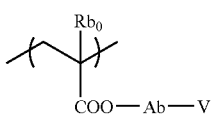

(AI)

In the general formula (AI), $Rb_0$ represents a hydrogen atom, a halogen atom or an alkyl group having from 1 to 4 carbon atoms.

As examples of the alkyl group $Rb_0$, there can be enumerated a methyl group, an ethyl group, a propyl group, an n-butyl group, a sec-butyl group, a t-butyl group and so on. The alkyl group $Rb_0$ may have a substituent. Preferable examples of the substituent which can be carried by the alkyl group $Rb_0$ include, for example, a hydroxyl group and a halogen atom.

As the examples of the halogen atom $Rb_0$, there can be enumerated a fluorine atom, a chlorine atom, a bromine atom and an iodine atom. It is preferable that $Rb_0$ is a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group or a divalent group comprising a combination thereof. A single bond or a linking group represented by —$Ab_1$-$CO_2$— is preferred.

$Ab_1$ represents a linear or branched alkylene group or a monocyclic or polycyclic cycloalkylene group and preferable examples thereof include a methylene group, an ethylene group, a cyclohexyl residue, an adamantyl residue and a norbornyl residue.

V represents a group having a lactone structure represented by any one of the general formulae (LC1-1) to (LC1-16).

A repeating unit having a lactone structure usually occurs as optical isomers and use can be made of either optical isomer. Moreover, use can be made of either a single optical isomer alone or a mixture of optical isomers. In the case of using a single optical isomer alone, the optical purity (ee) thereof is preferably 90 or higher, more preferably 95 or higher.

As the repeating unit having a lactone structure, a repeating unit represented by the following general formula (R1) is more preferred.

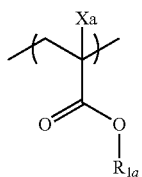
(R1)

In the general formula (R1), Xa represents a hydrogen atom or a methyl group.

$R_{1a}$ represents a group having a lactone structure.

The methyl group Xa in the general formula (R1) may be substituted by a halogen atom (preferably a fluorine atom), a hydroxyl group or the like.

As the group $R_{1a}$ having a lactone structure, there can be enumerated a group formed by removing a hydrogen atom attached to a carbon atom from a lactone structure represented by one of the general formulae (LC1-1) to (LC1-16).

Next, specific examples of the repeating unit having a lactone structure will be presented, though the invention is not restricted thereto.

(In the following formulae, $R_x$ represents H, $CH_3$, $CH_2OH$ or $CF_3$.)

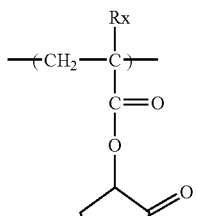
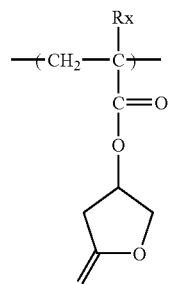
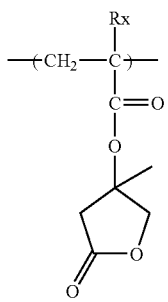
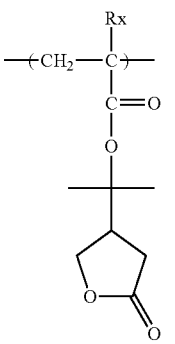
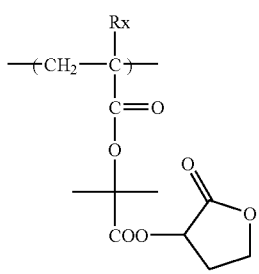
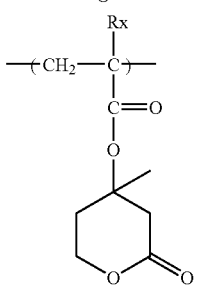

-continued

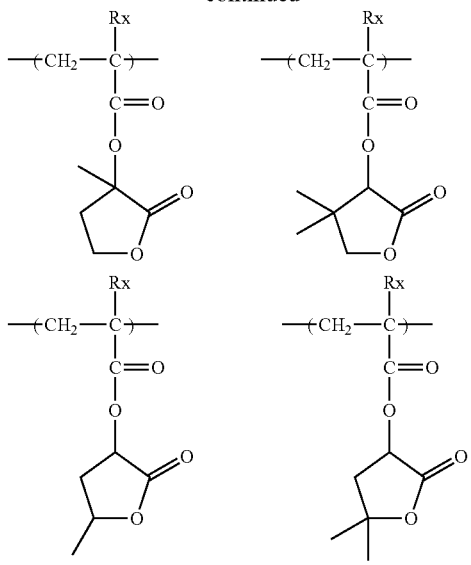
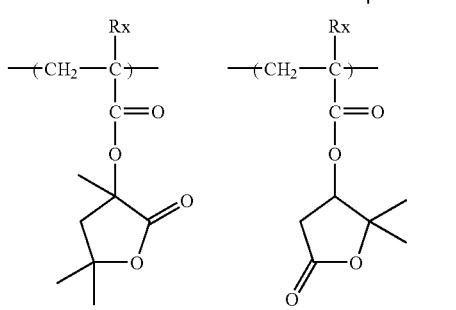
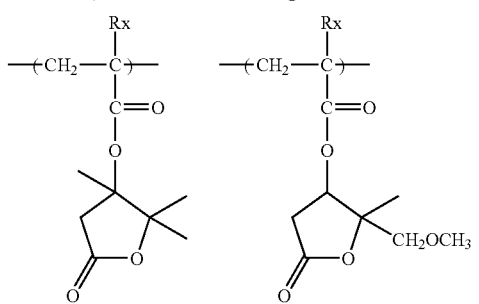
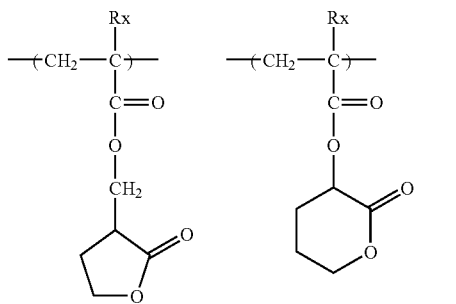
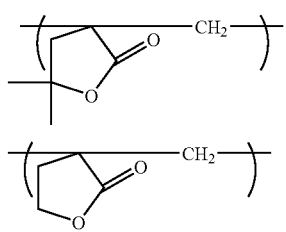

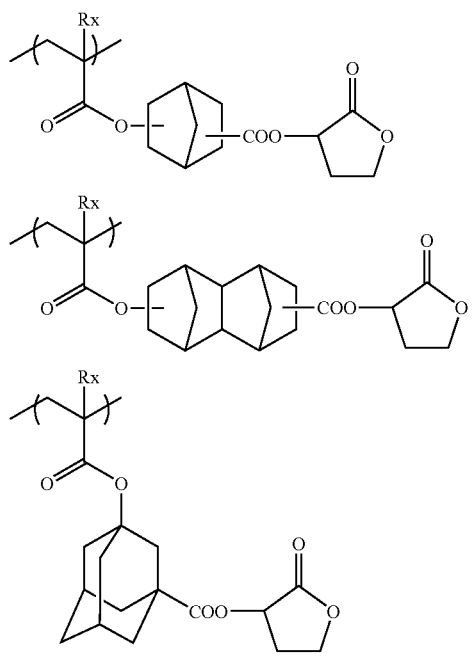
(In the following formulae, $R_x$ represents H, $CH_3$, $CH_2OH$ or $CF_3$.)
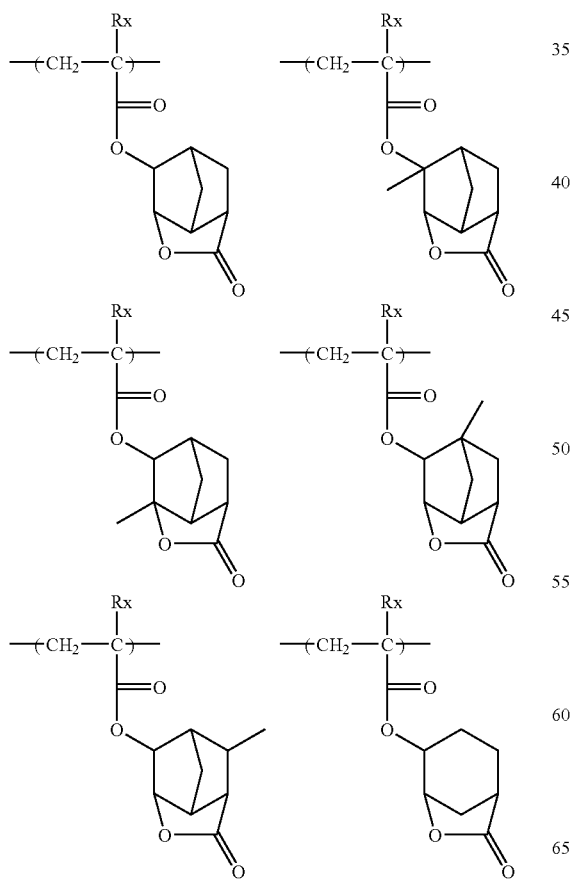
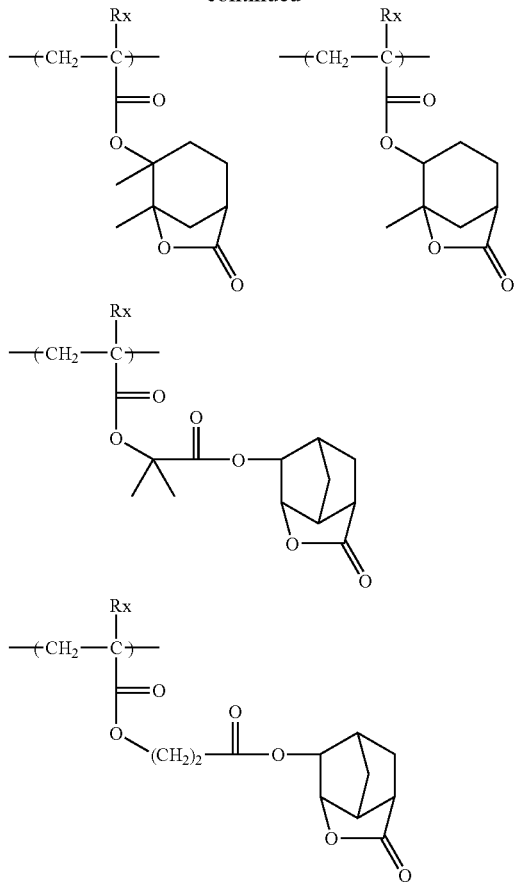

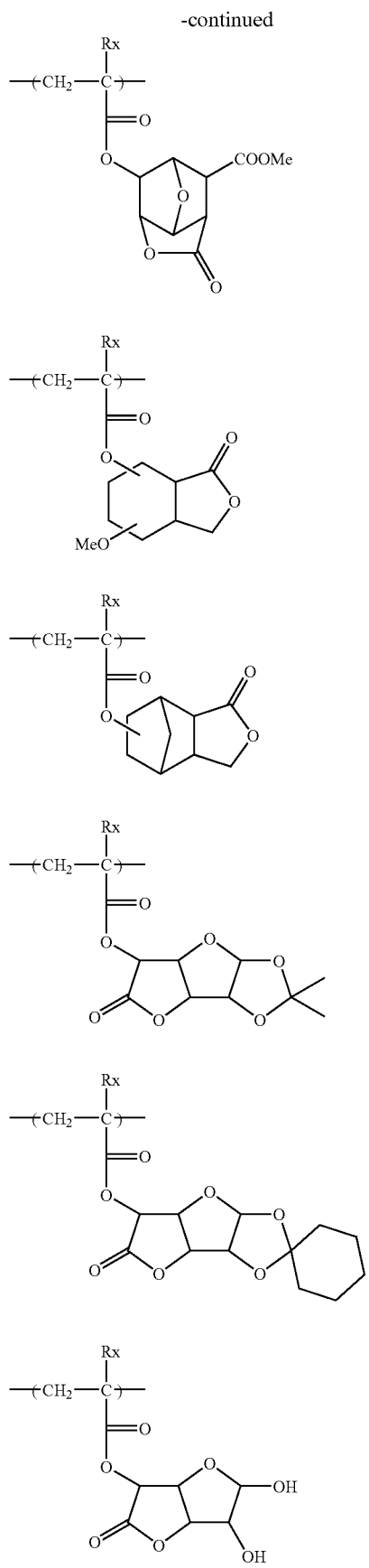
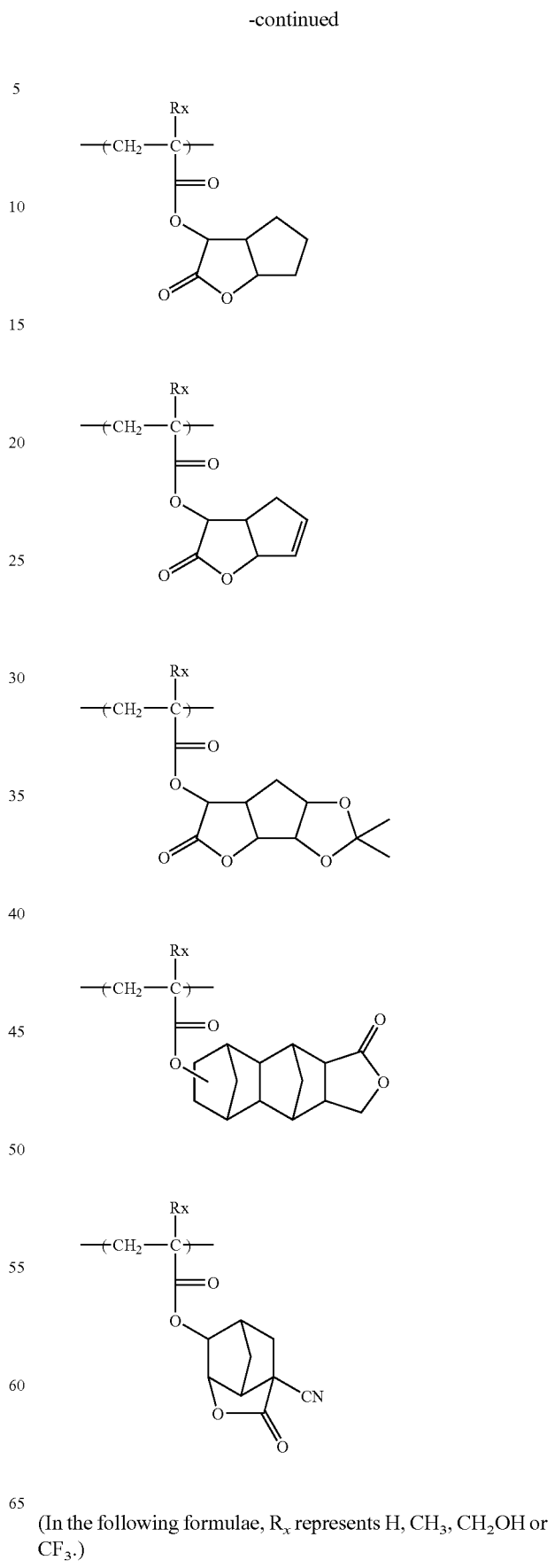
(In the following formulae, $R_x$ represents H, $CH_3$, $CH_2OH$ or $CF_3$.)

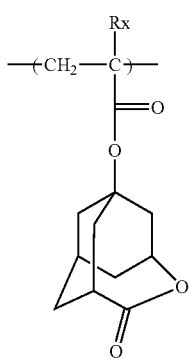
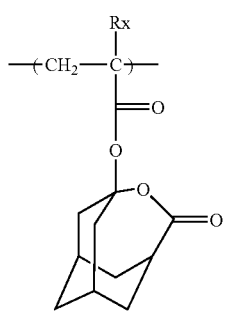
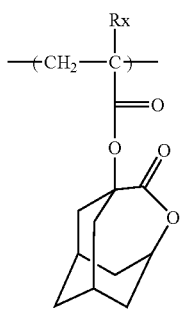
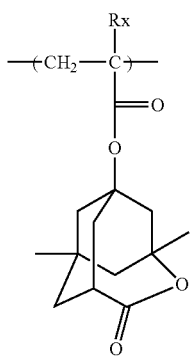
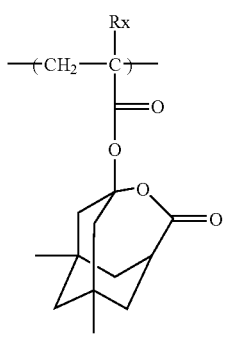
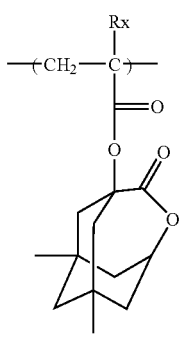
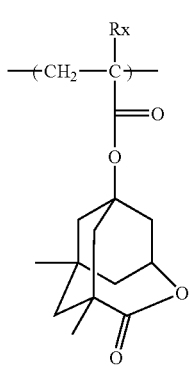
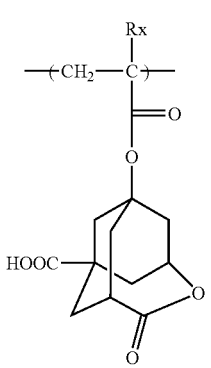

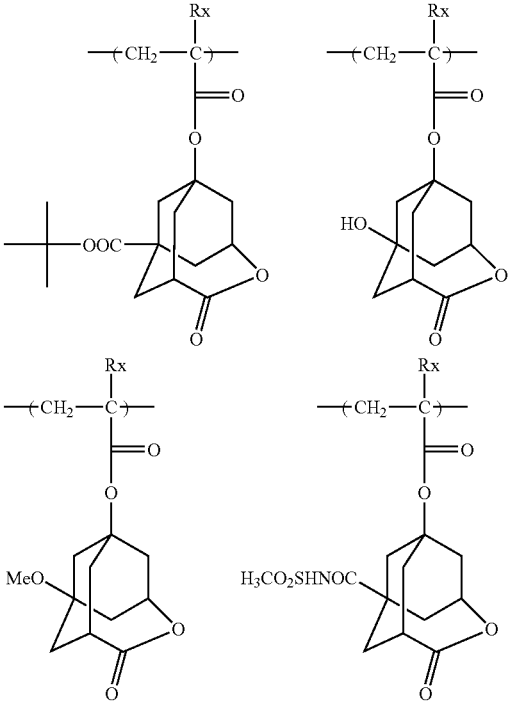

-continued

It is preferred that the repeating unit having a lactone structure further has a cyano group.

It is preferable that the repeating unit (A1) having a lactone structure and a cyano group has a structure represented by the following general formula (A2).

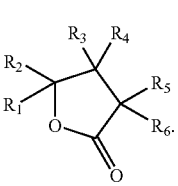

(A2)

In the general formula (A2), $R_1$ to $R_6$ independently represent each a single bond, a hydrogen atom or a substituent. At least two of $R_1$ to $R_6$ may be bonded together to form a cyclic structure, provided that at least one of $R_1$ to $R_6$ represents a cyano group or a substituent having a cyano group.

The repeating unit having a structure represented by the general formula (A2) may have the structure represented by the general formula (A2) in the main chain of the repeating unit or a side chain thereof using at least one of the sites possibly being a hydrogen atom in $R_1$ to $R_6$ (namely, hydrogen atoms as $R_1$ to $R_6$ and a hydrogen atom in substituents as $R_1$ to $R_6$) as a bond (a single bond).

The substituents $R_1$ to $R_6$ are not particularly restricted. For example, there can be enumerated, in addition to a cyano group, an alkyl group, an alkenyl group, an alkynyl group, a cycloalkyl group, an aryl group, an amino group, an amide group, a ureide group, a urethane group, a hydroxyl group, a carboxyl group, a halogen atom, an alkoxy group, an aryloxy group, an alkylthio group, an arylthio group, an acyl group, an acyloxy group, an alkoxycarbonyl group, a nitro group and so on. Such a substituent may further has a substituent. $R_1$ and $R_2$, $R_3$ and $R_4$ and $R_5$ and $R_6$, each being a couple of substituents attached to a single carbon atom, may mean bonds to a single atom (for example, a carbon atom, an oxygen atom, a sulfur atom or a nitrogen atom) and form a double bond typified by C=C, C=O, C=S, C=N and so on. Any two of $R_1$ to $R_6$ may be bonded to a single atom to thereby form a 3-membered cycle or crosslinked structure.

The substituents having a cyano group as $R_1$ to $R_6$ are not particularly restricted. Namely, there can be enumerated the above-described substituents substituted by a cyano group. Such a substituent preferably has not more than 12, more preferably not more than 6, carbon atoms excluding the carbon atom in the cyano group.

It is particularly preferred that the cyano group is attached directly to the lactone ring.

It is preferable that the repeating unit (A1) having a lactone structure and a cyano group has a structure represented by the following general formula (A3).

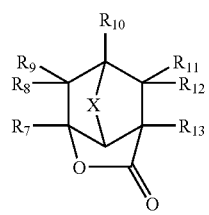

(A3)

In the general formula (A3), $R_7$ to $R_{13}$ independently represent each a single bond, a hydrogen atom or a substituent. At least two of $R_7$ to $R_{13}$ may be bonded together to form a cyclic structure.

X represents —O—, —S—, —N($R^N$)$_2$— or —CH$_2$)$_n$—. $R^N$ represents a hydrogen atom or a substituent having from 1 to 4 carbon atoms. n represents 1 or 2.

At least one of $R_7$ to $R_{13}$ and X represents a cyano group or a group having a cyano group.

The repeating unit having a structure represented by the general formula (A3) may have the structure represented by the general formula (A3) in the main chain of the repeating unit or a side chain thereof using at least one of the sites possibly being a hydrogen atom in $R_7$ to $R_{13}$ (namely, hydrogen atoms as $R_7$ to $R_{13}$ and a hydrogen atom in substituents as $R_7$ to $R_{13}$) as a bond (a single bond).

It is preferable that the structure represented by the general formula (A2) is represented by the following general formula (A4).

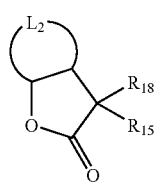

(A4)

In the general formula (A4), $R_{14}$ and $R_{15}$ independently represent each a single bond, a hydrogen atom or a substituent.

$L_2$ represents a linking group forming cyclic structure.

$R_{14}$, $R_{15}$ and $L_2$ may be bonded together to from a cyclic structure.

At least one of $R_{14}$, $R_{15}$ and $L_2$ represents a cyano group or a group having a cyano group.

The repeating unit having a structure represented by the general formula (A4) may have the structure represented by the general formula (A4) in the main chain of the repeating unit or a side chain thereof using at least one of the sites possibly being a hydrogen atom in $R_{14}$, $R_{15}$ and $L_2$ (namely, hydrogen atoms as $R_{14}$ and $R_{15}$, a hydrogen atom in substituents as $R_{14}$ and $R_{15}$ and a hydrogen atom in a linking group as $L_2$) as a bond (a single bond).

It is preferable that the structure represented by the general formula (A2) is represented by the following general formula (A5).

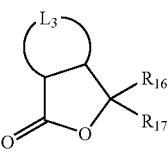

(A5)

In the general formula (A5), $R_{16}$ and $R_{17}$ independently represent each a single bond, a hydrogen atom or a substituent.

$L_3$ represents a linking group forming cyclic structure.

$R_{16}$, $R_{17}$ and $L_3$ may be bonded together to from a cyclic structure.

At least one of $R_{16}$, $R_{17}$ and $L_3$ represents a cyano group or a group having a cyano group.

The repeating unit having a structure represented by the general formula (A5) may have the structure represented by the general formula (A5) in the main chain of the repeating unit or a side chain thereof using at least one of the sites possibly being a hydrogen atom in $R_{16}$, $R_{17}$ and $L_3$ (namely, hydrogen atoms as $R_{16}$ and $R_{17}$, a hydrogen atom in substituents as $R_{16}$ and $R_{17}$ and a hydrogen atom in a linking group as $L_3$) as a bond (a single bond).

It is preferable that the repeating unit (A1) having a lactone structure and a cyano group has a structure represented by the following general formula (A6).

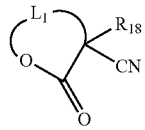

(A6)

In the general formula (A6), $R_{18}$ represents a single bond, a hydrogen atom or a substituent.

$L_1$ represents a linking group which links between the carbon atom at the 2-position of the lactone ring and the oxygen atom in the lactone to thereby form a lactone ring structure.

$R_{18}$ and $L_1$ may be bonded together to form a cyclic structure.

The repeating unit having a structure represented by the general formula (A6) may have the structure represented by the general formula (A6) in the main chain of the repeating unit or a side chain thereof using at least one of the sites possibly being a hydrogen atom in $R_{18}$ and $L_1$ (namely, a hydrogen atom as $R_{18}$, a hydrogen atom in a substituent as $R_{18}$ and a hydrogen atom in a linking group as $L_1$) as a bond (a single bond).

It is preferable that the structure represented by the general formula (A6) is represented by the following general formula (A7).

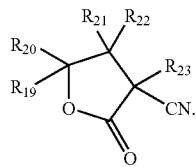
(A7)

In the general formula (A7), $R_{19}$ to $R_{23}$ independently represent each a single bond, a hydrogen atom or a substituent. At least two of $R_{19}$ to $R_{23}$ may be bonded together to form a cyclic structure.

The repeating unit having a structure represented by the general formula (A7) may have the structure represented by the general formula (A7) in the main chain of the repeating unit or a side chain thereof using at least one of the sites possibly being a hydrogen atom in $R_{19}$ to $R_{23}$ (namely, hydrogen atoms as $R_{19}$ and $R_{23}$ and a hydrogen atom in substituents as $R_{19}$ and $R_{23}$) as a bond (a single bond).

As examples of the repeating units having the structures represented by the general formulas (A2) to (A7), there can be enumerated structures wherein a structure represented by any one of the general formulae (A2) to (A7) is attached to any position in skeleton of the following repeating units. That is, those wherein any hydrogen atom in such a repeating unit as shown below is substituted using at least one of the sites possibly being a hydrogen atom in structure represented by any one of the general formulae (A2) to (A7) as a bond (a single bond).

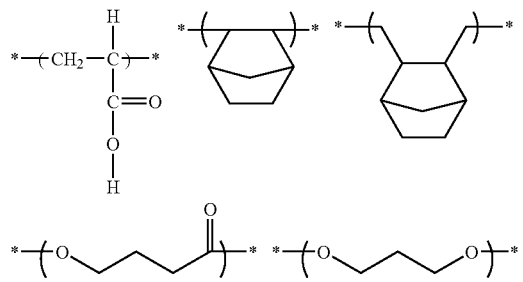

The repeating unit (A1) is preferably a repeating unit derived from an ethylenically double bond, more preferably a repeating unit derived from a (meth)acrylic acid derivative.

The substituents in the general formulae (A3) to (A7) are the same as those cited with respect to the general formula (A2).

The substituent having a cyano group in the general formulae (A3) to (A7) are the same as those cited with respect to the general formula (A2).

As examples of the cyclic structure formed by at least two substituents bonded together in the general formulae (A2) to (A7), there can be enumerated 5- to 6-membered rings. Such a cyclic structure may have a substituent such as a cyano group.

As an example of the cyclic structure formed by $L_2$ and $L_3$ in the general formulae (A4) to (A5), a norbornane structure may be enumerated. Such a cyclic structure may have a substituent such as a cyano group.

As more appropriate modes of the repeating units represented by the general formulae (A2) to (A7), a repeating unit represented by the following general formula (A8) can be enumerated.

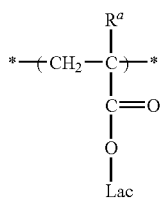
(A8)

In the general formula (A8), $R^a$ represents a hydrogen atom or an alkyl group having from 1 to 4 carbon atoms which may have a substituent.

$L_{ac}$ represents a structure represented by any one of the general formulae (A2) to (A7).

Next, specific examples of the repeating unit represented by the above general formula (A1) will be presented, though the invention is not restricted thereto. In these specific examples, a methyl group may be a hydrogen atom.

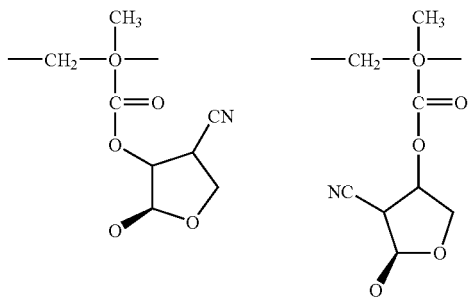

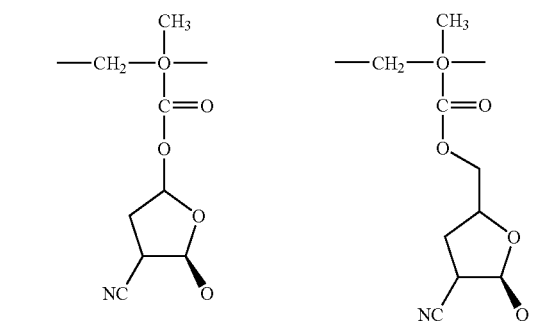

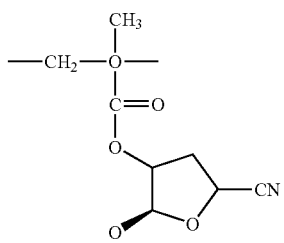

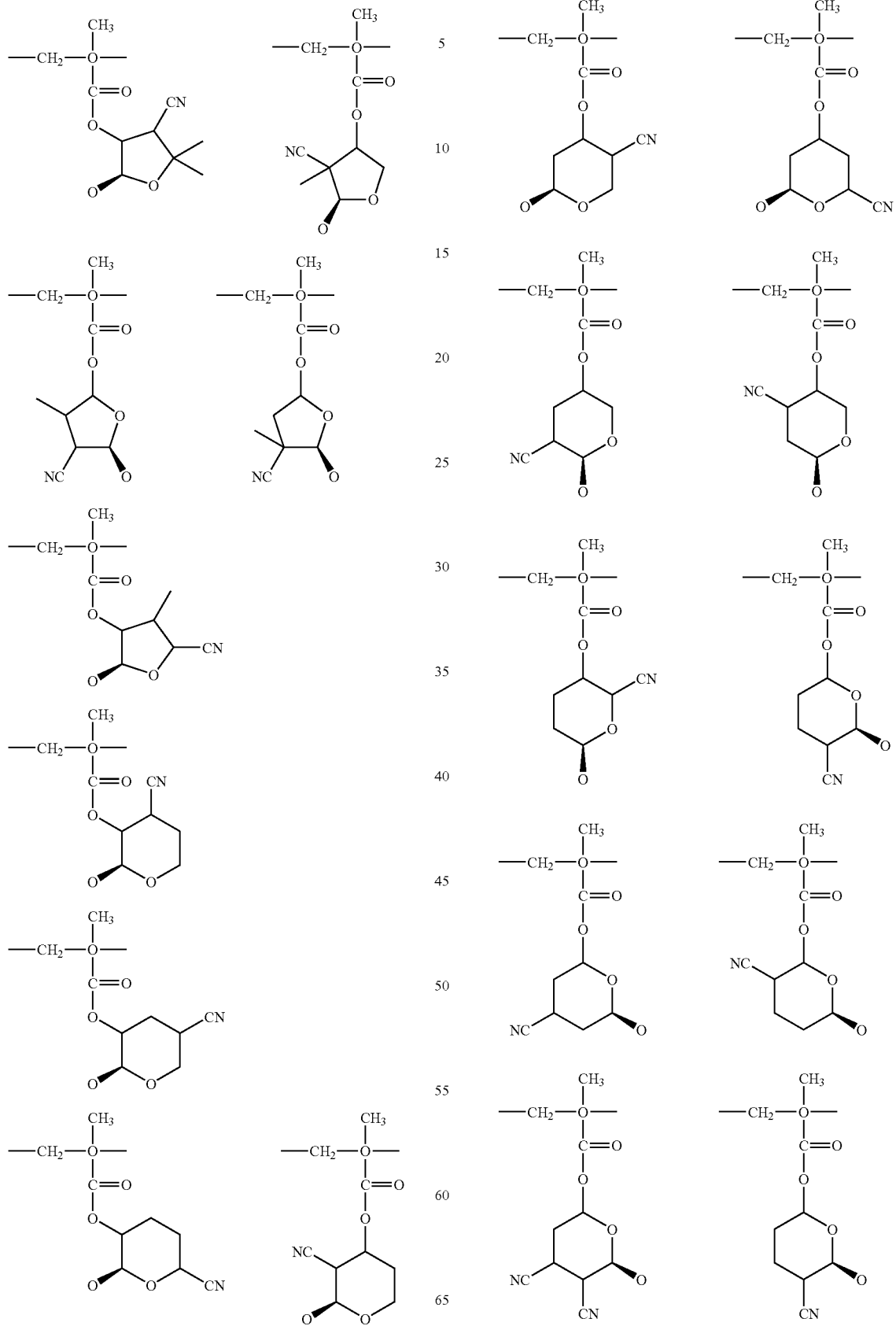

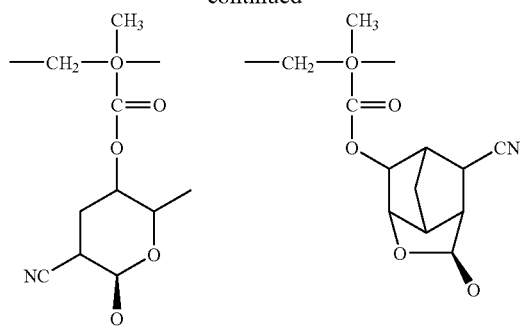
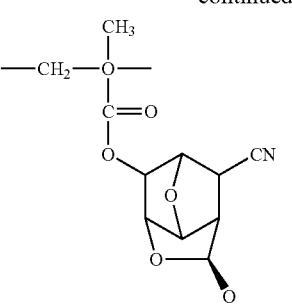
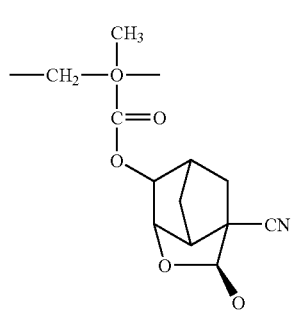
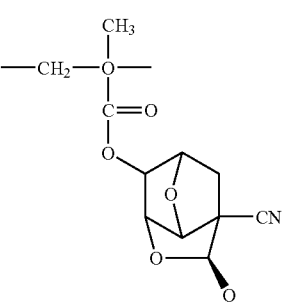
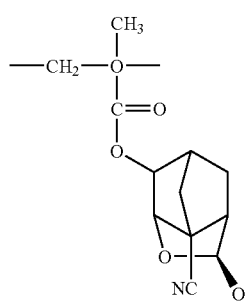
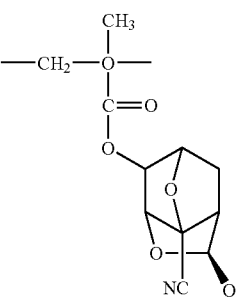
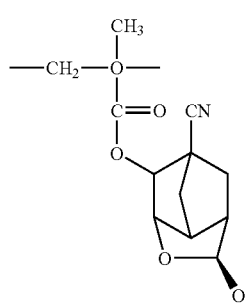
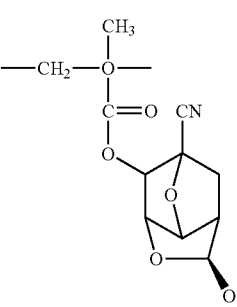
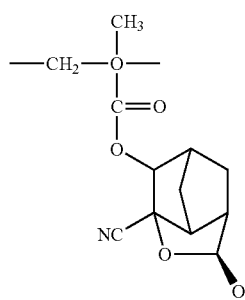
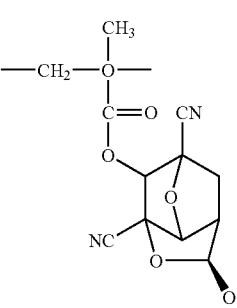

-continued
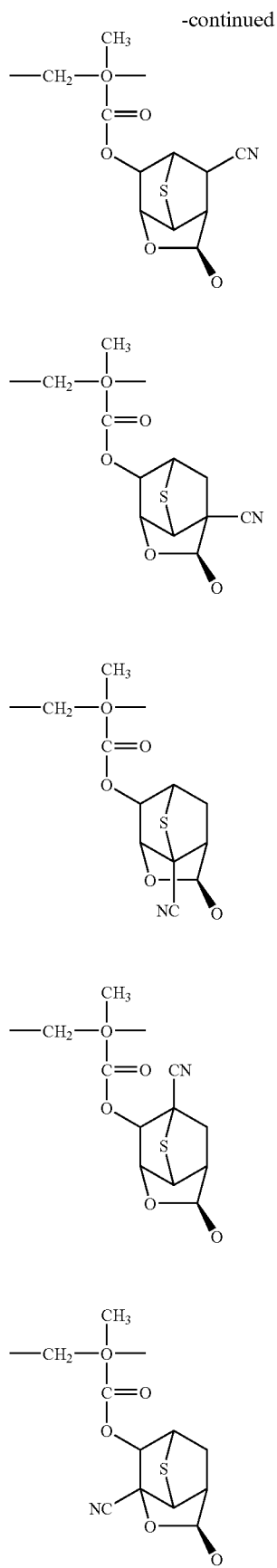
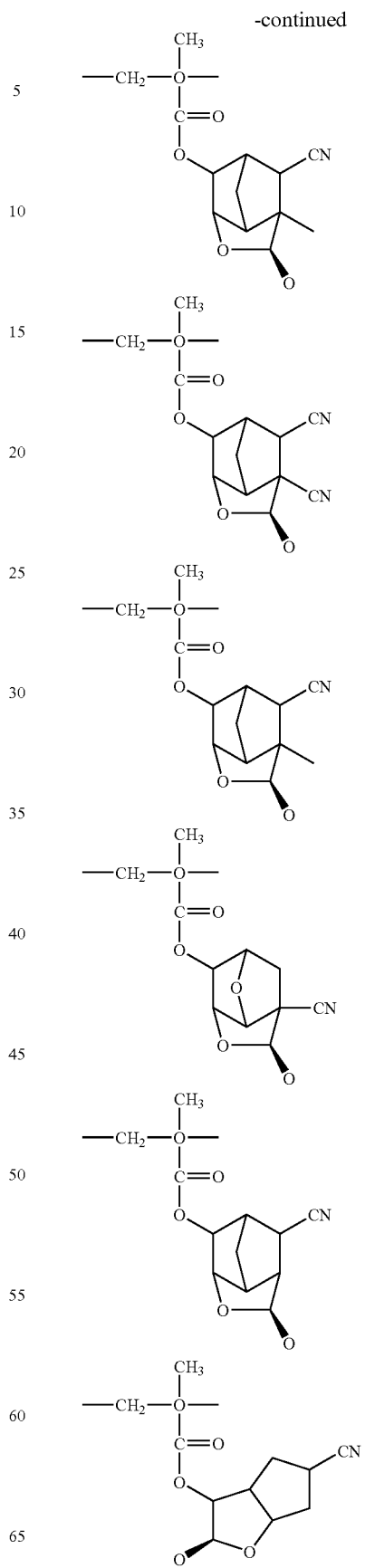

-continued
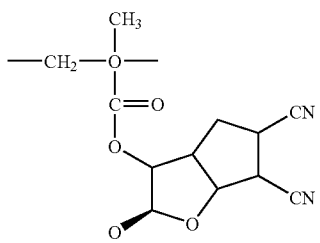
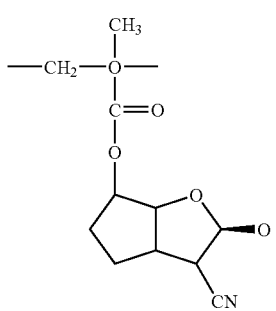
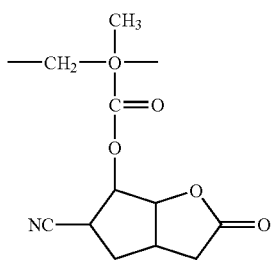
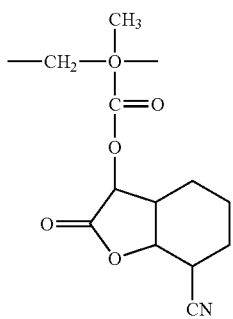
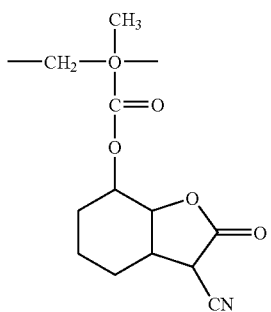
-continued
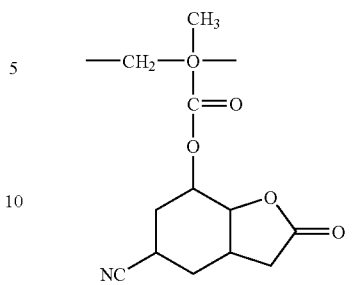
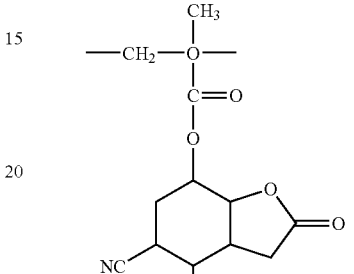
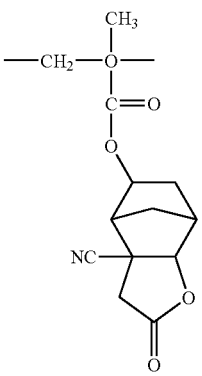
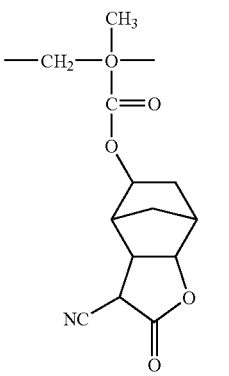
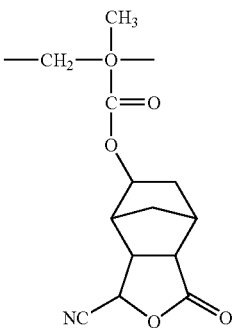
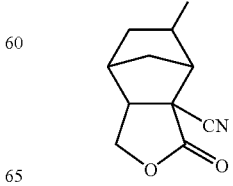
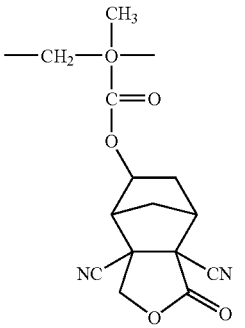

-continued
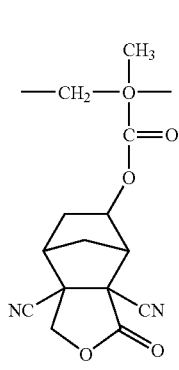
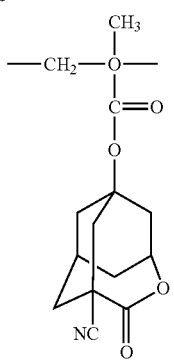
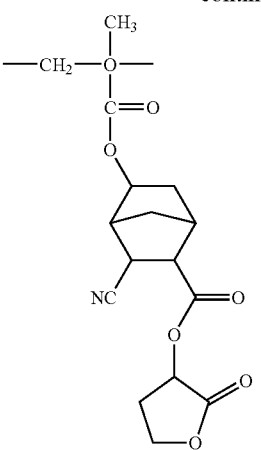
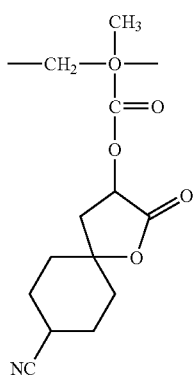
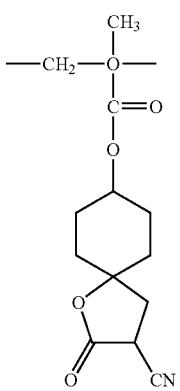
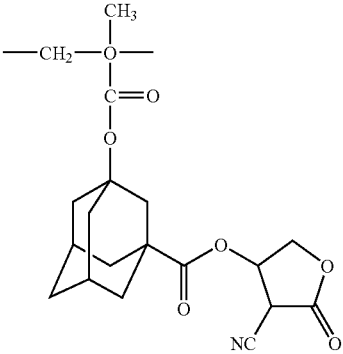
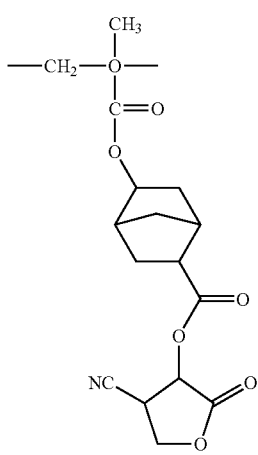
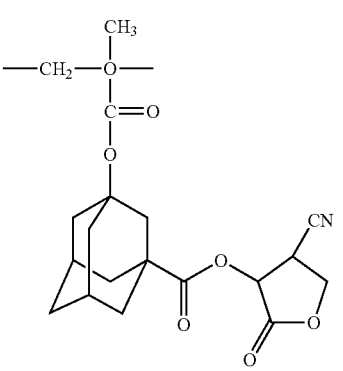
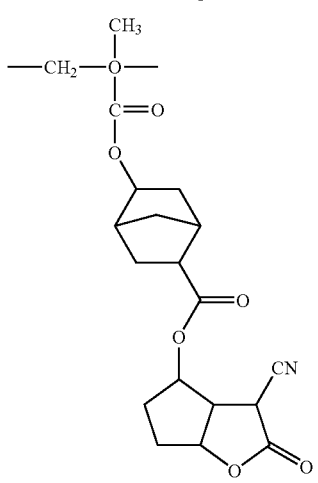
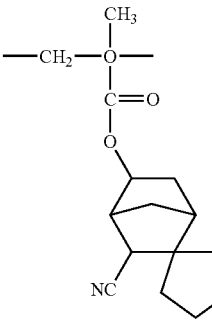

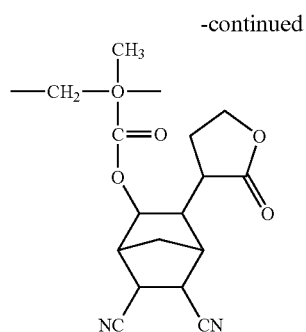
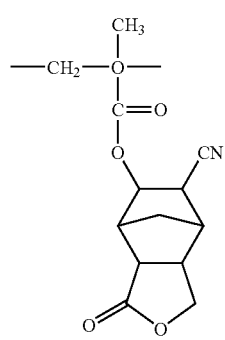
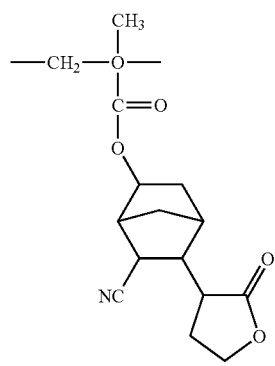
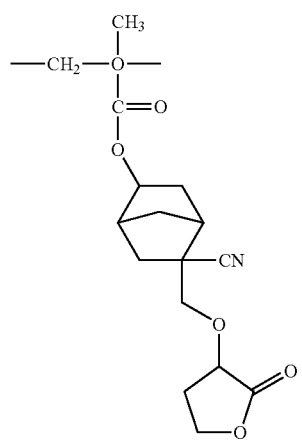

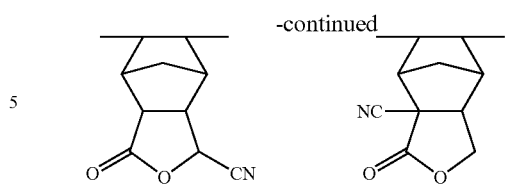
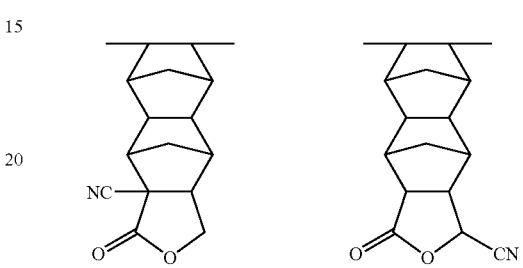
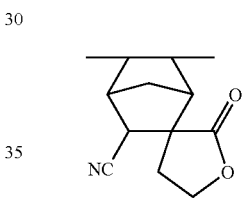

Although a monomer corresponding to the repeating unit (A1) may be synthesized by any method without restriction, it is preferred to employ a method whereby a monomer is synthesized via an alkenylcarboxylic acid (an intermediate I) or its ester (an intermediate II) as shown by the following Scheme 1 and Scheme 2. The epoxidation in Scheme II may be carried out by a commonly employed method with the use of mCPBA, dimethyloxirane or the like. In the case of starting with the intermediate II, a similar epoxycarboxylic acid can be obtained by conducting the epoxidation and then hydrolyzing the ester moiety. The epoxide thus obtained is derived into hydroxylactone by treating under acidic conditions and then a polymerizable group is attached to the hydroxyl group thus formed. Thus, a monomer can be obtained efficiently. In the monomerization, use can be made of any esterifying reaction.

In the lactonization in Scheme 2, use may be made of a commonly employed lactonization method. As an example thereof, a halolactonization reaction may be cited. As a preferable example, an iodolactonization reaction may be cited. The iodine atom in the iodolactone thus obtained is substituted by a substituent having a polymerizable group, thereby deriving into a monomer.

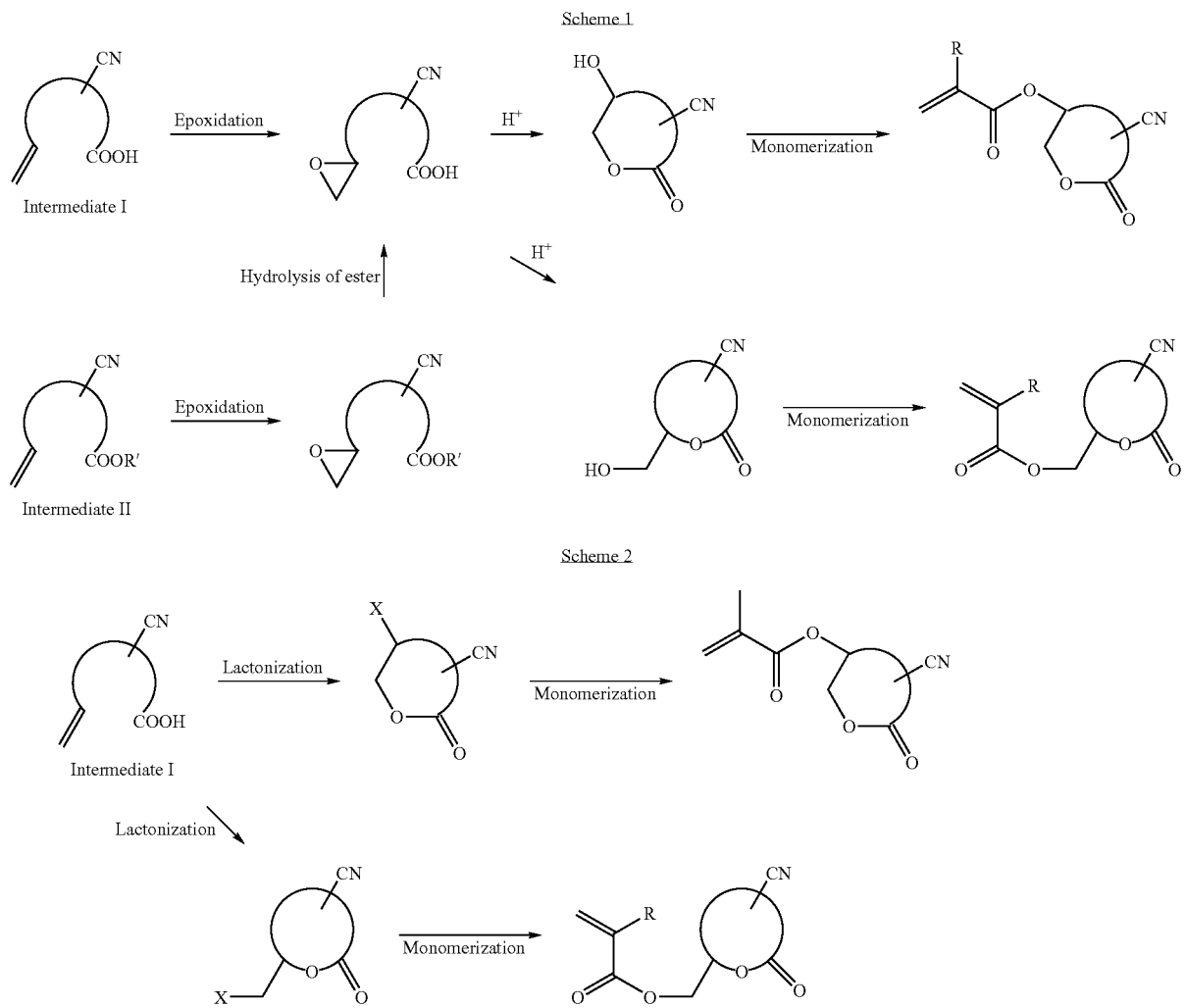

It is preferable that the alicyclic hydrocarbon type acid-decomposable resin of the invention has a repeating unit having an organic group substituted by a hydroxyl group or a cyano group.

It is preferable that repeating unit having an organic group substituted by a hydroxyl group or a cyano group is a repeating unit represented by the following general formula (R2).

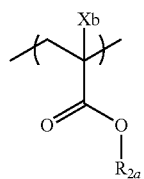

(R2)

In the general formula (R2), Xb represents a hydrogen atom or a methyl group.

$R_{2a}$ represents an organic group substituted by a hydroxyl group or a cyano group.

In the general formula (R2), the methyl group Xb may be substituted by a halogen atom (preferably a fluorine atom), a hydroxyl group or the like.

As the organic group $R_{2a}$ substituted by a hydroxyl group or a cyano group, there can be enumerated an alkyl group substituted by at least one hydroxyl group or cyano group and an alicyclic hydrocarbon group substituted by at least one hydroxyl group or cyano group, and an alicyclic hydrocarbon group substituted by at least one hydroxyl group or cyano group is preferred.

It is preferable that the alicyclic hydrocarbon type acid-decomposable resin of the invention has a repeating unit having an alicyclic hydrocarbon structure (a cyclic hydrocarbon structure) substituted by a polar group. Thus, the adhesiveness to a substrate and a compatibility with a developing solution can be improved. Preferable examples of the alicyclic hydrocarbon structure of the alicyclic hydrocarbon structure substituted by a polar group include an adamantyl group, a diamantyl group and a norbornyl group. Preferable examples of the polar group include a hydroxyl group and a cyano group. As preferable examples of the alicyclic hydrocarbon structure substituted by a polar group, there can be enumerated structured represented by the following general formulae (VIIa) to (VIId).

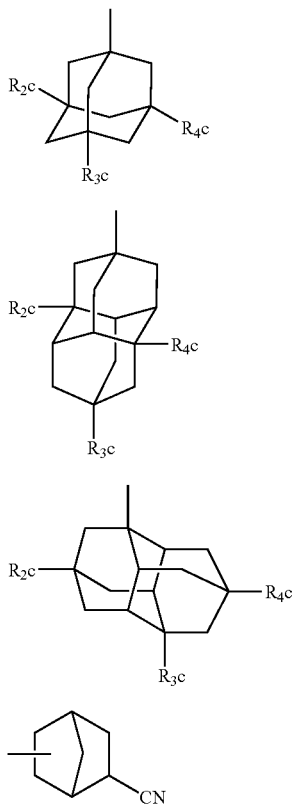

(VIIa)

(VIIb)

(VIIc)

(VIId)

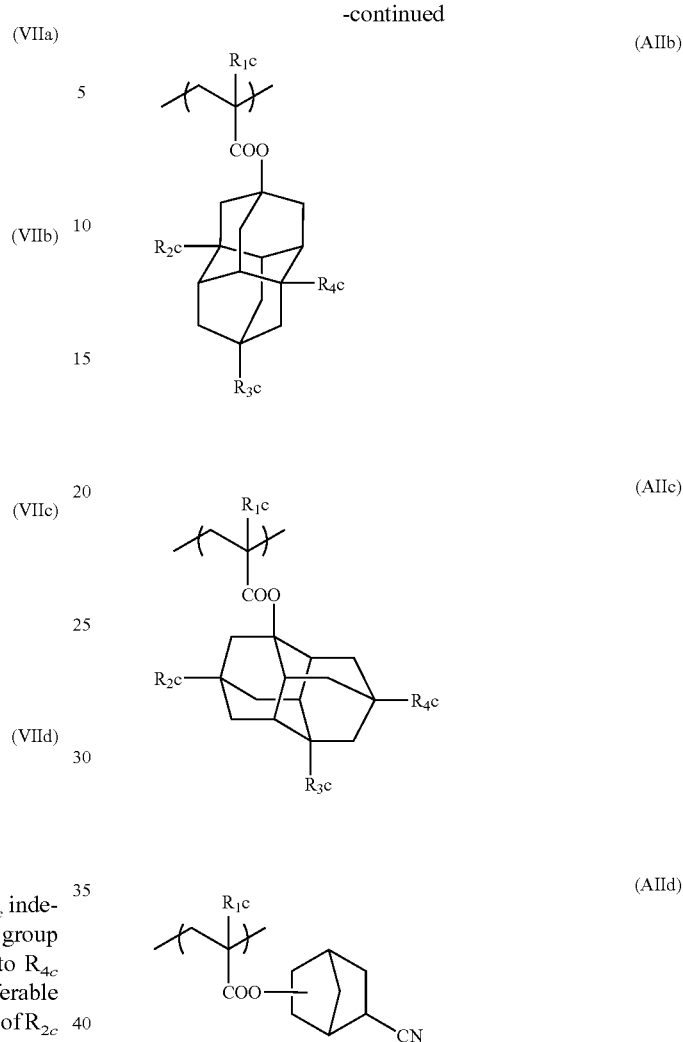

(AIIb)

(AIIc)

(AIId)

In the general formulae (VIIa) to (VIId), $R_{2c}$ to $R_{4c}$ independently represent each a hydrogen atom, a hydroxyl group or a cyano group, provided that at least one of $R_{2c}$ to $R_{4c}$ represents a hydroxyl group or a cyano group. It is preferable that in the general formulae (VIIa) to (VIId), one or two of $R_{2c}$ to $R_{4c}$ are hydroxyl group(s) and the remainders are hydrogen atoms. It is more preferable that In (VIIa), two of $R_{2c}$ to $R_{4c}$ are hydroxyl groups and the remainders are hydrogen atoms. It is preferable that in the general formula (VIId), one of $R_{2c}$ to $R_{3c}$ is a cyano group and the remainders are hydrogen atoms.

As examples of the repeating unit having a group represented by any of the general formulae (VIIa) to (VIId), there can be enumerated those wherein at least one of $R_{13}'$ to $R_{16}'$ in the above general formula (II-AB1) or (II-AB2) has a group represented by any of the general formulae (VIIa) to (VIId) (for example, a group —$COOR_5$ wherein $R_5$ is a group represented by any of the general formulae (VIIa) to (VIId)), or repeating units represented by the following general formulae (AIIa) to (AIId).

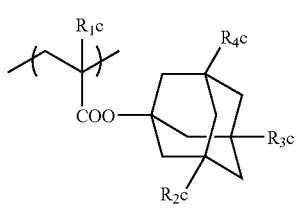

(AIIa)

In the general formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in the general formulae (VIIa) to (VIId).

Next, specific examples of the repeating unit having an organic group substituted by a hydroxyl group or a cyano group and specific examples of the repeating unit having an alicyclic hydrocarbon structure substituted by a polar group will be given, though the invention is not restricted thereto.

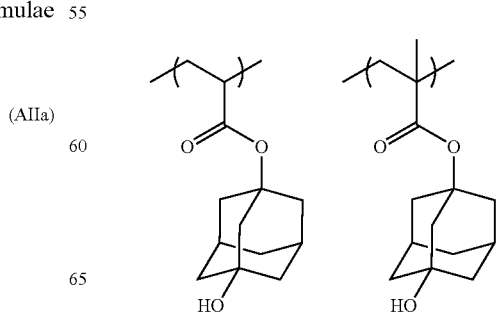

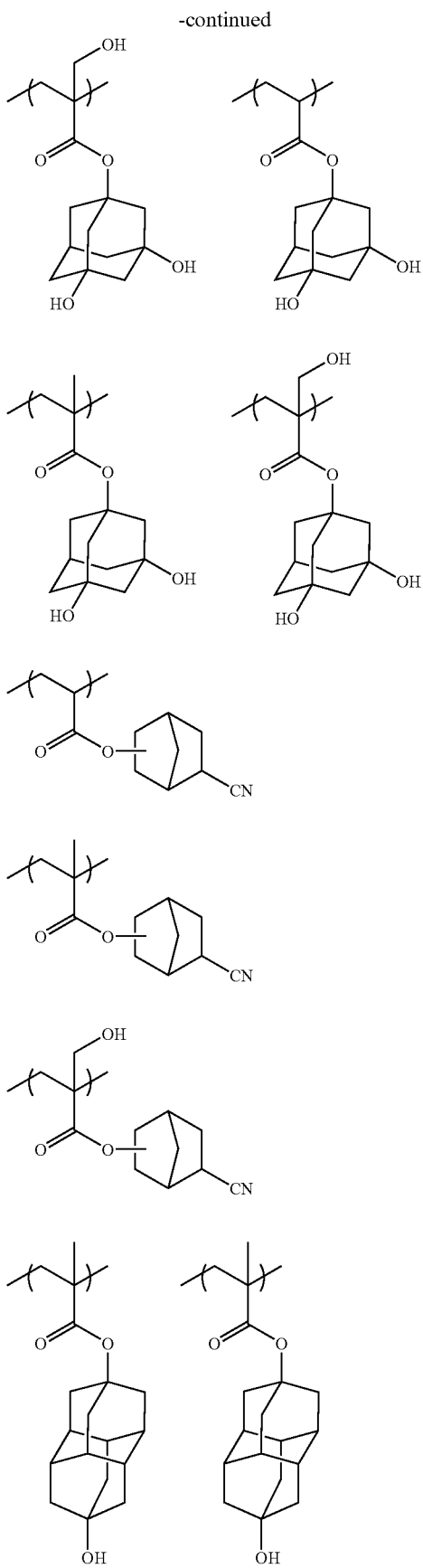

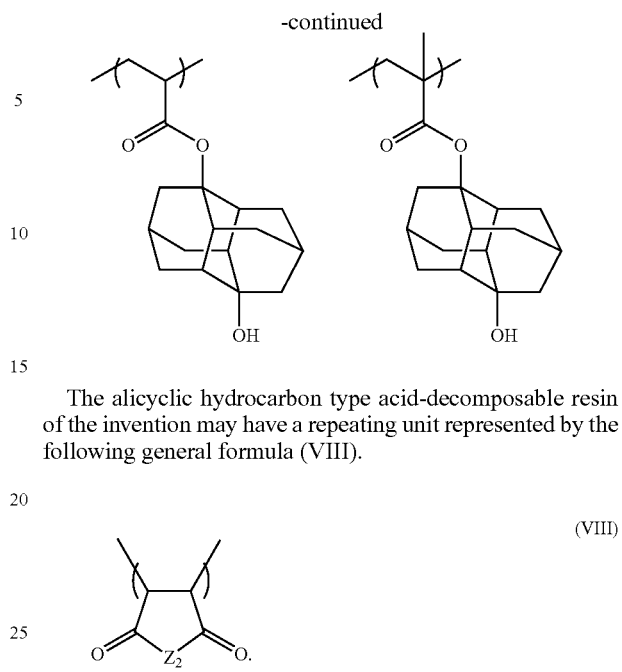

The alicyclic hydrocarbon type acid-decomposable resin of the invention may have a repeating unit represented by the following general formula (VIII).

(VIII)

In the general formula (VIII), $Z_2$ represents —O— or —N($R_{41}$)— wherein $R_{41}$ represents an alkyl group, a cycloalkyl group or a camphor residue. The alkyl groups $R_{41}$ and $R_{42}$ may be further substituted by a halogen atom (preferably a fluorine atom) or the like.

Next, specific examples of the repeating unit represented by the general formula (VIII) will be presented, though the invention is not restricted thereto.

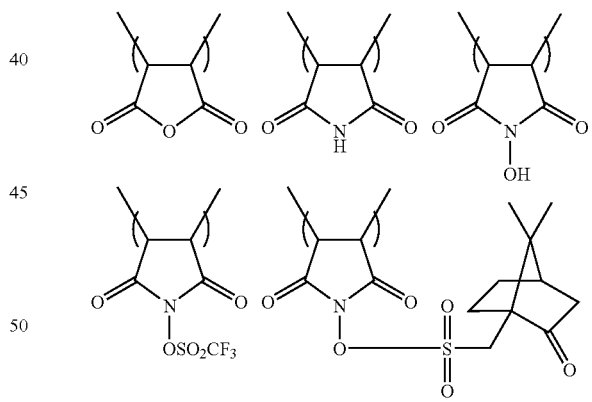

It is preferable that the alicyclic hydrocarbon type acid-decomposable resin of the invention has a repeating unit having an alkali-soluble group, more preferably a repeating unit having a carboxyl group. Owing to the presence of such a repeating unit, the resolution can be improved when used in a contact hole. As preferable examples of the repeating unit having a carboxyl group, there can be enumerated any one of a repeating unit wherein a carboxyl group is directly attached to the main chain of a resin such as a repeating unit of acrylic acid or methacrylic acid, a repeating unit wherein a carboxyl group is attached to the main chain of a resin via a linking group and a repeating unit at the terminus of a polymer chain into which an alkali-soluble group has been introduced in the course of polymerization by using a polymerization initiator or a chain transfer agent having an alkali-soluble group. The linking group may have a monocyclic or polycyclic hydrocarbon structure. A repeating unit comprising acrylic acid or methacrylic acid is particularly preferred.

The alicyclic hydrocarbon type acid-decomposable resin of the invention may have a repeating unit having from 1 to 3 groups represented by the following general formula (F1). Thus, the line edge roughness performance can be improved.

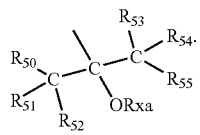
(F1)

In the general formula (F1), $R_{50}$ to $R_{55}$ independently represent each a hydrogen atom, a fluorine atom or an alkyl group, provided that at least one of $R_{50}$ to $R_{55}$ represents a fluorine atom or an alkyl group in which at least one hydrogen atom is substituted by a fluorine atom.

$R_{xa}$ represents a hydrogen atom or an organic group (preferably an acid-decomposable protecting group, an alkyl group, a cycloalkyl group, an acyl group or an alkoxycarbonyl group).

The alkyl groups $R_{50}$ to $R_{55}$ may be substituted by a halogen atom such as a fluorine atom, a cyano group and so on. As preferable examples thereof, there can be enumerated an alkyl group having from 1 to 3 carbon atoms such as a methyl group and a trifluoromethyl group.

It is preferable that all of $R_{50}$ to $R_{55}$ are fluorine atoms.

As preferable examples of the organic group represented by $R_{xa}$, there can be enumerated an acid-decomposable protecting group, an optionally substituted alkyl group, a cycloalkyl group, an acyl group, an alkylcarbonyl group, an alkoxycarbonylmethyl group, an alkoxymethyl group and a 1-alkoxyethyl group.

As a preferable example of the repeating unit having a group represented by the general formula (F1), a repeating unit represented by the following general formula (F2) can be cited.

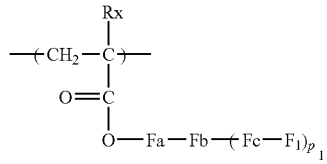
(F2)

In the general formula (F2), $R_x$ represents a halogen atom or an alkyl group having from 1 to 4 carbon atoms. As preferable examples of a substituent which may be carried by the alkyl group $R_x$, a hydroxyl group and a halogen atom can be cited.

$F_a$ represents a single bond or a linear or branched alkylene group and a single bond is preferred.

$F_b$ represents a monocyclic or polycyclic hydrocarbon group.

$F_c$ represents a single bond or a linear or branched alkylene group and a single bond or a methylene group is preferred.

$F_1$ represents a group represented by the general formula (F1).

$p_1$ represents from 1 to 3.

As the cyclic hydrocarbon group in $F_b$, a cyclopentyl group, a cyclohexyl group or a norbornyl group is preferred.

Next, specific examples of the repeating unit having the structure of the general formula (F1) will be presented.

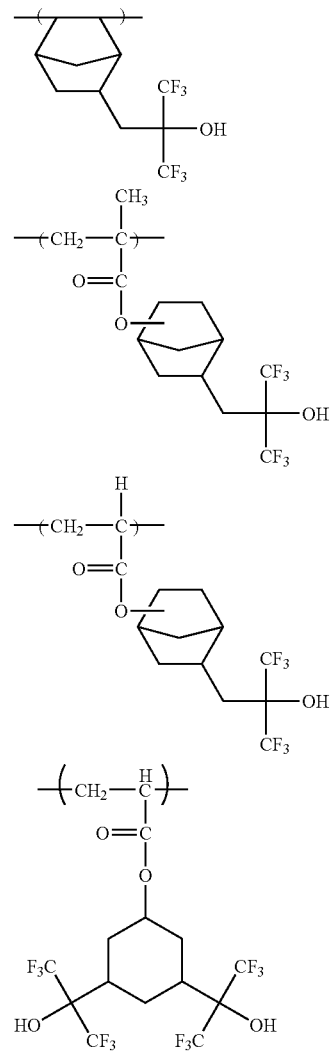

It is preferable that the alicyclic hydrocarbon type acid-decomposable resin of the invention has a repeating unit having an alkali-soluble group. As examples of the alkali-soluble group, there can be enumerated a carboxyl group, a sulfonamide group, a sulfonylimide group, a bisulfonylimide group and an aliphatic alcohol substituted at the α-position by an electron-withdrawing group. It is more preferable to have a repeating unit having a carboxyl group.

Owing to the presence of the repeating unit having an alkali-soluble group, the resolution can be improved when used in a contact hole. As preferable examples of the repeating unit having an alkali-soluble group, there can be enumerated any one of a repeating unit wherein an alkali-soluble group is directly attached to the main chain of a resin such as a repeating unit of acrylic acid or methacrylic acid, a repeating unit wherein an alkali-soluble group is attached to the main chain of a resin via a linking group and a repeating unit at the terminus of a polymer chain into which an alkali-soluble group has been introduced in the course of polymerization by using a polymerization initiator or a chain transfer agent having an alkali-soluble group. The linking group may have a monocyclic or polycyclic hydrocarbon structure. A repeating unit comprising acrylic acid or methacrylic acid is particularly preferred.

The content of the repeating unit having an alkali-soluble group is preferably from 1 to 20% by mol, more preferably from 3 to 15% by mol and more preferably from 5 to 10% by mol, based on the total repeating units in the polymer.

Next, specific examples of the repeating unit having an alkali-soluble group will be presented, though the invention is not restricted thereto.

(In the following formulae, $R_x$ represents H, $CH_3$, $CF_3$ or $CH_2OH$.)

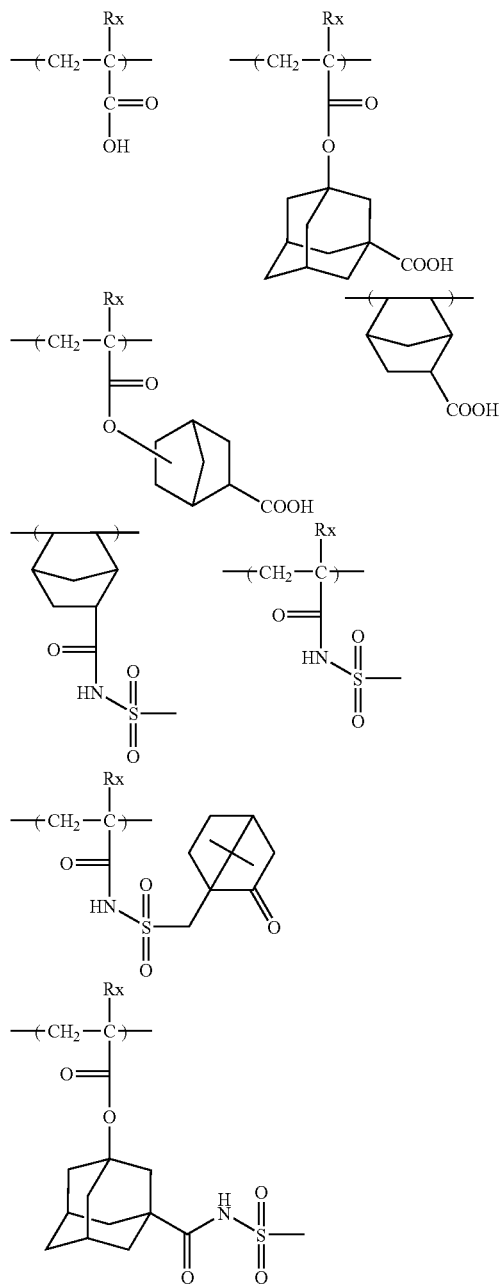

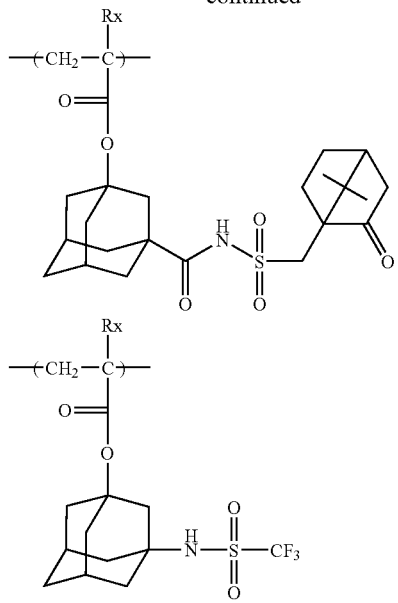

The alicyclic hydrocarbon type acid-decomposable resin of the invention may further have a repeating unit which has an alicyclic hydrocarbon structure but is free from acid-decomposable group. Thus, the elution of low-molecular components from a resist film into an immersion liquid can be prevented during immersion exposure. As examples of such a repeating unit, there can be enumerated 1-adamantyl (meth)acrylate, tricyclodecanyl (meth)acrylate, cyclohexyl (meth)acrylate and so on.

In addition to the repeating structural units as described above, the alicyclic hydrocarbon type acid-decomposable resin of the invention may have various repeating structural units in order to control resistance to dry etching, suitability for standard developing solutions, adhesiveness to a substrate, resist profile and other characteristics generally required in resists (for example, resolution, heat resistance and sensitivity).

As examples of these repeating structural units, there can be enumerated structural units corresponding to the following monomers. However, the invention is not restricted thereto.

Thus, it becomes possible to finely control characteristics required for the alicyclic hydrocarbon type acid-decomposable resin, in particular, the following ones.

(1) Solubility in a coating solvent.
(2) Film-forming properties (glass transition point).
(3) Alkali-development properties.
(4) Film loss (selection of a hydrophilic/hydrophobic and alkali-soluble group).
(5) Adhesiveness to a non-exposed part.
(6) Dry etching resistance, and so on.

As examples of such monomers, there can be enumerated a compound having one addition-polymerizable unsaturated bond selected from among acrylic esters, methacrylic esters, acrylamides, methacrylamides, allyl compounds, vinyl ethers, vinyl esters and so on.

Furthermore, such a monomer having various repeating structural units as cited above may be copolymerizable with an addition-polymerizable unsaturated compound so long as it can be copolymerized with the monomer.

In the alicyclic hydrocarbon type acid-decomposable resin, the molar ratio of each repeating structural unit may be appropriately determined so as to control the dry etching resistance, suitability for standard developing solutions and adhesiveness of the resist, the resist profile and other characteristics generally required in resists, for example, resolution, heat resistance and sensitivity.

Preferable examples of the mode of the alicyclic hydrocarbon type acid-decomposable resin of the invention are as follows.

(1) An alicyclic hydrocarbon type acid-decomposable resin having a partial structure containing a repeating unit containing an alicyclic hydrocarbon represented by one of the above-described general formulae (pI) to (pV) (a side chain type), preferably one having a repeating unit of (meth)acrylate having a structure of one of (pI) to (pV).

(2) One having a repeating unit represented by the general formula (II-AB) (a main chain type), provided that examples of (2) include the following ones.

(3) One having a repeating unit represented by the general formula (II-AB), a maleic anhydride derivative structure and a (meth)acrylate structure (a hybrid type).

In the alicyclic hydrocarbon type acid-decomposable resin, the content of the repeating unit having an acid-decomposable group is preferably from 10 to 60% by mol, more preferably from 20 to 50% by mol and more preferably from 25 to 40% by mol based on the total repeating units.

In the alicyclic hydrocarbon type acid-decomposable resin, the content of the repeating unit having an alicyclic hydrocarbon represented by one of the general formulae (pI) to (pV) is preferably from 20 to 70% by mol, more preferably from 20 to 50% by mol and more preferably from 25 to 40% by mol based on the total repeating units.

In the alicyclic hydrocarbon type acid-decomposable resin, the content of the repeating unit having a repeating unit represented by the general formula (II-AB) is preferably from 10 to 60% by mol, more preferably from 15 to 55% by mol and more preferably from 20 to 50% by mol based on the total repeating units.

Although the content of a repeating unit based on a monomer employed as an additional copolymerizable component in the resin may be appropriately determined depending on the desired resist performance, it is generally preferred that the content thereof is not more than 99% by mol, more preferably not more than 90% by mol and more preferably not more than 80% by mol based on the sum of the moles of the repeating unit having a partial structure containing an alicyclic hydrocarbon represented by one of the general formulae (pI) to (pV) as described above and the moles of the repeating unit represented by the general formula (II-AB) as described above.

In the case where the composition of the invention is to be used for ArF exposure, it is preferred from the viewpoint of the transparency to the ArF beam that the resin is free from aromatic group.

As the alicyclic hydrocarbon type acid-decomposable resin to be used in the invention, one wherein all of the repeating units consist of (meth)acrylate repeating units is preferred. In this case, use can be made of any of one wherein all of the repeating units consist of acrylate, one wherein all of the repeating units consist of methacrylate and one wherein all of the repeating units consist of acrylate/(meth)acrylate mixture, though it is preferred to use one wherein the content of acrylate repeating units is 50% by mol or less based on the total repeating units. It is more preferable to use a ternary copolymer which contains from 20 to 50% by mol of a repeating unit having a partial structure containing an alicyclic hydrocarbon represented by one of the general formulae (pI) to (pV) as described above, from 20 to 50% by mol of a repeating unit having a lactone structure as described above and from 5 to 30% by mol of a repeating unit having an alicyclic hydrocarbon structure substituted by a polar group as described above, or a quaternary copolymer which further contains from 5 to 30% by mol of another repeating unit.

As particularly preferable examples of the resin, there can be enumerated a ternary copolymer which contains from 20 to 50% by mol of a repeating unit having an acid-decomposable group represented by one of the following general formulae (ARA-1) to (ARA-5), from 20 to 50% by mol of a repeating unit having a lactone structure represented by one of the following general formulae (ARL-1) to (ARL-6) and from 5 to 30% by mol of a repeating unit having an alicyclic hydrocarbon structure substituted by a polar group represented by one of the following general formulae (ARH-1) to (ARH-3) and a quaternary copolymer which further contains from 5 to 20% by mol of a repeating unit which has a carboxyl group or a repeating unit represented by the general formula (F1) and an alicyclic hydrocarbon structure but shows no acid decomposability.

(In the following formulae, $R_{xy1}$ represents a hydrogen atom or a methyl group; and $R_{xa1}$ and $R_{xb1}$ represent each a methyl group or an ethyl group).

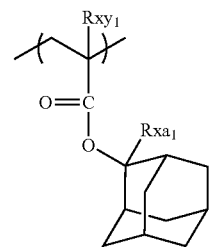

ARA-1

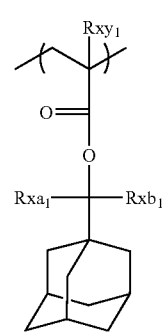

ARA-2

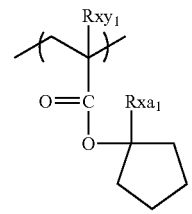

ARA-3

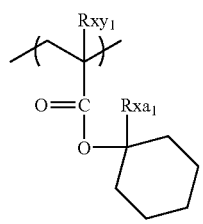
ARA-4

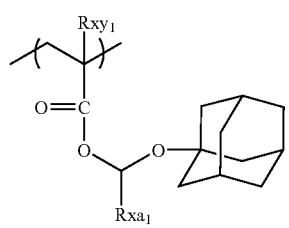
ARA-5

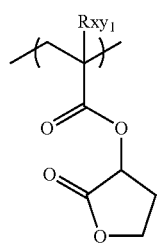
ARL-1

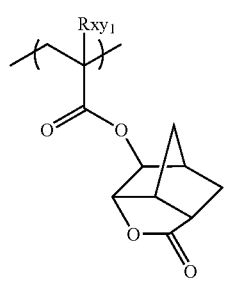
ARL-2

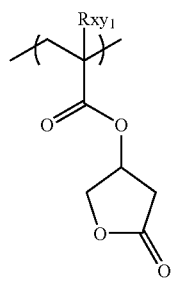
ARL-3

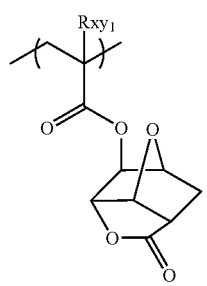
ARL-4

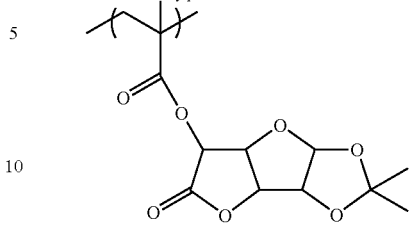
ARL-5

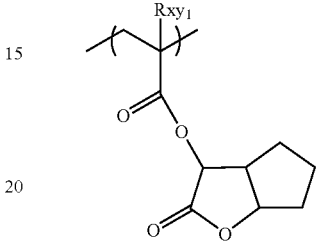
ARL-6

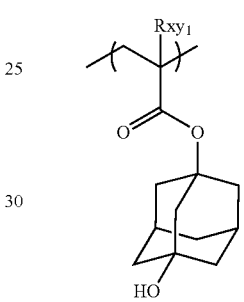
ARH-1

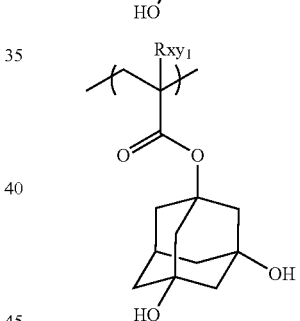
ARH-2

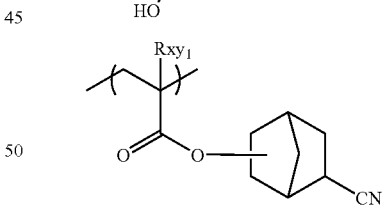
ARH-3

The alicyclic hydrocarbon type acid-decomposable resin usable in the invention can be synthesized in accordance with a method commonly employed (for example, radical polymerization). As examples of the synthesis method commonly employed, there can be enumerated a bulk polymerization method which comprises dissolving monomer species and an initiator in a solvent and heating to thereby conduct polymerization, a drop polymerization method which comprises dropping a solution of monomer species and an initiator to a heated solvent over 1 to 10 hours, and so on. The drop polymerization method is preferred. Examples of the reaction solvent include tetrahydrofuran, 1,4-dioxane, ethers such as diisopropyl ether, ketones such as methyl ethyl ketone and methyl isobutyl ketone, ester solvents such as ethyl acetate, amide solvents such as dimethylformamide and dimethylacetamide, and solvents in which the composition of the invention is soluble as will be discussed hereinafter, for example, propylene glycol monomethyl ether acetate, propylene glycol monomethyl ether and cyclohexanone. It is more preferable to employ the same solvent as the one used in the resist composition of the invention so that the occurrence of particles can be prevented during preservation.

It is preferred to conduct the polymerization under an inert gas atmosphere such as nitrogen or argon. As the polymerization initiator, a commercially available radical initiator (an azo type initiator, a peroxide, etc.) is used to initiate the polymerization. As the radical initiator, an azo type initiator is preferable. An azo type initiator having an ester group, a cyano group or a carboxyl group is preferred. As preferable examples of the initiator, there can be enumerated azobisisobutyronitrile, azobisdimethylvaleronitrile, dimethyl 2,2'-azobis(2-methylpropionate) and so on. If desired, the initiator may be additionally employed or added in portions. Namely, the initiator may be added to the solvent after the completion of the reaction and thus the desired polymer is collected as a powder or a solid. The reaction concentration is from 5 to 50% by mass, preferably from 10 to 30% by mass. The reaction temperature is usually from 10° C. to 150° C., preferably from 30° C. to 120° C. and more preferably from 60° C. to 100° C.

In the case of irradiating the positive resist composition of the invention with a KrF excimer laser beam, electron beam, X-ray or a high energy beam having a wavelength of 50 nm or less (for example, EUV), it is preferable that the resin of the component (A) is an acid-decomposable resin having a hydroxystyrene-based repeating unit (hereinafter sometimes referred to as "hydroxystyrene-based acid-decomposable resin"). As preferable examples of the hydroxystyrene-based acid-decomposable resin, there can be enumerated a hydroxystyrene copolymer blocked with a group which leaves by the action of hydroxystyrene/an acid, a hydroxystyrene/tertiary alkyl (meth)acrylic ester copolymer, a hydroxystyrene/tertiary alkyl (meth)acrylic ester copolymer blocked with a group which leaves by the action of hydroxystyrene/an acid, a hydroxystyrene/styrene copolymer blocked with a group which leaves by the action of hydroxystyrene/an acid, a hydroxystyrene/tertiary alkyl (meth)acrylic ester/styrene copolymer, a hydroxystyrene/tertiary alkyl (meth)acrylic ester/styrene copolymer blocked with a group which leaves by the action of hydroxystyrene/an acid.

Next, specific examples of the hydroxystyrene-based acid-decomposable resin will be presented, though the invention is not restricted thereto.

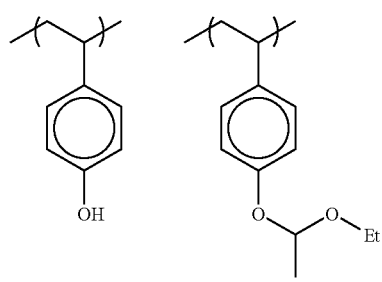
(R-1)

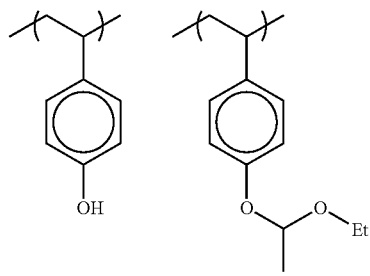
(R-2)

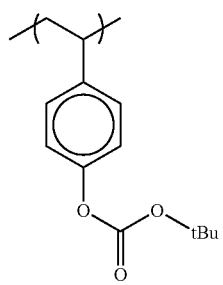

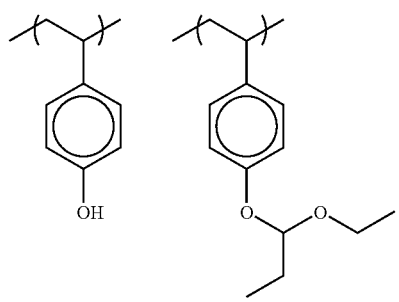
(R-3)

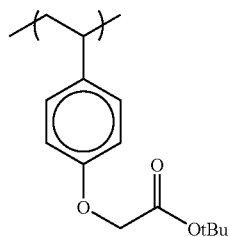

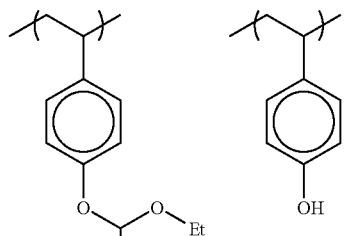
(R-4)

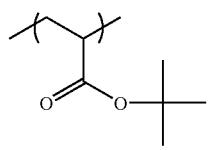

(R-5)
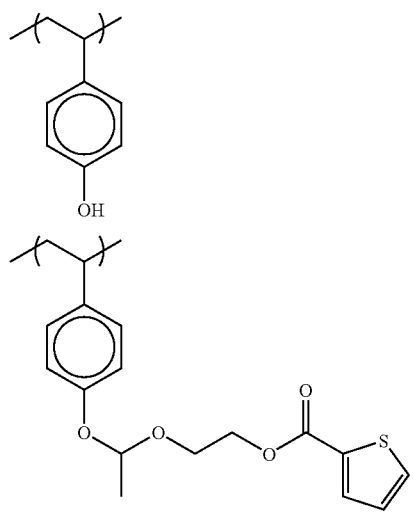
(R-6)
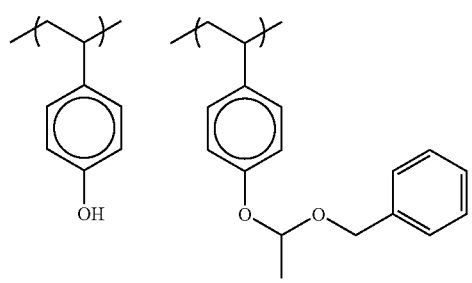
(R-7)
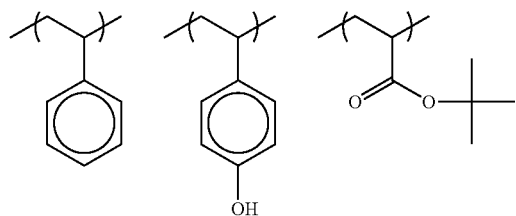
(R-8)
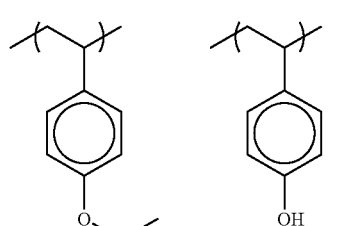
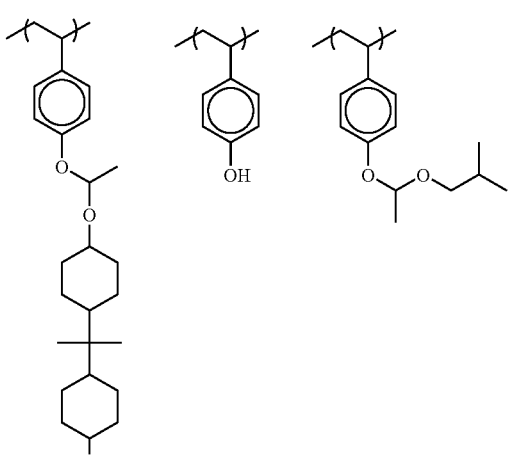
(R-9)
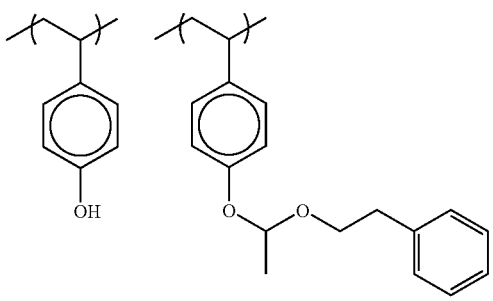
(R-10)
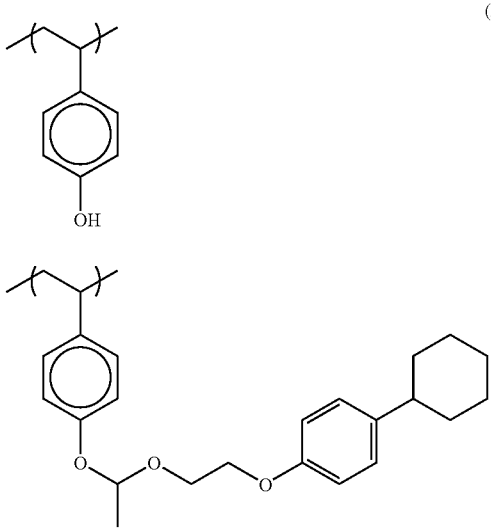
(R-11)
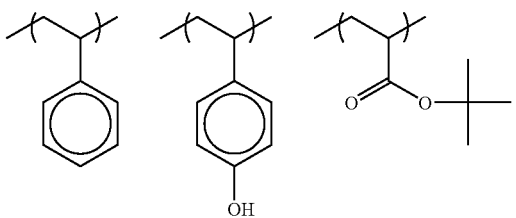
(R-12)

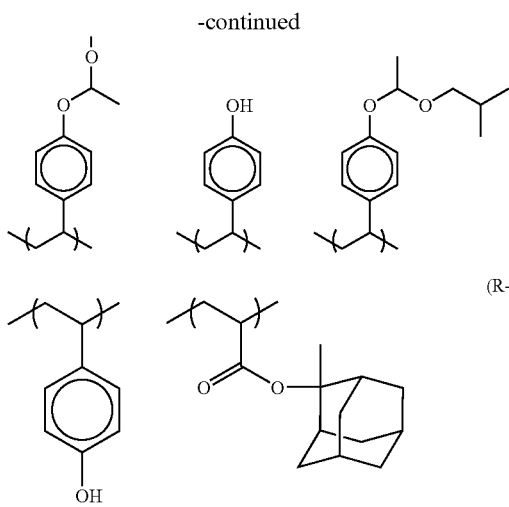

(R-13)

(R-14)

(R-15)

(R-16)

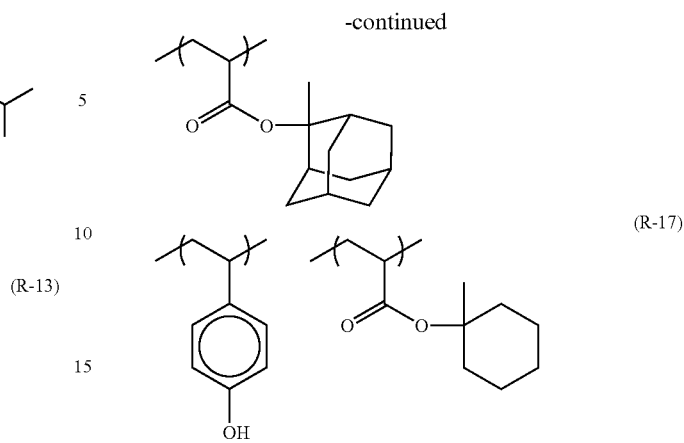

(R-17)

In the above specific examples, tBu represents a t-butyl group.

In the hydroxystyrene-based acid-decomposable resin, the content of the acid-decomposable group is expressed in B/(B+S) wherein B represents the number of the acid-decomposable groups in the resin while S represents the number of the alkali-soluble groups not protected by a group which leaves by the action of an acid. The content is preferably from 0.01 to 0.7, more preferably from 0.05 to 0.50 and more preferably from 0.05 to 0.40.

As disclosed in EP 254853, JP-A-25850, JP-A-3-223860, JP-A-4-251529, etc., the hydroxystyrene-based acid-decomposable resin can be obtained by reacting an alkali-soluble group with a precursor of a group which leaves by the action of an acid, or copolymerizing a monomer having an alkali-soluble group protected by a group which leaves by the action of an acid with various monomers.

It is preferable that the metal such as Na, K, Ca, Fe or Mg is contained in a small amount in the resin of the component (A). More specifically speaking, it is preferable that the content of each metal species in the resin is not more than 300 ppb, more preferably not more than 200 ppb and more preferably not more than 100 ppb.

The weight-average molecular weight of the resin of the component (A), calculated in terms of polystyrene by the GPC method, is preferably from 1,000 to 200,000, more preferably from 3,000 to 20,000 and particularly preferably from 5,000 to 10,000. By regulating the weight-average molecular weight to 1,000 to 200,000, worsening in heat resistance or dry etching resistance can be prevented and, at the same time, worsening in the development properties and worsening in the film-forming properties caused by an increase in the viscosity can be prevented.

Use is made of a resin the degree of dispersion (molecular weight distribution) of which ranges usually from 1 to 5, preferably from 1.2 to 3.0. A resin having a smaller molecular weight distribution can bring about the better resolution, resist shape, smoothness in the side wall of a resist pattern and roughness.

In the positive resist composition of the invention, the content of the resin according to the invention in the whole composition is preferably from 50 to 99.99% by mass based on the total solid matters, more preferably from 60 to 99.0% by mass.

In the invention, either a single resin or two or more resins may be employed as the component (A).

[2] (B) Compound being Capable of Generating Acid when Irradiated with Actinic Ray or Radiation The positive resist composition of the invention contains a compound being capable of generating an acid when irradiated with an actinic ray or a radiation (hereinafter also referred to as "acid-generating agent").

As the acid-generating agent, use can be appropriately made of a photo initiator for photo cation polymerization, a photo initiator for photo radical polymerization, a photo decoloring agent for dyes, a photo color changing agent, a publicly known compound, which generates an acid when irradiated with an actinic ray or a radiation, employed in microresists and the like and a mixture thereof.

For example, there can be enumerated a diazonium salt, a phosphonium salt, a sulfonium salt, an iodonium salt, imide sulfonate, oxime sulfonate, diazosulfone, disulfone, o-nitrobenzyl sulfonate and so on.

Furthermore, use can be made of a compound wherein a group or a compound capable of generating an acid when irradiated with an actinic ray or a radiation has been introduced into the main chain or a side chain of a polymer, for example, compounds described in U.S. Pat. No. 3,849,137, German Patent 3914407, JP-A-63-26653, JP-A-55-164824, JP-A-62-69263, JP-A-63-146038, JP-A-63-163452, JP-A-62-153853, JP-A-63-146209 and so on.

Moreover, use can be also made of a compound being capable of generating an acid by the action of light as described in, for example, U.S. Pat. No. 3,779,778, EP 126, 712 and so on.

As preferable compounds among the compounds being capable of generating an acid when irradiated with an actinic ray or a radiation, compounds represented by the following general formulae (ZI), (ZII) and (ZIII) may be cited.

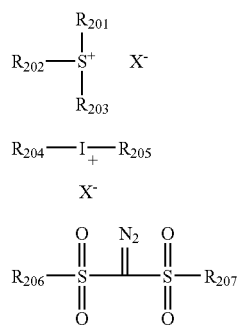

In the general formula (ZI), $R_{201}$, $R_{202}$ and $R_{203}$ independently represent each an organic group.

$X^-$ represents a non-nucleophilic anion preferably exemplified by a sulfonate anion, a carboxylate anion, a bis(alkylsulfonyl)amide anion, a tris(alkylsulfonyl)methide anion, $BF_4^-$, $PF_6^-$, $SbF_6^-$ and so on. An organic anion having a carbon atom is preferred.

As preferable examples of the organic anion, the following ones can be enumerated.

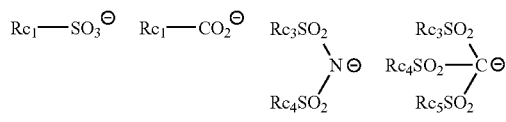

In the above general formulae, $R_{c1}$ represents an organic group.

As the organic group $R_{c1}$, one having from 1 to 30 carbon atoms may be cited. As preferable examples thereof, there can be enumerated an optionally substituted alkyl group, a cycloalkyl group, an aryl group and a group wherein a plural number of these groups are bonded via a single bond or a linking group such as —O—, —$CO_2$—, —S—, —$SO_3$—, —$SO_2N(R_{d1})$— and so on.

$R_{d1}$ represents a hydrogen atom or an alkyl group.

$R_{c3}$, $R_{c4}$ and $R_{c5}$ independently represent each an organic group.

As preferable examples of the organic groups $R_{c3}$, $R_{c4}$ and $R_{c5}$, the same ones as those cited above as preferable examples of $R_{c1}$ can be enumerated. A perfluoroalkyl group having from 1 to 4 carbon atoms is preferred.

$R_{c3}$ and $R_{c4}$ may be bonded together to form a ring.

As examples of the ring formed by $R_{c3}$ and $R_{c4}$ bonded together, there can be enumerated an alkylene group, a cycloalkylene group and an arylene group. A perfluoroalkylene group having from 1 to 4 carbon atoms is preferred.

As the organic groups $R_{c1}$ and $R_{c3}$ to $R_{c5}$, there can be enumerated an alkyl group substituted at the 1-position by a fluorine atom or a fluoroalkyl group and a phenyl group substituted by a fluorine atom or a fluoroalkyl group. Owing to the presence of a fluorine atom or a fluoroalkyl group, the acidity of the acid generated by photo irradiation is increased and thus the sensitivity is elevated. In the case where each of $R_{c1}$ and $R_{c3}$ to $R_{c5}$ has 5 or more carbon atoms, it is preferred that at least one of these carbon atoms is substituted by a hydrogen atom. Also, it is preferred that the number of hydrogen atoms is larger than the number of fluorine atoms. Owing to the absence of a long-chain perfluoroalkyl group, toxicity to the environment can be lessened. It is preferable that $R_{c3}$ and $R_{c4}$ are bonded together to form a ring, since the acidity of the acid generated by photo irradiation is increased and thus the sensitivity is elevated thereby.

In the general formula (Z1), each of the organic acids represented by $R_{201}$, $R_{202}$ and $R_{203}$ generally has from 1 to 30, preferably from 1 to 20, carbon atoms.

Two of $R_{201}$, $R_{202}$ and $R_{203}$ may be bonded together to form a cyclic structure which may contain an oxygen atom, a sulfur atom, an ester bond, an amide bond or a carbonyl group.

As examples of the group formed by two of $R_{201}$, $R_{202}$ and $R_{203}$ bonded together, an alkylene group (for example, a butylene group or a pentylene group) may be cited.

As specific examples of the organic groups represented by $R_{201}$, $R_{202}$ and $R_{203}$, there can be enumerated the corresponding groups in the compounds (ZI-1), (ZI-2) and (ZI-3) as will be described hereinafter.

Also, use may be made of a compound having a plural number of the structures represented by the general formula (ZI). For example, a compound having a structure wherein at least one of $R_{201}$, $R_{202}$ and $R_{203}$ in the compound represented by the general formula (ZI) is bonded to at least one of $R_{201}$, $R_{202}$ and $R_{203}$ in another compound represented by the general formula (ZI) may be employed.

As preferable examples of the component (ZI), there can be enumerated the compounds (ZI-1), (ZI-2) and (ZI-3) as will be described hereinafter.

The compound (ZI-1) is an arylsulfonium compound wherein at least one of $R_{201}$, $R_{202}$ and $R_{203}$ is an aryl group, i.e., a compound having arylsulfonium as a cation.

In the arylsulfonium compound, all of $R_{201}$, $R_{202}$ and $R_{203}$ may be aryl groups. Alternatively, a part of $R_{201}$, $R_{202}$ and $R_{203}$ may be aryl group(s) while the remainder(s) are an alkyl or cycloalkyl group.

As examples of the arylsulfonium compound, there can be enumerated a triarylsulfonium compound, a diarylalkylsulfonium compound, an aryldialkylsulfonium compound, a diarylcycloalkylsulfonium compound, an aryldicycloalkylsulfonium compound and so on.

As the aryl group in the arylsulfonium compound, an aryl group such as a phenyl group or a naphthyl group and a heteroaryl group such as an indole residue or a pyrrole residue are preferable. A phenyl group or an indole residue is still preferred. In the case where the arylsulfonium compound has two or more aryl groups, these aryl groups may be either the same or different.

As the alkyl group carried, if necessary, by the arylsulfonium compound, a linear or branched alkyl group having from 1 to 15 carbon atoms is preferred. As examples thereof, there can be enumerated a methyl group, an ethyl group, a propyl group, an n-butyl group, a sec-butyl group, a t-butyl group and so on.

As the cycloalkyl group carried, if necessary, by the arylsulfonium compound, a cycloalkyl group having from 3 to 15 carbon atoms is preferred. As examples thereof, there can be enumerated a cyclopropyl group, a cyclobutyl group, a cyclohexyl group and so on.

The aryl, alkyl and cycloalkyl groups represented by $R_{201}$, $R_{202}$ and $R_{203}$ may have a substituent such as an alkyl group (for example, one having from 1 to 15 carbon atoms), a cycloalkyl group (for example, one having from 3 to 15 carbon atoms), an aryl group (for example, one having from 6 to 14 carbon atoms), an alkoxy group (for example, one having from 1 to 15 carbon atoms), a halogen atom, a hydroxyl group or a phenylthio group. Preferable examples of the substituent include a linear or branched alkyl group having from 1 to 12 carbon atoms, a cycloalkyl group having from 3 to 12 carbon atoms and a linear, branched or cyclic alkoxy group having from 1 to 12 carbon atoms. An alkyl group having from 1 to 4 carbon atoms or an alkoxy group having from 1 to 4 carbon atoms is still preferred. Such a substituent may be attached to either one of $R_{201}$, $R_{202}$ and $R_{203}$ or all of them. In the case where $R_{201}$, $R_{202}$ and $R_{203}$ are aryl groups, it is preferable that a substituent is attached to the p-position of an aryl group.

Next, the compound (ZI-2) will be illustrated.

The compound (ZI-2) is a compound wherein $R_{201}$, $R_{202}$ and $R_{203}$ in the formula (ZI) independently represent each an organic group having no aromatic ring. The term "aromatic ring" as used herein involves an aromatic ring having a hetero atom.

The organic groups having no aromatic ring represented by $R_{201}$, $R_{202}$ and $R_{203}$ generally have from 1 to 30 carbon atoms, preferably from 1 to 20 carbon atoms.

$R_{201}$, $R_{202}$ and $R_{203}$ independently represent each preferably an alkyl group, a cycloalkyl group, an allyl group or a vinyl group, more preferably a linear, branched or cyclic 2-oxoalkyl group or an alkoxycarbonylmethyl group, and more preferably a linear or branched 2-oxoalkyl group.

The alkyl groups represented by $R_{201}$, $R_{202}$ and $R_{203}$ may be either linear or branched. As preferable examples thereof, there can be enumerated linear or branched alkyl groups having from 1 to 10 carbon atoms (for example, methyl, ethyl, propyl, butyl and pentyl groups). As the alkyl groups $R_{201}$, $R_{202}$ and $R_{203}$, a linear or branched 2-oxoalkyl group or an alkoxycabronylmethyl group is more preferable.

As preferable examples of the cycloalkyl groups represented by $R_{201}$, $R_{202}$ and $R_{203}$, there can be enumerated cycloalkyl groups having from 3 to 10 carbon atoms (cyclopentyl, cyclohexyl and norbonyl groups). As the cycloalkyl groups $R_{201}$, $R_{202}$ and $R_{203}$, a cyclic 2-oxoalkyl group is more preferable.

As preferable examples of the linear, branched or cyclic 2-oxoalkyl group as $R_{201}$, $R_{202}$ and $R_{203}$, there can be enumerated the alkyl and cycloalkyl groups as described above having $>C=O$ attached to the 2-position thereof.

As preferable examples of the alkoxy group in the alkoxycarbonylmethyl group as $R_{201}$, $R_{202}$ and $R_{203}$, there can be enumerated an alkoxy group having from 1 to 5 carbon atoms (methoxy, ethoxy, propoxy, butoxy and pentoxy groups).

$R_{201}$, $R_{202}$ and $R_{203}$ may be further substituted by a halogen atom, an alkoxy group (for example, one having from 1 to 5 carbon atoms), a hydroxyl group, a cyano group or a nitro group.

The compound (ZI-3) is a compound represented by the following general formula (ZI-3), i.e., a compound having a phenacylsuflonium salt structure.

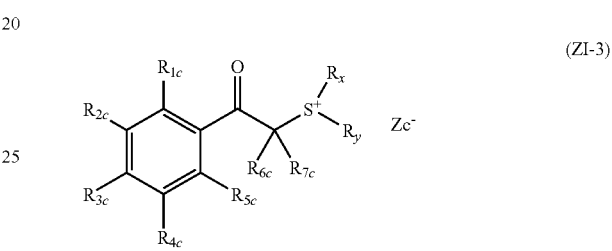

In the general formula (ZI-3), $R_{1c}$ to $R_{5c}$ independently represent each a hydrogen atom, an alkyl group, a cycloalkyl group, an alkoxy group or a halogen atom.

$R_{6c}$ and $R_{7c}$ independently represent each a hydrogen atom, an alkyl group or a cycloalkyl group.

$R_x$ and $R_y$ independently represent each an alkyl group, a cycloalkyl group, an allyl group or a vinyl group.

Any two or more of $R_{1c}$ to $R_{5c}$, $R_{6c}$ and $R_{7c}$ and $R_x$ and $R_y$ may be bonded together to thereby respectively form cyclic structures. Such a cyclic structure may contain an oxygen atom, a sulfur atom, an ester bond or an amide bond. As examples of the rings formed by any two or more of $R_{1c}$ to $R_{5c}$, $R_{6c}$ and $R_{7c}$ and $R_x$ and $R_y$ bonded together, there can be enumerated a butylene group, a pentylene group and so on.

$Z_c^-$ represents a non-nucleophilic anion that is the same as the non-nucleophilic anion $X^-$ in the general formula (ZI).

The alkyl groups represented by $R_{1c}$ to $R_{7c}$ may be either linear or branched. As preferable examples thereof, there can be enumerated linear or branched alkyl groups having from 1 to 20 carbon atoms (for example, methyl, ethyl, linear or branched propyl, linear or branched butyl and linear or branched pentyl groups).

As preferable examples of the cycloalkyl groups represented by $R_{1c}$ to $R_{7c}$, there can be enumerated cycloalkyl groups having from 3 to 8 carbon atoms (for example, cyclopentyl and cyclohexyl groups).

The alkoxy groups represented by $R_{1c}$ to $R_{5c}$ may be linear, branched or cyclic. For example, there can be enumerated an alkoxy group having from 1 to 10 carbon atoms, preferably a linear or branched alkoxy group having from 1 to 5 carbon atoms (for example, methoxy, ethoxy, linear or branched propoxy, linear or branched butoxy and linear or branched pentoxy groups) and a cyclic alkoxy group having from 3 to 8 carbon atoms (for example, cyclopentyloxy and cyclohexyloxy groups).

It is preferable that any one of $R_{1c}$ to $R_{5c}$ is a linear or branched alkyl group, a cycloalkyl group or a linear, branched or cyclic alkoxy group. It is more preferable that the sum of the carbon atoms in $R_{1c}$ to $R_{5c}$ amounts to 2 to 15. Thus, the solubility in a solvent can be elevated and the occurrence of particles can be prevented during preservation.

As the alkyl groups as $R_x$ and $R_y$, there can be enumerated those which are the same as the alkyl groups cited above as $R_{1c}$ to $R_{7c}$. As the alkyl groups $R_x$ and $R_y$, a linear or branched 2-oxoalkyl group or an alkoxycarbonyl methyl group is more preferred.

As the cycloalkyl groups as $R_x$ and $R_y$, there can be enumerated those which are the same as the cycloalkyl groups cited above as $R_{1c}$ to $R_{7c}$. As the cycloalkyl groups $R_x$ and $R_y$, a cyclic 2-oxoalkyl group is more preferred.

As preferable examples of the linear, branched or cyclic 2-oxoalkyl group, there can be enumerated the alkyl and cycloalkyl groups as described above as $R_{1c}$ to $R_{7c}$ having $>C=O$ attached to the 2-position thereof.

As preferable examples of the alkoxy group in the alkoxycarbonylmethyl group, there can be enumerated those which are the same as the alkoxy groups cited above as $R_{1c}$ to $R_{5c}$.

It is preferable that $R_x$ and $R_y$ are alkyl groups having 4 or more carbon atoms, more preferably an alkyl group having 6 or more carbon atoms and more preferably an alkyl group having 8 or more carbon atoms.

In the above general formulae (ZII) and (ZIII), $R_{204}$ to $R_{207}$ independently represent each an aryl group, an alkyl group or a cycloalkyl group.

As preferable examples of the aryl groups represented by $R_{204}$ to $R_{207}$, there can be enumerated an aryl group such as a phenyl group or a naphthyl group and a heteroaryl group such as an indole residue or a pyrrole residue are preferable. A phenyl group or an indole residue is still preferred.

The alkyl groups represented by $R_{204}$ to $R_{207}$ may be either liner or branched. Preferable examples thereof include a linear or branched alkyl group having from 1 to 10 carbon atoms (for example, methyl, ethyl, propyl, butyl and pentyl groups).

As preferable examples of the cycloalkyl groups represented by $R_{204}$ to $R_{207}$, there can be enumerated a cycloalkyl group having from 3 to 10 carbon atoms (cyclopentyl, cyclohexyl and norbornyl groups).

Examples of a substituent which may be carried by $R_{204}$ to $R_{207}$ include an alkyl group (for example, one having from 1 to 15 carbon atoms), a cycloalkyl group (for example, one having from 3 to 15 carbon atoms), an aryl group (for example, one having from 6 to 15 carbon atoms), an alkoxy group (for example, one having from 1 to 15 carbon atoms), a halogen atom, a hydroxyl group and a phenylthio group.

$X^-$ represents a non-nucleophilic anion that is the same as the non-nucleophilic anion $X^-$ in the general formula (ZI).

As preferable examples of the compound being capable of generating an acid when irradiated with an actinic ray or a radiation, there can be further enumerated compounds represented by the following general formulae (ZIV), (ZV) and (ZVI).

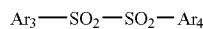

ZIV

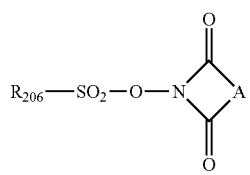

ZV

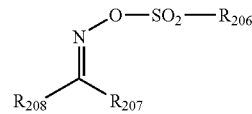

ZVI

In the general formulae (ZIV) to (ZVI), $Ar_3$ and $Ar_4$ independently represent each an aryl group.

$R_{206}$ represents an alkyl group, a cycloalkyl group or an aryl group.

$R_{207}$ and $R_{298}$ independently represent each an alkyl group, a cycloalkyl group, an aryl group or an electron-withdrawing group. An aryl group is preferred as $R_{207}$. An electron-withdrawing group is preferred as $R_{208}$ and a cyano group or a fluoroalkyl group is still preferred.

A represents an alkylene group, an alkenylene group or an arylene group.

As still preferable examples of the compound being capable of generating an acid when irradiated with an actinic ray or a radiation, there can be enumerated compounds represented by the general formula (ZI) to (ZIII).

As a particularly preferable example of the compound being capable of generating an acid when irradiated with an actinic ray or a radiation, a compound having a triphenylsulfonium cation structure can be cited.

As the acid-generating agent, use may be made of a carboxylic acid salt. In this case, it is preferred to use it a mixture with a fluorosulfonic acid salt and/or a sulfonic acid salt.

The acid generating-agent may have a plural number of atoms having a noncovalent electron pair such as a nitrogen atom at the anion site thereof. In this case, it is preferred to use it a mixture with a fluorosulfonic acid salt and/or a sulfonic acid salt.

Next, preferable examples of the compound being capable of generating an acid when irradiated with an actinic ray or a radiation will be presented.

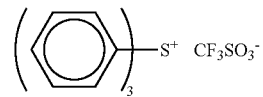

(z1)

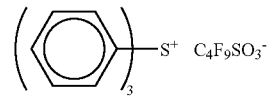

(z2)

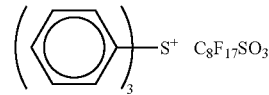

(z3)

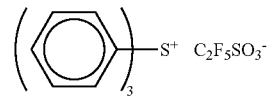

(z4)

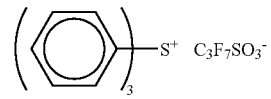

(z5)

-continued
(z6) 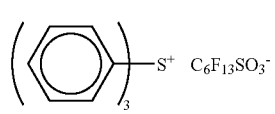
(z7) 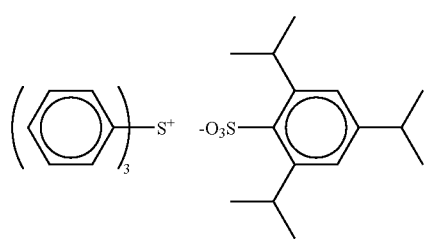
(z8) 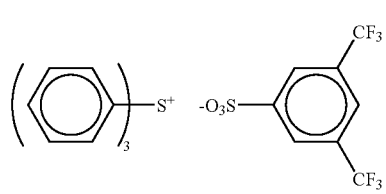
(z9) 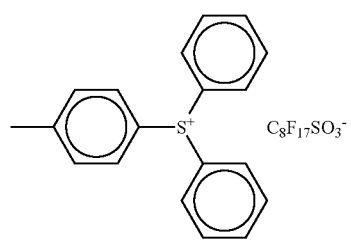
(z10) 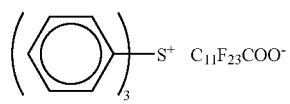
(z11) 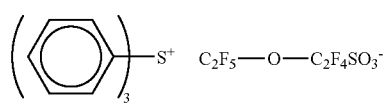
(z12) 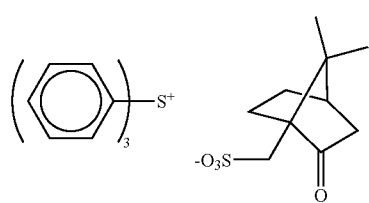
(z13) 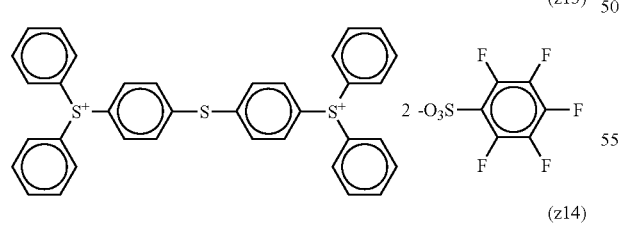
(z14) 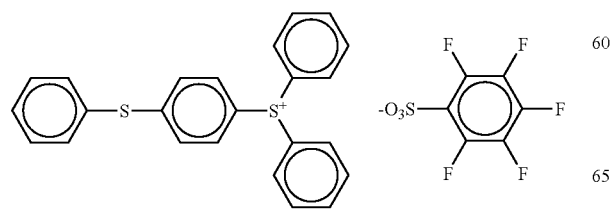
-continued
(z15) 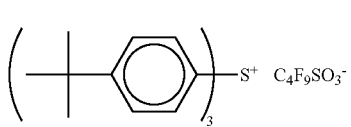
(z16) 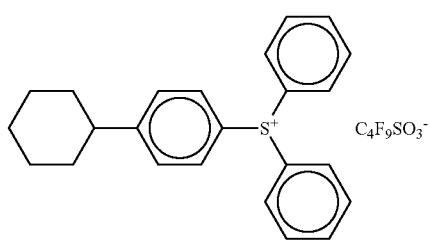
(z17) 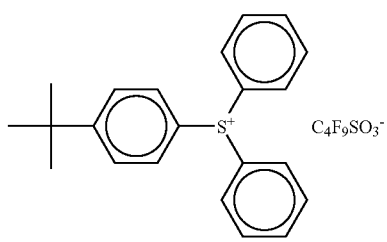
(z18) 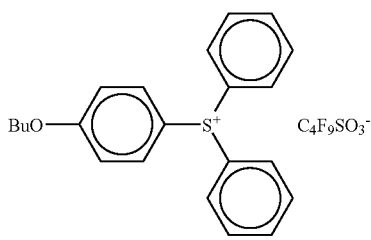
(z19) 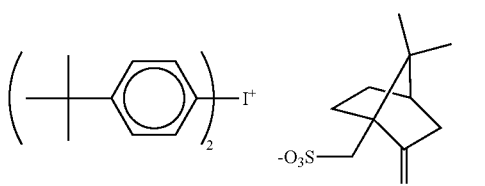
(z20) 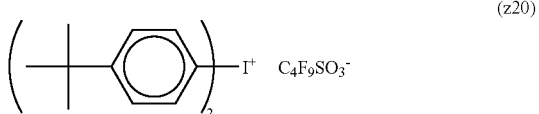
(z21) 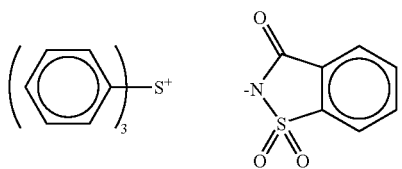
(z22) 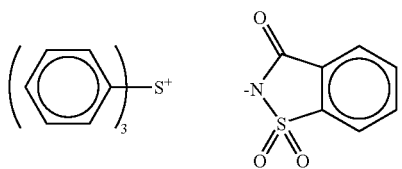

-continued
(z23) 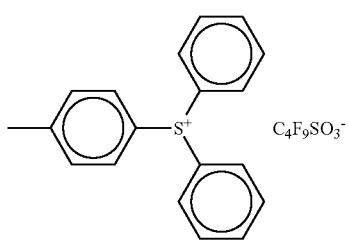
(z24) 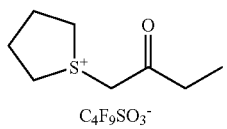
(z25) 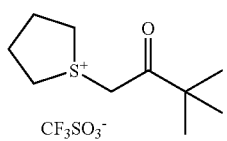
(z26) 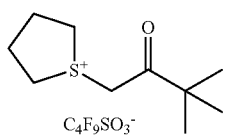
(z27) 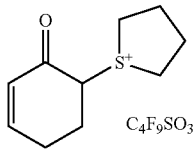
(z28) 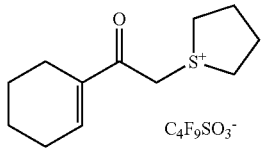
(z29) 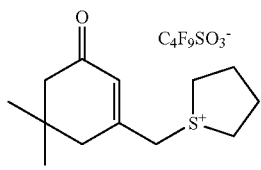
(z30) 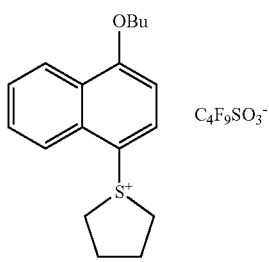
(z31) 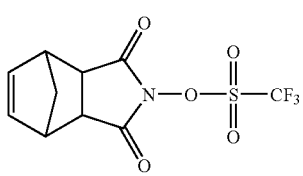
(z32) 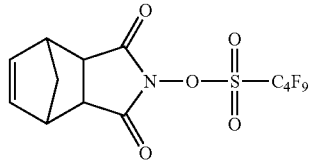
(z33) 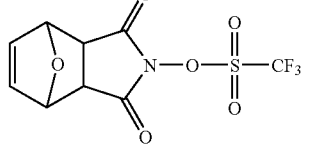
(z34) 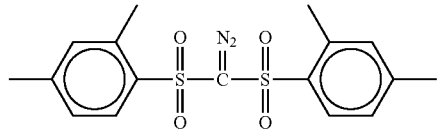
(z35) 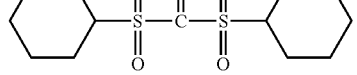
(z36) 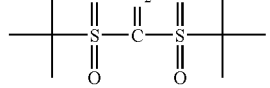
(z37) 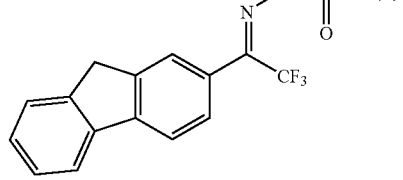
(z38) 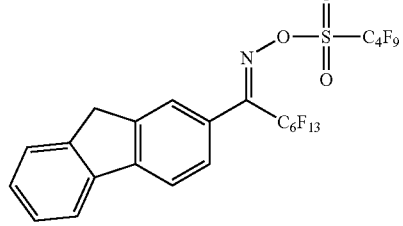
(z39) 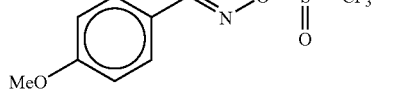
(z40) 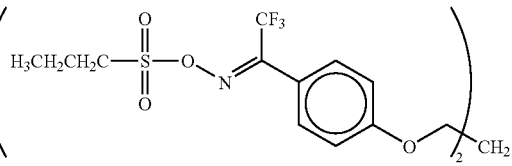

-continued
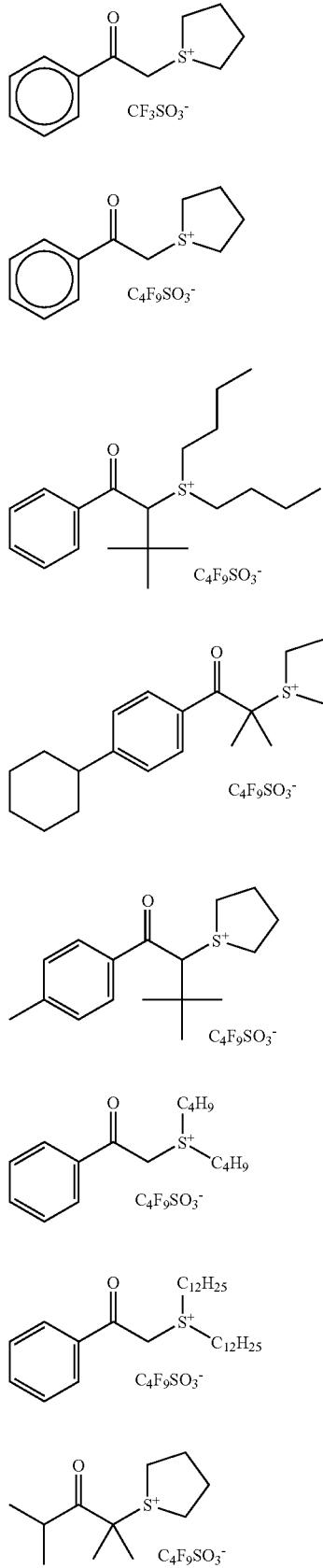
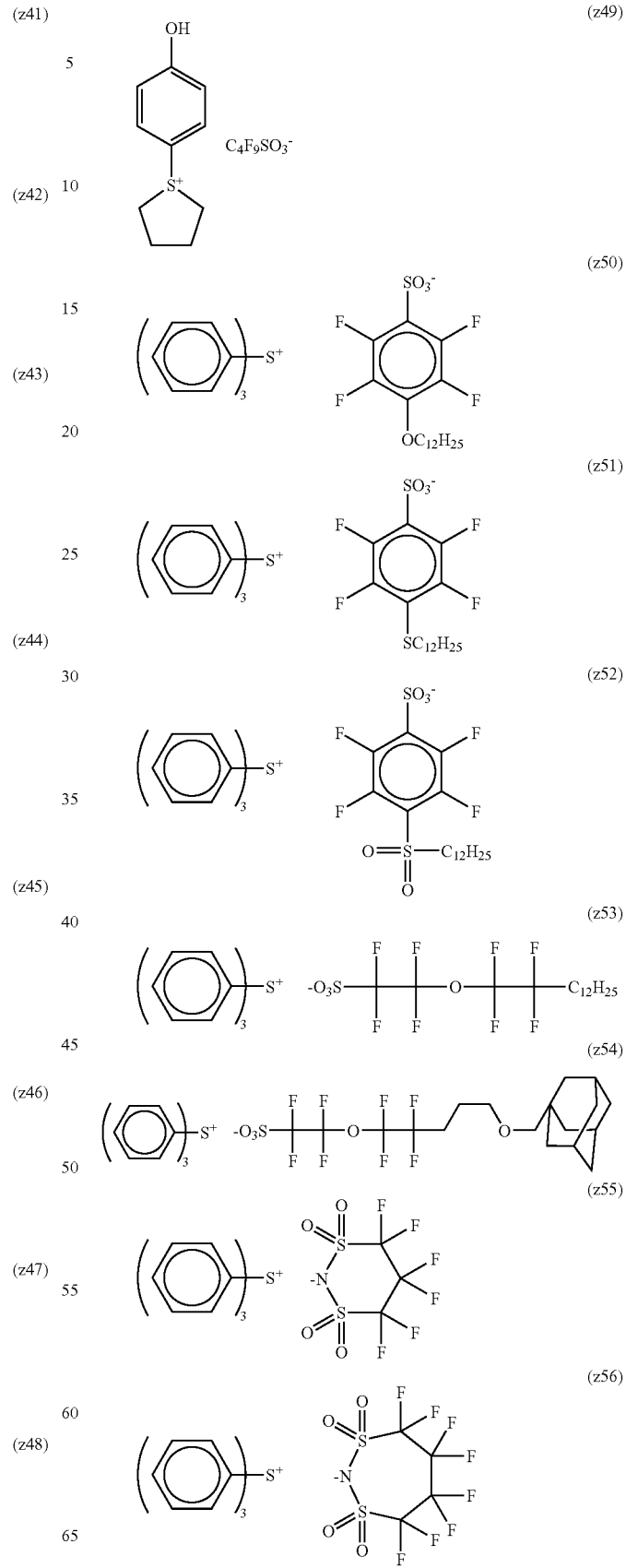

(z57) 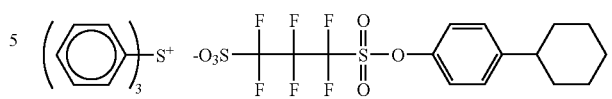
(z58) 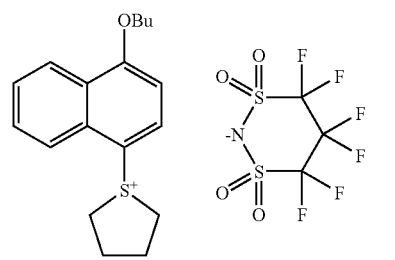
(z65) 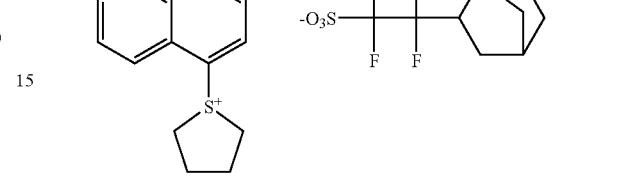
(z66) 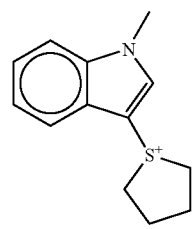
(z59) 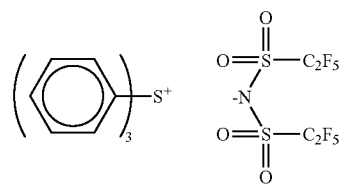
(z67) 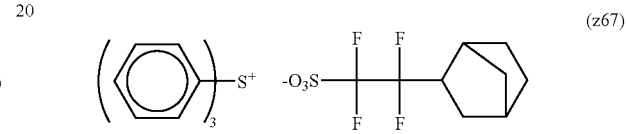
(z60) 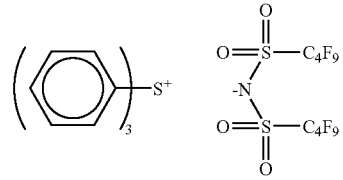
(z68) 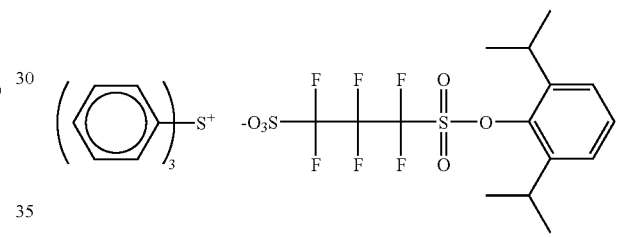
(z61) 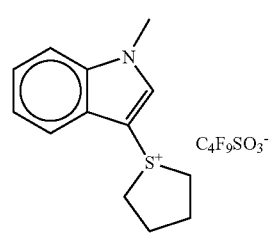
(z69) 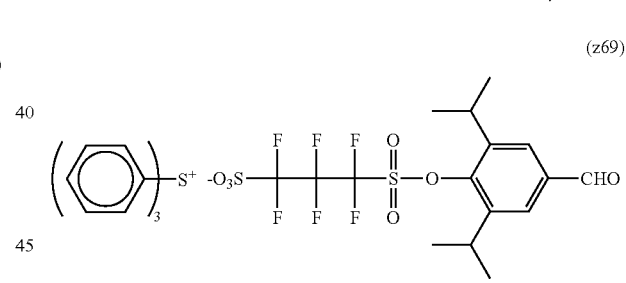
(z62) 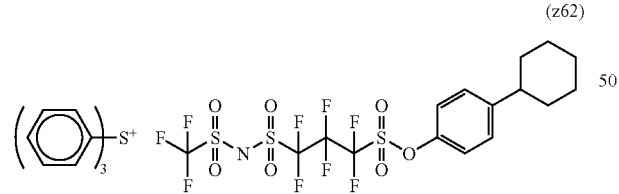
(z70) 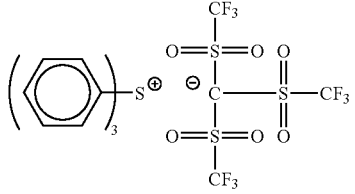
(z63) 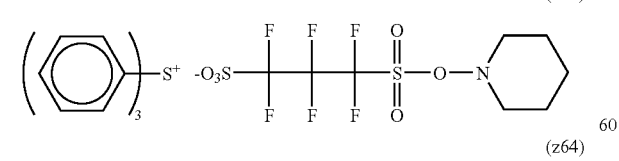
(z71) 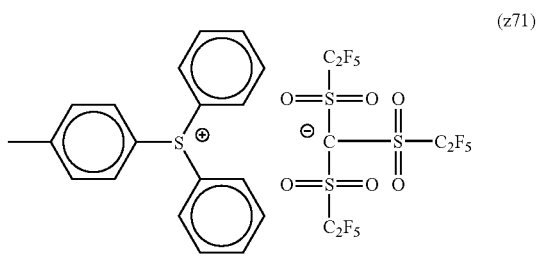
(z64) 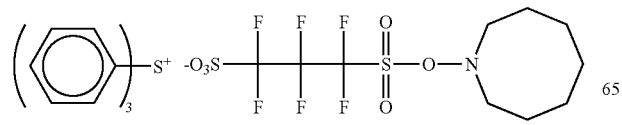

-continued

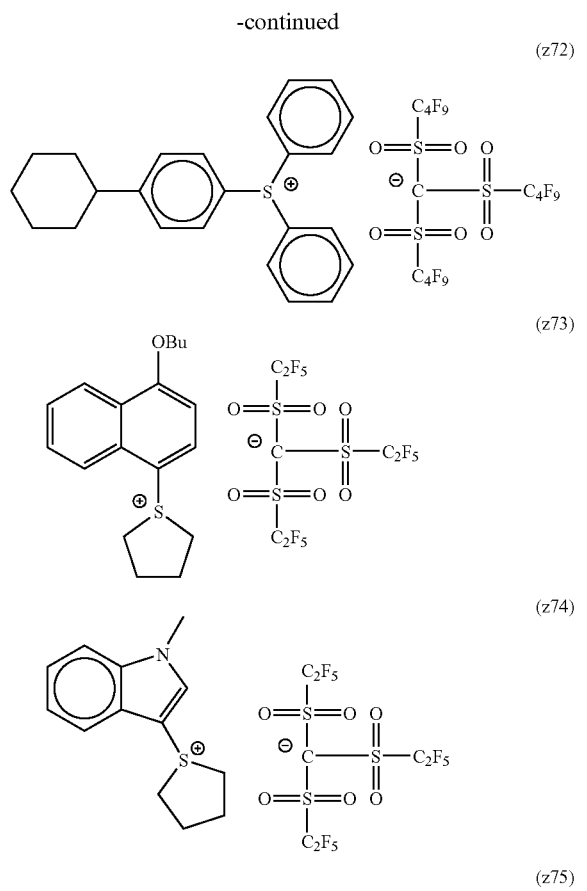

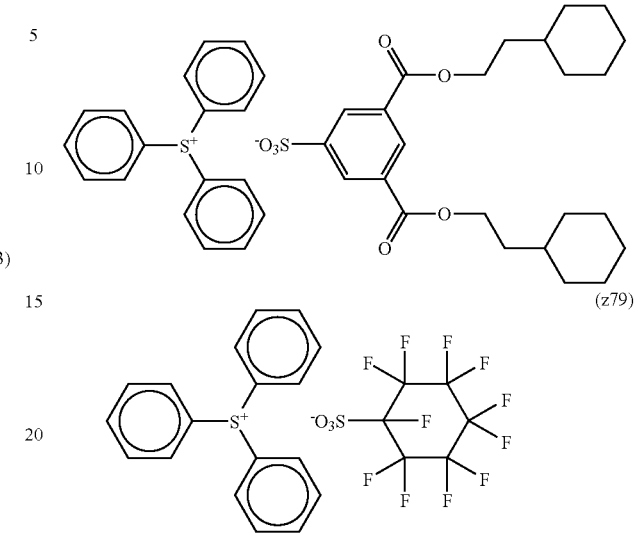

Either a single acid-generating agent or a combination of two or more thereof may be used. In the case of using a combination of two or more thereof, it is preferable to combine compounds capable of generating two organic acids each having two or more atoms excluding hydrogen atoms.

The content of the acid-generating agent is preferably from 0.1 to 20% by mass, more preferably from 0.5 to 10% by mass and more preferably from 1 to 8% by mass based on the total solid matters in the positive resist composition.

[3] Resin Having Silicon-containing Repeating Unit Represented by the General Formula (I) and/or Silicon-containing Repeating Unit Represented by the General Formula (II) and being Stable to Acids but Insoluble in Alkali Developer (Hereinafter Sometimes Referred to as "Component (C)")

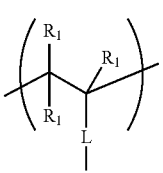

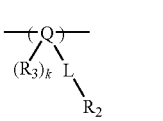

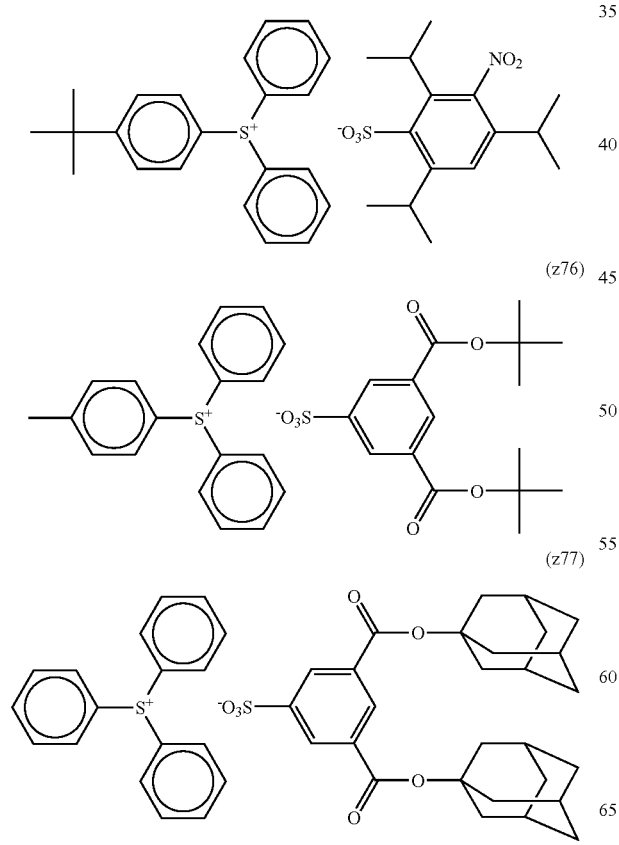

In the general formulae (I) and (II), L represents a single bond or a divalent linking group.

R$_1$'s independently represent each a hydrogen atom, a halogen atom, an alkyl group, a cycloalkyl group, an alkoxy group or an alkoxycarbonyl group.

R$_2$ represents a monovalent organic group having at least one silicon atom.

R$_3$ represents a hydrogen atom, a halogen atom, a cyano group or a monovalent organic group.

Q represents an alicyclic structure.

k represents an integer of from 0 to 3.

The expression "insoluble in an alkali developer" as used with respect to the resin of the component (C) means that the resin of the component (C) has neither an alkali-soluble group nor a group generating an alkali-soluble group by the action of an acid or an alkali developer. It is preferable that the dissolution speed of the resin of the component (C) in an alkali developer (a 2.38% by weight aqueous tetramethylammonium hydroxide solution) at 23° C. is not higher than 0.1 nm/s.

As examples of the alkali-soluble group, there can be enumerated a phenolic hydroxyl group, a carboxylate group, a fluoro alcohol group, a sulfonate group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylsulfonyl)methylene group, a tris(alkylcarbonyl)methylene group and so on.

It is preferable that the alkyl group R$_1$ in the general formula (I) is a linear or branched alkyl group having from 1 to 5 carbon atoms and there can be enumerated, as examples thereof, a methyl group, an ethyl group, an n-propyl group, an isopropyl group, an n-butyl group, an isobutyl group, a sec-butyl group, a pentyl group, an isopentyl group, a neopentyl group, a t-pentyl group and so on.

It is preferable that the cycloalkyl group R$_1$ is a cycloalkyl group having from 3 to 5 carbon atoms and there can be enumerated, as examples thereof, a cyclopropyl group, a cyclobutyl group, a cyclopentyl group and so on.

It is preferable that the alkoxy group R$_1$ is an alkoxy group having from 1 to 5 carbon atoms and there can be enumerated, as examples thereof, a methoxy group, an ethoxy group, an n-propoxy group, an isopropoxy group and so on.

It is preferable that the alkoxycarbonyl group R$_1$ is an alkoxycarbonyl group having from 1 to 30 carbon atoms and there can be enumerated, as examples thereof, a methoxycarbonyl group, an ethoxycarbonyl group, a butoxycarbonyl group, an octyloxycarbonyl group, a dodecyloxycarbonyl group, a cyclohexyloxycarbonyl group and so on.

These alkyl, cycloalkyl, alkoxy and alkoxycarbonyl groups may have a substituent. Examples of the substituent which may be carried by the alkyl, cycloalkyl, alkoxy and alkoxycarbonyl groups include a halogen atom, a hydroxyl group and so on. Also, R$_1$ may have a silicon atom in its substituent.

It is preferable that R$_1$ is a hydrogen atom, a methyl group or a trifluoromethyl group.

As examples of the divalent linking group represented by L, there can be enumerated an alkylene, a cycloalkylene group, an arylene group, an ester group, a sulfonic ester group, an ether group, a ketone group, a sulfonyl group, each employed alone, and a divalent linking group formed by combining two or more thereof.

It is preferable that L is a single bond or an ester group (—C(=O)—O—).

It is preferable that the monovalent organic group having at least one silicon atom represented by R$_2$ is a linear or branched alkyl group having at least one silicon atom and from 1 to 30 carbon atoms or a cycloalkyl group having at least one silicon atom and from 3 to 30 carbon atoms.

As examples of the linear or branched alkyl group having from 1 to 30 carbon atoms in R$_2$, there can be enumerated a methyl group, an ethyl group, an n-propyl group, an isopropyl group, an n-butyl group, an isobutyl group, a sec-butyl group, a pentyl group, an isopentyl group, a neopentyl group, a t-pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group and so on.

As examples of the cycloalkyl group having from 3 to 30 carbon atoms in R$_2$, there can be enumerated a cyclopropyl group, a cyclopentyl group, a cyclohexyl group, a cycloheptyl group, a cyclooctyl group, a cyclononyl group, a cyclodecanoyl group, an adamantyl group, a norbornyl group, a bornyl group and so on.

The alkyl and cycloalkyl groups in R$_2$ may be further substituted by a halogen atom (preferably a fluorine atom) or the like. It may contain a divalent linking group in the chain and the position of the silicon atom is not particularly restricted.

It is preferable that the monovalent organic group having at least one silicon atom represented by R$_2$ has a cyclic siloxane structure.

It is preferable that the monovalent organic group having at least one silicon atom represented by R$_2$ is represented by the following general formula (VI).

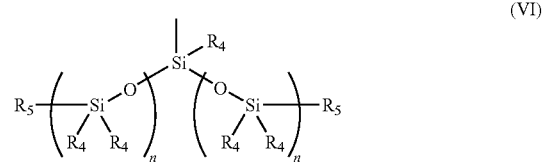

(VI)

In the general formula (VI), R$_4$'s independently represent each a hydrogen atom, an alkyl group or an alkoxy group.

R$_5$'s independently represent each a hydrogen atom, an alkyl group or an alkoxy group, provided that two of R$_5$'s may be bonded together to form a cyclic structure.

n's independently represent each an integer of from 0 to 5.

It is preferable that the monovalent organic group having at least one silicon atom represented by R$_2$ has from 1 to 3 Si atoms.

It is preferable that the monovalent organic group having at least one silicon atom represented by R$_2$ is represented by the following general formula (S1).

(S1)

In the general formula (S1), m represents an integer of from 0 to 20.

As examples of the alicyclic structure Q, the following ones will be presented, though the invention is not restricted thereto. p represents an integer of from 0 to 3.

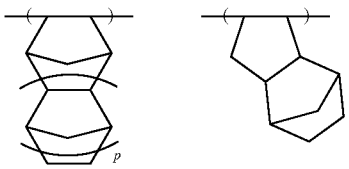

As specific examples of the organic group represented by $R_3$, there can be enumerated a linear or branched alkyl group, a cycloalkyl group, an alkoxy group and so on. The organic group $R_3$ may be substituted by a fluorine atom or the like.

It is preferable that the general formula (I) is represented by the following general formula (III).

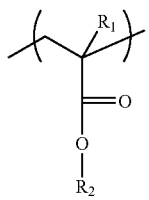

(III)

In the general formula (III), $R_1$ represents a hydrogen atom, a halogen atom, an alkyl group, a cycloalkyl group, an alkoxy group or an alkoxycarbonyl group;

$R_2$ represents a monovalent organic group having at least one silicon atom.

It is preferable that the general formula (I) is represented by the following general formula (IV).

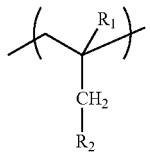

(IV)

In the general formula (IV), $R_1$, represents a hydrogen atom, a halogen atom, an alkyl group, a cycloalkyl group, an alkoxy group or an alkoxycarbonyl group;

$R_2$ represents a monovalent organic group having at least one silicon atom.

It is preferable that the general formula (I) is represented by the following general formula (V).

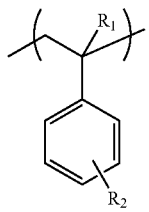

(V)

In the general formula (V), $R_1$ represents a hydrogen atom, a halogen atom, an alkyl group, a cycloalkyl group, an alkoxy group or an alkoxycarbonyl group;

$R_2$ represents a monovalent organic group having at least one silicon atom.

It is preferable that the silicon atom content in the resin of the component (C) is from 2 to 50% by mass, more preferably from 2 to 30% by mass, based on the weight-average molecular weight of the resin of the component (C).

The resin of the component (C) may be either a homopolymer comprising one of the silicon-containing repeating unit represented by the general formula (I) and the silicon-containing repeating unit represented by the general formula (II), a copolymer comprising the silicon-containing repeating unit represented by the general formula (I) and/or the silicon-containing repeating unit represented by the general formula (II), or a copolymer comprising the silicon-containing repeating unit represented by the general formula (I) and/or the silicon-containing repeating unit represented by the general formula (II) together with another repeating unit.

It is preferable that the content of the silicon-containing repeating unit represented by the general formula (I) and/or the silicon-containing repeating unit represented by the general formula (II) in the resin of the component (C) is from 10 to 100% by mass, more preferably from 20 to 100% by mass, based on the resin.

As examples of the polymerizable component constituting the additional repeating unit other than the silicon-containing repeating unit represented by the general formula (I) and the silicon-containing repeating unit represented by the general formula (II) in the resin of the component (C), there can be enumerated acrylic esters, methacrylic esters, acrylamides, methyacrylamides, allyl compounds, vinyl ethers, norbornenes, styrenes and so on, though the invention is not restricted thereto.

The weight-average molecular weight of the resin of the component (C) is preferably from 1,000 to 100,000, more preferably from 1,000 to 50,000.

From the viewpoints of resolution, resist shape, resist pattern side wall, roughness and so on, it is preferable that the resin of the component (C) has a molecular weight distribution (Mw/Mn, also called degree of dispersion) of from 1 to 5, more preferably from 1 to 3.

Based on the total solid matters in the positive resist composition, the content of the resin of the component (C) is preferably from 0.1 to 5% by mass, more preferably from 0.2 to 4% by mass, more preferably from 0.3 to 3% by mass and particularly preferably from 0.3 to 1% by mass. Within this range, the sweepback contact angle of the resist film is preferably from 50° to 90°, more preferably from 60° to 80°.

As the resin of the component (C), either a single resin or two or more resins may be used.

It is preferable that the metal such as Na, K, Ca, Fe or Mg is contained in a small amount in the resin of the component (C). More specifically speaking, it is preferable that the content of each metal species in the resin is not more than 300 ppb, more preferably not more than 200 ppb and more preferably not more than 100 ppb.

It is preferable that the sweepback contact angle of a film formed from the resin of the component (C) alone or a solution of the same is from 70 to 100°. So long as a film can be formed, the coating method is not particularly restricted and use can be made of, for example, the spin casting method.

It is preferable that the resin of the component (C) contains not more than 10% by mass, more preferably not more than 5% by mass, of the monomers remaining therein.

It is particularly preferable that the resin of the component (C) contains the residual monomers and oligomer components at a definite level or less (for example, 0.1 by mass or less in HPLC). Thus, not only the sensitivity, resolution, process stability, pattern shape, etc. as a resist can be further improved but also the obtained resist is free from contaminants in the liquid or changes during preservation.

As the resin of the component (C), use can be made of a commercially available product or it can be synthesized by a commonly employed method. For example, it can be obtained by, for example, such radical polymerization as employed in synthesizing the resin of the component (A) followed by a purification procedure commonly employed.

As examples of the synthesis method commonly employed, there can be enumerated a bulk polymerization method which comprises dissolving monomer species and an initiator in a solvent and heating to thereby conduct polymerization, a drop polymerization method which comprises dropping a solution of monomer species and an initiator to a heated solvent over 1 to 10 hours, and so on. Examples of the reaction solvent include tetrahydrofuran, 1,4-dioxane, ethers such as diisopropyl ether, ketones such as methyl ethyl ketone and methyl isobutyl ketone, ester solvents such as ethyl acetate, amide solvents such as dimethylformamide and dimethylacetamide, and solvents in which the resist composition is soluble, for example, propylene glycol monomethyl ether acetate, propylene glycol monomethyl ether and cyclohexanone.

It is preferred to conduct the polymerization under an inert gas atmosphere such as nitrogen or argon. As the polymerization initiator, a commercially available radical initiator (an azo type initiator, a peroxide, etc.) is used to initiate the polymerization. As the radical initiator, an azo type initiator is preferable. An azo type initiator having an ester group, a cyano group or a carboxyl group is preferred. As preferable examples of the initiator, there can be enumerated azobisisobutyronitrile, azobisdimethylvaleronitrile, dimethyl 2,2'-azobis(2-methylpropionate) and so on. It is also possible to use a chain transfer such as a thiol compound agent together with the polymerization initiator. If desired, the initiator may be additionally employed or added in portions. Namely, the initiator may be added to the solvent after the completion of the reaction and thus the desired polymer is collected as a powder or a solid. The reaction concentration is from 5 to 50% by mass, preferably from 20 to 50% by mass. The reaction temperature is usually from 10° C. to 150° C., preferably from 30° C. to 120° C. and more preferably from 60° C. to 100° C.

After the completion of the reaction, the reaction solution is cooled to room temperature by allowing to stand and then purified. For the purification, use can be made of a commonly employed method, for example, water washing, the liquid-liquid extraction method which comprises combining appropriate solvents and thus removing the residual monomers and oligomer components, the purification method in the solution state which comprises conducting ultrafiltration to thereby extract and remove components having a specific molecular weight or less, the reprecipitation method which comprises dropping the resin solution into a poor solvent, thus solidifying the resin in the poor solvent and separating the residual monomers and the like, and the purification method in the solid state which comprises filtering the resin slurry and washing with a poor solvent. For example, the reaction solution is brought into contact with a solvent (a poor solvent), in which the above resin is hardly or not soluble, in an amount of not more than 10 times by volume, preferably from 5 to 10 times by volume, as much as the reaction solution so that the resin is precipitated as a solid.

Next, specific examples of the silicon-containing repeating unit represented by the general formula (I) and the silicon-containing repeating unit represented by the general formula (II) will be presented, though the invention is not restricted thereto.

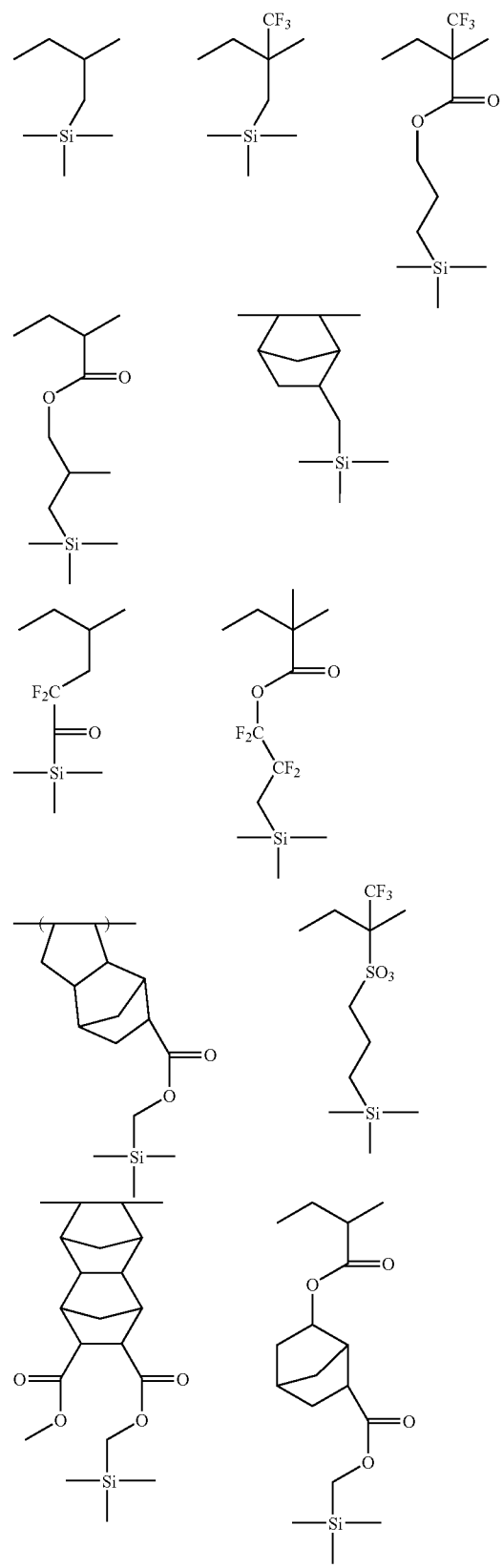

-continued
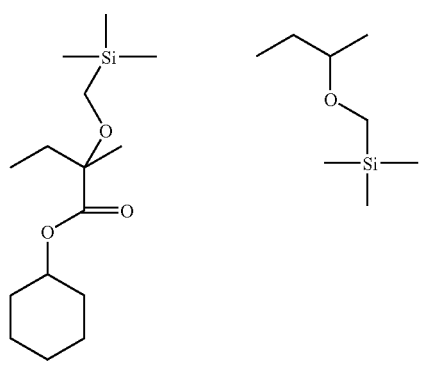
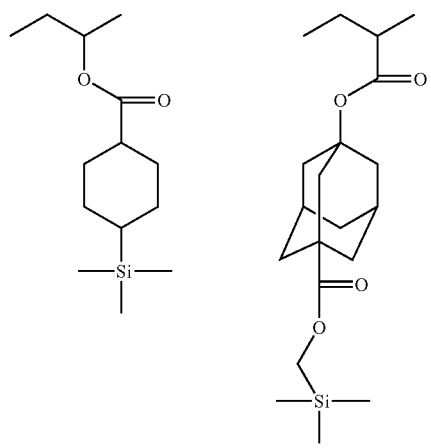
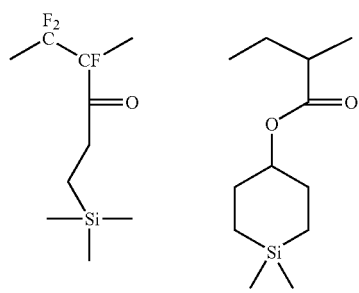
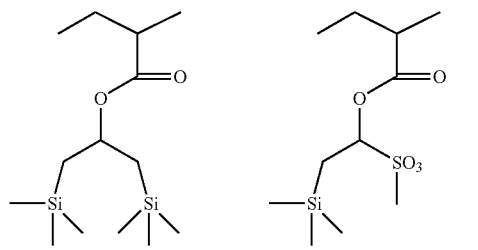
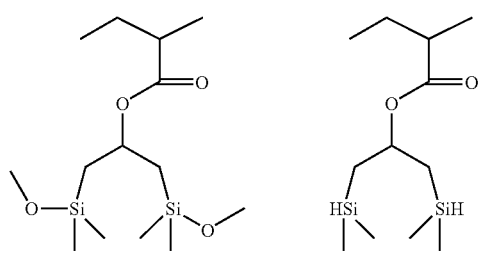
-continued
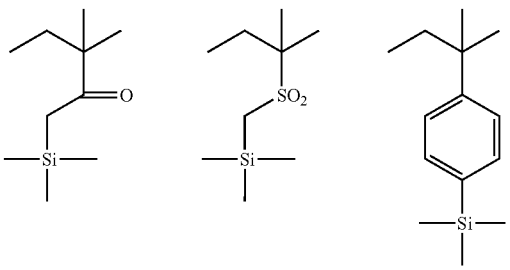
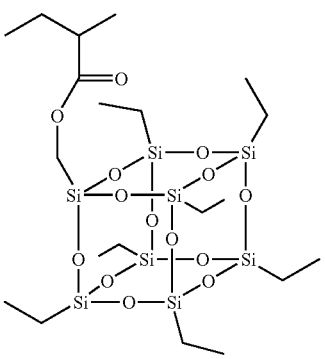
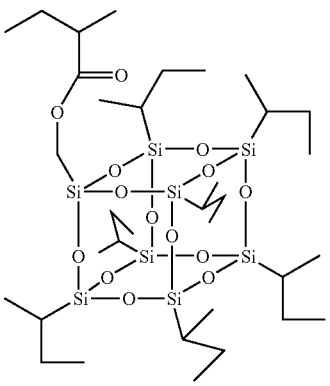
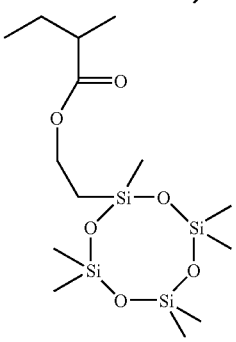
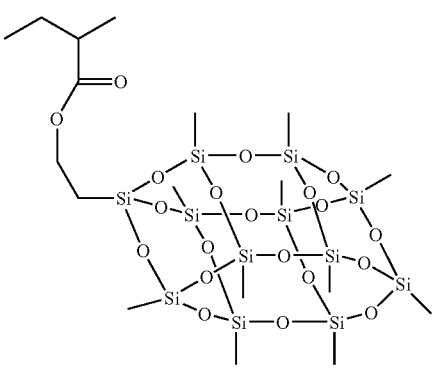

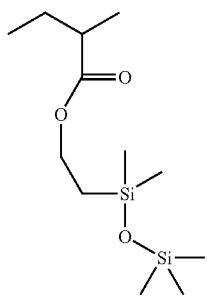
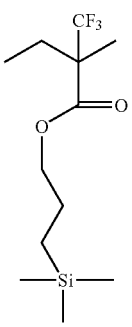
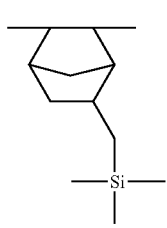
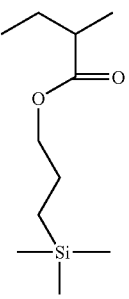
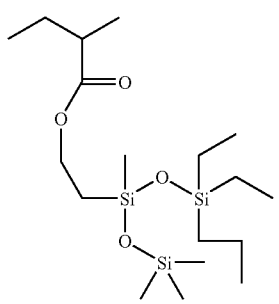
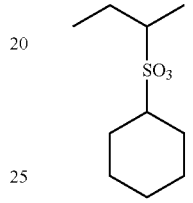
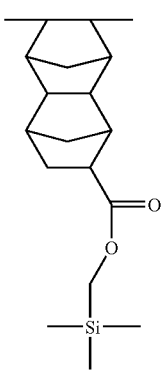
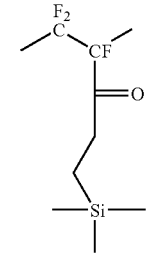
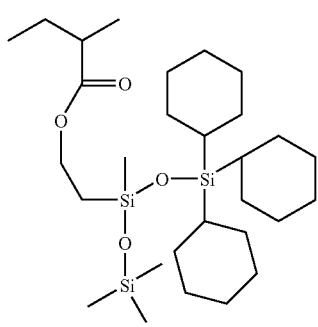
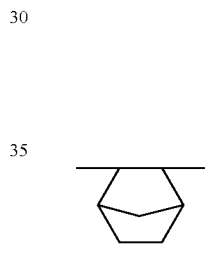
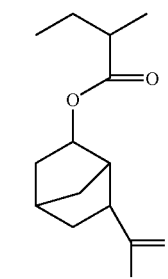
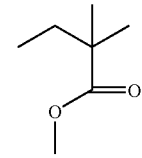
Next, specific examples of the resin of the component (C) will be presented, though the invention is not restricted thereto.
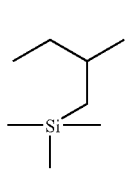
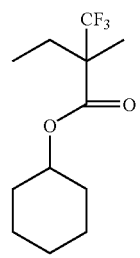
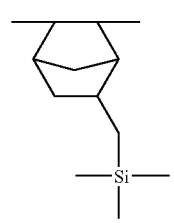
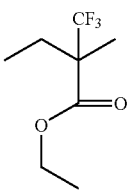
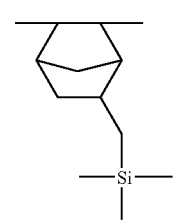
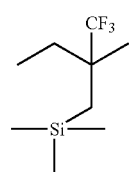
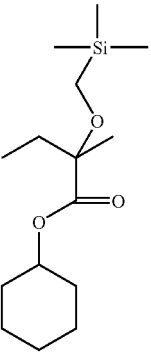
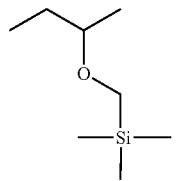
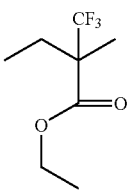

-continued
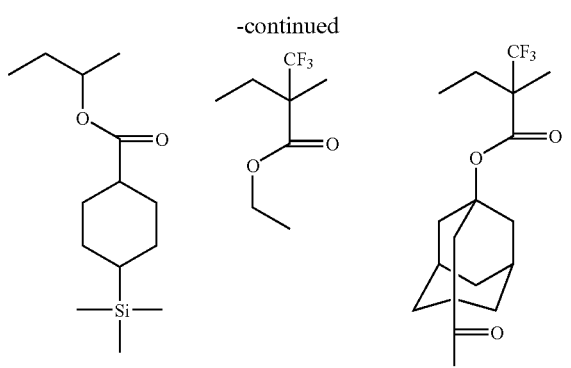
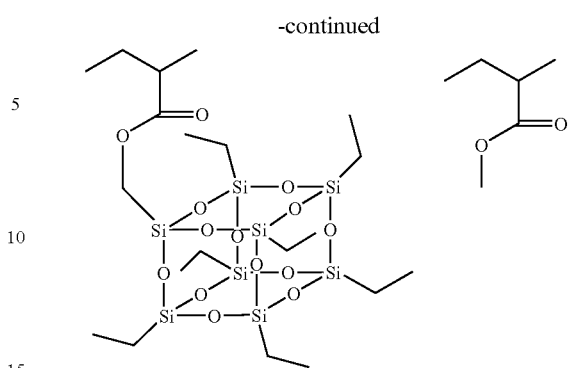
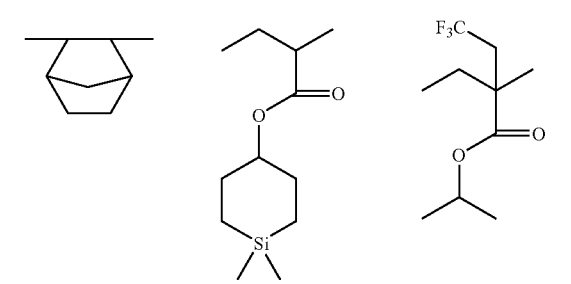
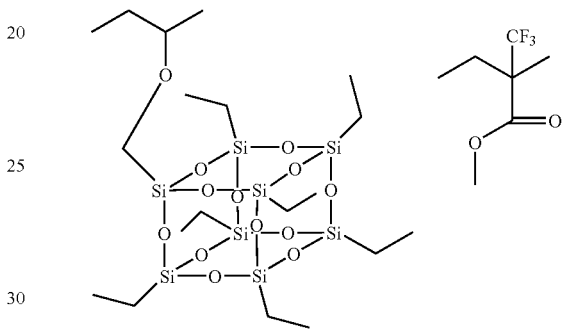
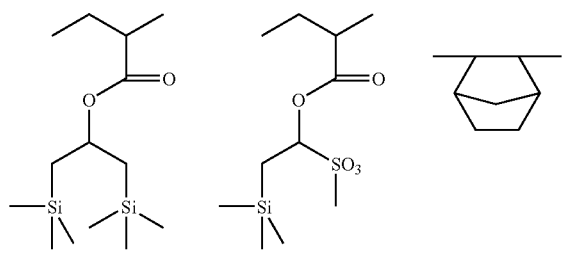
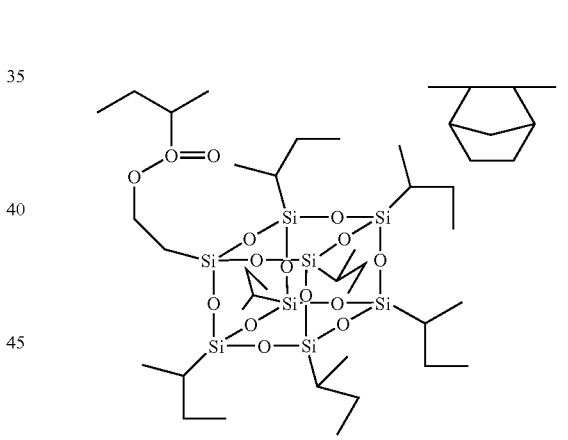
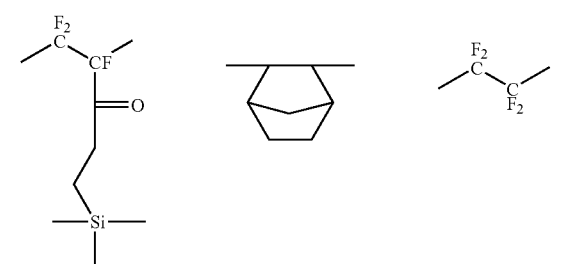
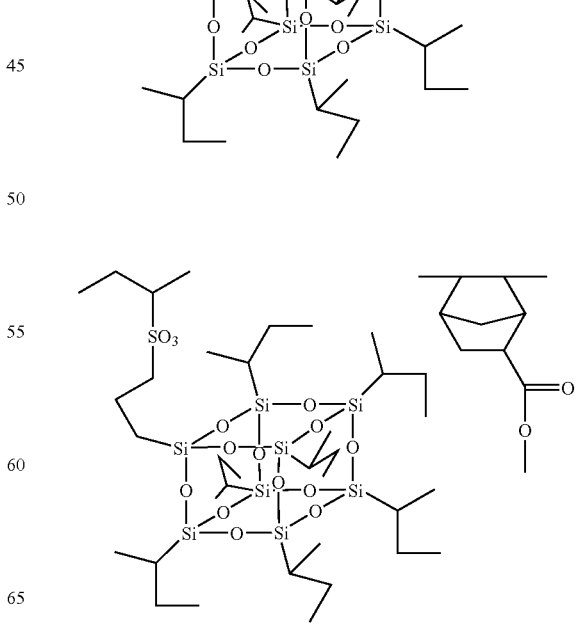

-continued

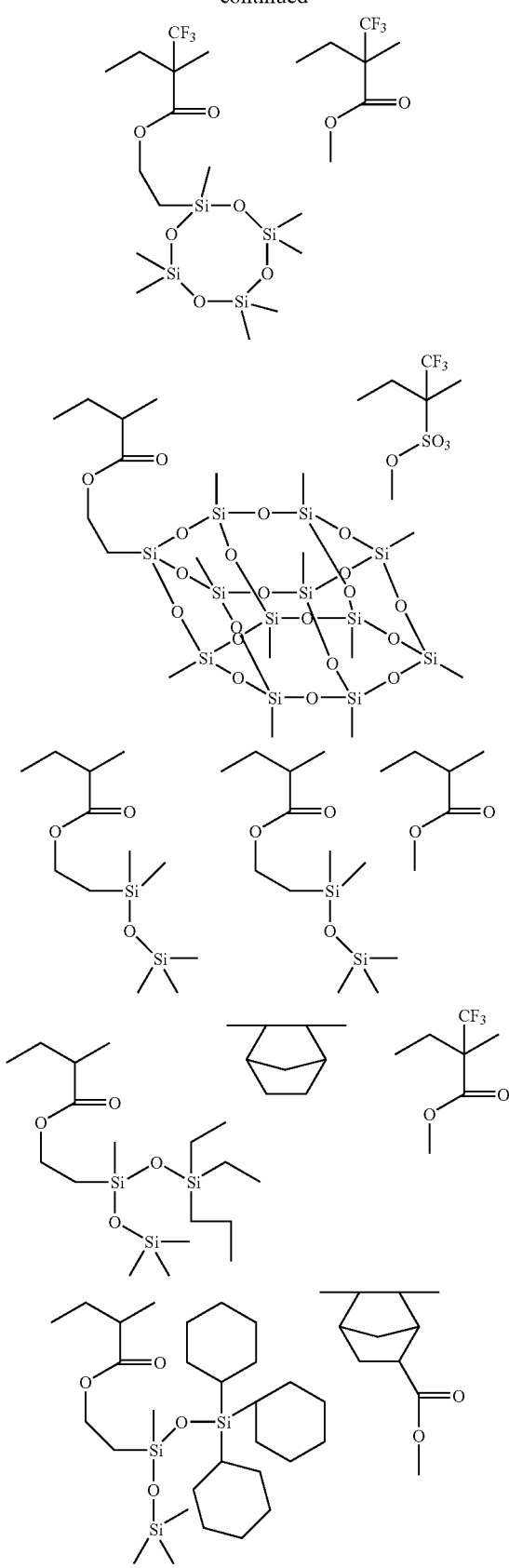

[4] (D) Solvent

The positive resist composition of the invention is employed by dissolving the components as discussed above in a specific solvent.

As examples of the solvent usable herein, there can be enumerated organic solvents such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran.

In the invention, either a single solvent or a mixture of solvents may be used. It is preferred to use a solvent mixture comprising two or more solvents having different functional groups. Thus, the solubility of the material can be elevated and the occurrence of particles can be prevented during preservation. Moreover, a favorable pattern profile can be thus obtained. As preferable examples of the functional groups contained in the solvents, there can be enumerated an ester group, a lactone group, a hydroxyl group, a ketone group and a carbonate group. As the solvent mixture comprising two or more solvents having different functional groups, the following solvent mixtures (S1) to (S5) are preferred.

(S1) A solvent mixture prepared by mixing a solvent having a hydroxyl group with another solvent having no hydroxyl group.

(S2) A solvent mixture prepared by mixing a solvent having an ester structure with another solvent having a ketone structure.

(S3) A solvent mixture prepared by mixing a solvent having an ester structure with another solvent having a lactone structure.

(S4) A solvent mixture prepared by mixing a solvent having an ester structure with another solvent having a lactone structure and another solvent having a hydroxyl group.

(S5) A solvent mixture prepared by mixing a solvent having an ester structure with another solvent having a carbonate structure and another solvent having a hydroxyl group.

Thus, the occurrence of particles can be relieved during the preservation of the resist solution and the occurrence of failures in coating can be prevented.

As examples of the solvent having a hydroxyl group, there can be enumerated ethylene glycol, ethylene glycol monomethyl ether, ethylene glycol monoethyl ether, propylene glycol, propylene glycol monomethyl ether, propylene glycol monoethyl ether, ethyl lactate and so on. Among them, propylene glycol monomethyl ether and ethyl lactate are preferred.

As examples of the solvent having no hydroxyl group, there can be enumerated propylene glycol monomethyl ether acetate, ethyl ethoxypropionate, 2-heptanone, γ-butyrolactone, cyclohexanone, butyl acetate, N-methylpyrrolidone, N,N-diacetamide, dimethyl sulfoxide and so on. Among them, propylene glycol monomethyl ether acetate, ethyl ethoxypropionate, 2-heptanone, γ-butyrolactone, cyclohexanone and butyl acetate are preferable, and propylene glycol monomethyl ether acetate, ethyl ethoxypropionate, 2-heptanone, and cyclohexanone are more preferable.

As examples of the solvent having a ketone structure, there can be enumerated cyclohexanone, 2-heptanone and so on and cyclohexanone is preferred.

As examples of the solvent having an ester structure, there can be enumerated propylene glycol monomethyl ether acetate, ethyl ethoxypropionate, butyl acetate and so on. Among them, propylene glycol monomethyl ether acetate is preferred.

As examples of the solvent having a lactone structure, there can be enumerated γ-butyrolactone.

As examples of the solvent having a carbonate structure, there can be enumerated propylene carbonate and ethylene carbonate and propylene carbonate is preferred.

The mixing ratio (by mass) of the solvent having a hydroxyl group to the solvent having no hydroxyl group is from 1/99 to 99/1, preferably from 10/90 to 90/10 and more preferably form 20/80 to 60/40. A solvent mixture containing 50% by mass or more of the solvent having no hydroxyl group is particularly preferred from the viewpoint of coating evenness.

The mixing ratio (by mass) of the solvent having an ester structure to the solvent having a ketone structure is from 1/99 to 99/1, preferably from 10/90 to 90/10 and more preferably form 40/60 to 80/20. A solvent mixture containing 50% by mass or more of the solvent having an ester structure is particularly preferred from the viewpoint of coating evenness.

The mixing ratio (by mass) of the solvent having an ester structure to the solvent having a lactone structure is from 70/30 to 99/1, preferably from 80/20 to 99/1 and more preferably form 90/10 to 99/1. A solvent mixture containing 70% by mass or more of the solvent having an ester structure is particularly preferred from the viewpoint of temporal stability.

In the case of mixing the solvent having an ester structure with the solvent having a lactone structure and the solvent having a hydroxyl group, it is preferable to employ from 30 to 80% by weight of the solvent having an ester structure, from 1 to 20% by weight of the solvent having a lactone structure and from 10 to 60% by weight of the solvent having a hydroxyl group.

In the case of mixing the solvent having an ester structure with the solvent having a carbonate structure and the solvent having a hydroxyl group, it is preferable to employ from 30 to 80% by weight of the solvent having an ester structure, from 1 to 20% by weight of the solvent having a carbonate structure and from 10 to 60% by weight of the solvent having a hydroxyl group.

A preferred mode of the solvent usable in the invention is a solvent which contains an alkylene glycol monoalkyl ether carboxylate (preferably propylene glycol monomethyl ether acetate), more preferably a solvent mixture of an alkylene glycol monoalkyl ether carboxylate with another solvent which is at least one member selected from among solvents having a functional group selected from among a hydroxyl group, a ketone group, a lactone group, an ester group, an ether group and a carbonate group or two or more functional groups selected from them. A particularly preferable solvent mixture is a mixture of propylene glycol monomethyl ether acetate with at least one solvent selected from among ethyl lactate, γ-butyrolactone, propylene glycol monomethyl ether, butyl acetate and cyclohexanone.

It is preferable that the positive resist composition has a solid concentration of from 3.0 to 10.0% by mass.

[5] (E) Basic Compound

It is preferable that the positive resist composition of the invention contains a basic compound to thereby relieve changes in the properties with the passage of time in the course of from exposure to heating or control the diffusion properties of an acid generated by the exposure in the film.

As examples of the basic compound, there can be enumerated a nitrogen-containing basic compound and an onium salt compound. As preferable examples of the structure of the nitrogen-containing basic compound, there can be enumerated compounds having partial structures represented by the following general formula (A) to (E).

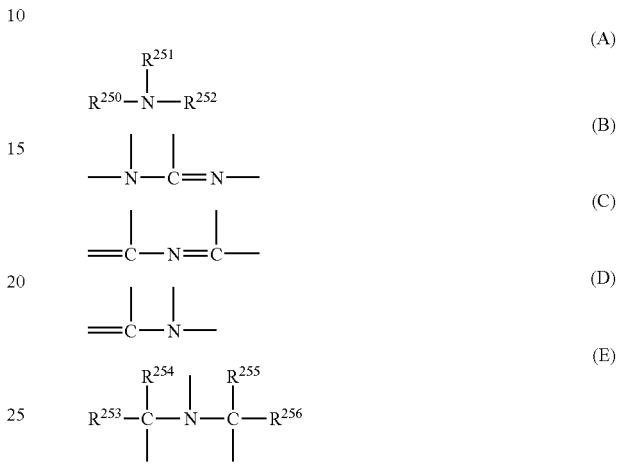

In the general formula (A), $R^{250}$, $R^{251}$ and $R^{252}$ independently represent each a hydrogen atom, an alkyl group having from 1 to 20 carbon atoms, a cycloalkyl group having from 3 to 20 carbon atoms or an aryl group having from 6 to 20 carbon atoms. $R^{250}$ and $R^{251}$ may be bonded together to form a ring. These groups may have a substituent. Preferable examples of the alkyl and cycloalkyl groups having a substituent include an aminoalkyl group having from 1 to 20 carbon atoms, an aminocycloalkyl group having from 3 to 20 carbon atoms, a hydroxyalkyl group having from 1 to 20 carbon atoms and a hydroxycycloalkyl group having from 3 to 20 carbon atoms.

These groups may further contain an oxygen atom, a sulfur atom or a nitrogen atom in the chain.

In the general formula (E), $R^{253}$, $R^{254}$, $R^{255}$ and $R^{256}$ independently represent each an alkyl group having from 1 to 6 carbon atoms or a cycloalkyl group having from 3 to 6 carbon atoms.

As preferable compounds, there can be enumerated guanidine, aminopyrrolidine, pyrazole, pyrazoline, piperazine, aminomorpholine aminoalkylmorpholine and piperidine which may have a substituent. As more preferable compounds, there can be enumerated a compound having an imidazole structure, a diazabicyclo structure, an onium hydroxide structure, an onium carboxylate structure, a trialkylamine structure, an aniline structure or a pyridine structure, an alkylamine derivative having a hydroxyl group and/or an ether bond, an aniline derivative having a hydroxyl structure and/or an ether bond and so on.

Examples of the compound having an imidazole structure include imidazole, 2,4,5-triphenylimidazole, benzimidazole and so on. Examples of the compound having a diazabicyclo structure include 1,4-diazabicyclo[2,2,2]octane, 1,5-diazabicyclo[4,3,0]nona-5-ene, 1,8-diazabicyclo[5,4,0]undeca-7-ene and so on. Examples of the compound having an onium hydroxide structure include triarylsulfonium hydroxide, phenacylsulfonium hydroxide, a sulfonium hydroxide having a 2-oxoalkyl group (more specifically, triphenylsulfonium hydroxide, tris(t-butylphenyl)sulfonium hydroxide, bis(t-butylphenyl)iodonium hydroxide, phenacylthiophenium hydroxide or 2-oxopropylthiophenium hydroxide) and so on. Examples of the compound having an onium carboxylate structure include a compound in which the anion moiety of a compound having an onium hydroxide structure has been converted into carboxylate such as acetate, adamantane-1-cabroxylate and perfluoroalkyl carboxylate. Examples of the compound having a trialkylamine structure include tri(n-butyl)amine, tri(n-octyl)amine and so on. Examples of the aniline compound include 2,6-diisopropylaniline, N,N-dimethylaniline, N,N-dibutylaniline, N,N-dioctylaniline and so on. Examples of the alkylamine derivative having a hydroxyl structure and/or an ether bond include ethanolamine, diethanolamine, triethanolamine, tris(methoxyethoxyethyl)amine and so on. Examples of the aniline derivative having a hydroxyl structure and/or an ether bond include N,N-bis(hydroxyethyl)aniline, N,N-bis(hydroxyethyl)-p-toluidine and so on.

As the basic compound, an aniline derivative is more preferable and an aniline derivative substituted by an alkyl group having from 1 to 20 carbon atoms or an alkyl group having a hydroxyl group and/or an ether bond on a nitrogen atom or an aromatic ring is more preferable.

It is also possible to use a nitrogen-containing basic compound of the tetraalkylammonium salt type. As preferable examples thereof, there can be enumerated tetraalkylammonium hydroxide having from 1 to 8 carbon atoms (tetramethylammonium hydroxide, tetraethylammonium hydroxide, tetra(n-butyl)ammonium hydroxide, etc.).

Either one of these basic compounds or a mixture of two or more thereof may be used. The basic compound is used in an amount of usually from 0.001 to 10% by mass, preferably from 0.01 to 5% by mass, based on the solid matters in the positive resist composition. To obtain a sufficient effect of the addition, it is preferable to use 0.001% by mass or more of the basic compound. From the viewpoints of sensitivity and development properties of an non-exposed part, it is preferable to use not more than 10% by mass of the basic compound.

[6] (F) Surfactant

By adding a fluorine and/or silicone-based surfactant to the positive resist composition of the invention, it becomes possible to present a resist pattern having a favorable sensitivity and resolution and a high adhesiveness and suffering from little development failures in the cause of using an exposure light source of 250 nm or less, in particular, 220 nm or less.

As examples of such fluorine and/or silicone-based surfactants, there can be enumerated surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. No. 5,405,720, U.S. Pat. No. 5,360,692, U.S. Pat. No. 5,529,881, U.S. Pat. No. 5,296,330, U.S. Pat. No. 5,436,098, U.S. Pat. No. 5,576,143, U.S. Pat. No. 5,294,511 and U.S. Pat. No. 5,824,451. It is also possible to employ commercially available surfactants as will be shown below as such.

Examples of commercially available surfactants usable herein include fluorine and/or silicone-based surfactants such as Eftop EF301 and EF 303 (manufactured by Shin-Akita Kasei K.K.), Florad FC430 and 431 (manufactured by Sumitomo 3M, Inc.), Megafac F171, F173, F176, F189 and R08 (manufactured by Dainippon Ink & Chemicals, Inc.), Surflon S-382, SC101, 102, 103, 104, 105 and 106 (manufactured by Asahi Glass Co., Ltd.), Troysol S-366 (manufactured by Troy Chemical Industries, Inc.), PF656 (manufactured by OMNOVA), PF6320 (manufactured by OMNOVA), PF6520 (manufactured by OMNOVA) and so on. It is also possible to use silicon-containing surfactants such as Polysiloxane polymer KP341 (manufactured by Shin-Etsu Chemical Industry Col., Ltd.).

In addition to the publicly known surfactants as described above, use can be also made of surfactants comprising a polymer having a fluoro aliphatic group derived from a fluoro aliphatic compound which is produced by the telomerization method (also called the telomer method) or the oligomerization method (also called the oligomer method). Such a fluoro aliphatic compound can be synthesized by a method described in JP-A-2002-90991.

As the polymer having a fluoro aliphatic group, a copolymer of a monomer having a fluoro aliphatic group with a (poly(oxyalkylene)) acrylate and/or a (poly(oxyalkylene)) methacrylate is preferable. Either a copolymer with irregular distribution or a block copolymer may be used. Examples of the poly(oxyalkylene) group include poly(oxyethylene), poly(oxypropylene) and poly(oxybutylene) groups. Use may be also made of units having alkylenes with different chain lengths in a single chain such as a poly(oxyethylene-oxypropylene block unit) and poly(oxyethylene-oxypropylene block unit). Moreover, use may be made of not only a copolymer or a dimer of a monomer having a fluoro aliphatic group with a (poly(oxyalkylene)) acrylate (or methacrylate) but also a trimer or a higher copolymer having two or more different monomers having a fluoro aliphatic group or two or more different (poly(oxyalkylene)) acrylates (or methacrylates) copolymerized at the same time.

Examples of commercially available surfactants include Megafac F178, F-470, F-473, F-475, F-476 and F-472 (manufactured by Dainippon Ink & Chemicals, Inc.). Further examples thereof include a copolymer of a $C_6F_{13}$-containing acrylate (or methacrylate) with a (poly(oxyalkylene))acrylate (or methacrylate), a copolymer of a $C_6F_{13}$-containing acrylate (or methacrylate) with (poly(oxyethylene))acrylate (or methacrylate) and (poly(oxypropylene))acrylate (or methacrylate), a copolymer of a $C_8F_{17}$-containing acrylate (or methacrylate) with a (poly(oxyalkylene))acrylate (or methacrylate), and a copolymer of a $C_8F_{17}$-containing acrylate (or methacrylate) with (poly(oxyethylene))acrylate (or methacrylate) and (poly(oxypropylene))acrylate (or methacrylate).

In the invention, use can be also made of a surfactant other than fluorine and/or silicone-based surfactant as discussed above. As specific examples thereof, there can be enumerated nonionic surfactants such as polyoxyethylene alkyl ethers, polyoxyethylene alkyl allyl ethers, polyoxyethylene/polyoxypropylene block copolymers, sorbitan aliphatic esters, polyoxyethylene sorbitan aliphatic esters.

Either a single surfactant or a combination of two or more thereof may be used.

It is preferable to use the surfactant in an amount of from 0.0001 to 2% by mass, still preferably form 0.0001 to 2% by mass, more preferably from 0.001 to 1% by mass, based on the whole positive resist composition (excluding the solvent).

[7] (G) Acid Diffusion-inhibiting Compound being Decomposed by the Action of Acid, Thus Increasing in Solubility in Alkali Developer And Having Molecular Weight of 3,000 or Less (Hereinafter also Referred to as "Acid Diffusion-inhibiting Compound")

The positive resist composition of the invention can further contain an acid diffusion-inhibiting compound.

In order not to lower the transmittance at 220 nm or lower, it is preferable to use, as the acid diffusion-inhibiting compound, an alicyclic or aliphatic compound having an acid-decomposable group, for example, a cholic acid derivative having an acid-decomposable group as described in Proceedings of SPIE, 2724, 355(1996).

The molecular weight of the acid diffusion-inhibiting compound is 3,000 or less, preferably from 300 to 3,000 and more preferably from 500 to 2,500.

The content of the acid diffusion-inhibiting compound is preferably from 1 to 30% by mass, more preferably from 2 to 20% by mass, based on the solid matters contained in the positive resist composition.

Next, specific examples of the acid diffusion-inhibiting compound will be presented, though the invention is not restricted thereto.

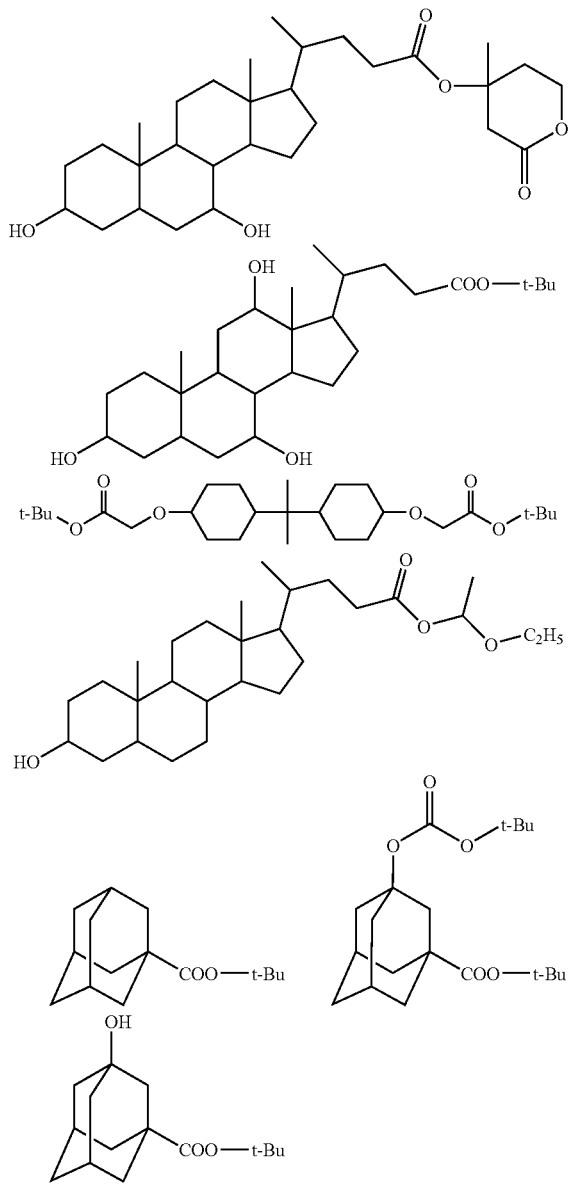

<Other Additives>

The positive resist composition of the invention may further contain, if required, a dye, a plasticizer, a photosensitizer, a compound accelerating dissolution in a developing solution and so on.

A dissolution-accelerating compound for a developing solution usable in the invention is a low-molecular compound having two or more phenolic OH groups or one or more carboxyl groups and having a molecular weight of 1,000 or less. In the case of having a carboxyl group, an alicyclic or aliphatic compound is preferred.

It is preferable to add the dissolution-accelerating compound in an amount of from 2 to 50% by mass, more preferably from 5 to 30% by mass, based on the acid-decomposable resin. From the viewpoints of reducing development residue and preventing pattern deformation during development, it is preferable to use the dissolution-accelerating compound in an amount of not more than 50% by mass.

Such a phenolic compound having a molecular weight of 1,000 or less can be easily synthesized by a person skilled in the art by referring to, for example, methods described in JP-A-4-122938, JP-A-2-28531, U.S. Pat. No. 4,916,210, EP219294 and so on.

As specific examples of the alicyclic or aliphatic compound having a carboxyl group, there can be enumerated a derivative of a carboxylic acid having a steroid structure such as cholic acid, deoxycholic acid and lithocholic acid, an adamantane carboxylic acid derivative, adamantane dicarboxylic acid, cyclohexane carboxylic acid, cyclohexane carboxylic acid, cyclohexane dicarboxylic acid and so on, though the invention is not restricted thereto.

[Properties of Resist Composition]

From the viewpoint of improving resolution, it is preferable to use the positive resist composition of the invention at a film thickness of form 30 to 300 nm, more preferably from 30 to 250 nm. Such a film thickness can be achieved by adjusting the concentration of solid matters in the positive resist composition within an appropriate range and impart an appropriate viscosity to thereby improve the coating properties and film-formation properties.

The total concentration of solid matters in the positive resist composition is usually from 1 to 10% by mass, preferably from 1 to 8% by mass and more preferably from 1.0 to 7.0% by mass.

It is preferable that the content of metallic impurities in the positive resist composition of the invention is nor more than 100 ppb, more preferably not more than 20 ppb and more preferably not more than 5 ppb. Examples of the metallic impurities contained in the composition include Na, K, Ca, Fe, Mg, Mn, Pd, Ni, Zn, Pt, Ag, Cu and so on.

As an examples of a method of lowering the content of metallic impurities in the composition, a method which comprises dissolving the resist resin in a solvent to give a solution and filtering it through an ion-exchange filter may be cited.

As an example of the method of producing the positive resist composition of the invention, there can be enumerated a method of producing a positive resist composition which comprises the step of filtering a resin-containing solution through an ion-exchange filter, the step of adding an acid-generating agent optionally together with an organic basic compound, a surfactant, etc. thereto to give a liquid mixture, and the step of filtering the liquid mixture through a filter for removing insoluble colloid.

To reduce metal impurities from organic polymers, there have been commonly known a method comprising liquid separation and washing, a treatment with an acidic ion exchange resin or a chelate resin, and so on. However, a treatment with the use of an acid is generally undesirable in the case of a resist composition containing an acid-decomposable compound, since it is highly difficult to effectively treat metallic impurities while sustaining a satisfactory stability during the treatment.

[Pattern Making Method]

In the case of using the positive resist composition of the invention, the components as described above are dissolved in a definite solvent (preferably the solvent mixture as described above), filtered through a filter and then coated on a definite support in the following manner. It is preferable that the filter to be used in the filtration is a filter having a pore size of 0.1 µm or less, more preferably 0.05 µm or less and more preferably 0.03 µm or less and made of polytetrafluoroethylene, polyethylene or nylon.

For example, the positive resist composition is coated on a substrate to be used in a precision integrated circuit device (for example, a silicone/silicone dioxide-coated substrate) or an ITO substrate) by an appropriate coating method with the use of, for example, a spinner or a coater, and then dried to form a resist film, Although the baking temperature can be optionally determined, it usually ranges from 60 to 150° C., preferably from 90 to 130° C.

Next, the resist film is irradiated with an actinic ray or a radiation via a definite mask and preferably baked (heated) followed by developing and rinsing. Thus, a favorable resist pattern can be obtained.

In the irradiation with an actinic ray or a radiation, exposure (immersion exposure) may be conducted by filling the space between the resist film and a lens with a liquid (immersion medium) having a higher refractive index than air. Thus, the resolution can be improved. As the immersion medium, use can be made of any liquid having a higher refractive index than air. It is preferable to use purified water therefor. To avoid the direct contact of the resist film with the immersion medium during the immersion exposure, an overcoat layer may be further formed on the resist film. Thus, the elution of the composition from the resist film into the immersion medium can be prevented and thus development failures can be lessened.

Next, the immersion liquid to be used in the immersion exposure will be explained.

As the immersion liquid, it is preferable to employ a liquid which is transparent to the exposure wavelength and has a temperature coefficient of the refractive index as low as possible so as to minimize deformation in an optical image projected on the resist. In the case where an ArF excimer laser beam (wavelength: 193 nm) is employed as an exposure light source, in particular, it is favorable to use water because of the high availability and handling properties, in addition to the viewpoints as discussed above.

To further elevate the refractive index, it is also possible to use a medium having a refractive index of 1.5 or more. Such a medium may be either an aqueous solution or an organic solvent.

In the case of using water as the immersion liquid, use may be made of a small amount of an additive (a liquid), which causes no dissolution of the resist layer on a wafer and exhibits only ignorable effect on the optical coat at the bottom face of the lens device, so as to lower the surface tension of water and elevate the interfacial activity. As the additive, it is preferable to use an aliphatic alcohol having a refractive index almost the same as water, for example, methyl alcohol, ethyl alcohol, isopropyl alcohol and so on. By adding such an alcohol having a refractive index almost the same as water, there arises an advantage that the refractive index change in the whole liquid can be minimized even though the alcoholic component in water is vaporized and thus the concentration thereof is altered. When the immersion liquid is contaminated with a substance which is opaque to the light of 193 nm or has a refractive index largely differing from water, an optical image projected on the resist is deformed. Therefore, it is preferable to use distilled water as the water. Use may be also made of purified water having been filtered through, for example, an ion exchange filter.

It is preferable that the water has an electrical resistance of 18.3 MΩcm or above, contains 20 ppb or less of TOC (total organic carbon) and has been degassed.

By elevating the refractive index of the immersion liquid, lithographic performance can be improved. From this viewpoint, it is also possible to add an additive capable of elevating the refractive index to the water or substitute the water with deuterium water ($D_2O$).

To avoid the direct contact of the resist film comprising the positive resist composition of the invention with the immersion liquid, a film hardly soluble in the immersion liquid (hereinafter also referred to as "topcoat") may be provided between the resist film and the immersion liquid. The requirements for the topcoat include appropriate coating properties for the upper layer part of the resist, transparency to a radiation (in particular, at 193 nm), and little solubility in the immersion liquid. It is preferable that the topcoat cannot be intermixed with the resist and can be evenly coated on the upper layer of the resist.

From the viewpoint of transparency at 193 nm, it is preferable that the topcoat is made of a polymer having no aromatic group. As specific examples thereof, there can be enumerated a hydrocarbon polymer, an acrylic ester polymer, polymethacrylic acid, polyvinyl ether, a silicone-containing polymer, a silicon-containing polymer and so on. Since the elution of impurities, if any, from the topcoat to the immersion liquid causes contamination of the lens, it is preferable that the polymer in the topcoat contains little residual monomer component.

To peel the topcoat, use may be made of a developing solution. Alternatively, use may be made of a peeling agent separately. As the peeling agent, a solvent showing little penetration into the resist is preferable. From the viewpoint that the peeling step and the step of developing the resist can be simultaneously carried out, it is preferable to peel the topcoat with an alkali developer. From the viewpoint of peeling with the use of an alkali developer, it is preferable that the topcoat has an acidic nature. From the viewpoint of non-intermixing with the resist, however, the topcoat may have a neutral or basic nature.

When there is little difference in refractive index between the topcoat and the immersion liquid, the resolution can be improved. In the case of using water as the immersion liquid in the ArF excimer laser beam (wavelength: 193 nm), it is preferable that the refractive index of the topcoat for ArF immersion exposure has a refractive index close to that of the immersion liquid. To approximate the refractive index of the topcoat to that of the immersion liquid, it is preferred that the topcoat contains a fluorine atom. From the viewpoints of transparency and refractive index, a thinner film is preferred.

It is preferable that the topcoat is intermixed neither with the resist nor the immersion liquid. From this point of view, it is preferable that a solvent of the topcoat is a medium which is hardly soluble in the resist solvent and insoluble in water, in the case where the immersion liquid is water. In the case where the immersion liquid is an organic solvent, the topcoat may be either water-soluble or water-insoluble.

Before forming the resist film, an antireflective film may be formed on the substrate.

As the antireflective film, use can be made of either an inorganic film made of titanium, titanium dioxide, titanium nitride, chromium oxide, carbon, amorphous silicone, etc. or an organic film made of a light-absorbing agent and a polymer material. As the organic antireflective film, use may be also made of commercially available organic antireflective films such as DUV30 series and DUV-40 series manufactured by Brewer Science Inc., AR-2, AR-3 and AR-5 manufactured by Chypre and so on.

As examples of the actinic ray or radiation to be used in the pattern making, there can be enumerated infrared rays, visible rays, ultraviolet rays, far ultra violet rays, X-ray, electron beams and so on. It is preferable to employ a far ultraviolet ray having a wavelength of 250 nm or less, more preferably 220 nm or less and particularly preferably 200 µm or less. Specific examples thereof include a KrF excimer laser beam (248 nm), an ArF excimer laser beam (193 nm), an $F_2$ excimer laser beam (157 nm), X-ray, an electron beam and so on. In particular, an ArF excimer laser beam (193 nm), an $F_2$ excimer laser beam (157 nm, EUV (13 nm) or an electron beam is preferable.

In the development step, an alkali developer is used in the following manner. As the alkali developer for the resist composition, use can be made of aqueous alkaline solutions of inorganic alkalis such as sodium hydroxide, potassium hydroxide, sodium carbonate, sodium silicate, sodium metasilicate and aqueous ammonia, primary amines such as ethylamine and n-propyl amine, secondary amines such as diethylamine and di-n-butylamine, tertiary amines such as triethylamine and methyldiethylamine, alcohol amines such as dimethyl ethanol amine and triethanol amine, quaternary ammonium salts such as tetramethylammonium hydroxide and tetraethylammonium hydroxide, and cyclic amines such as pyrrole and piperidine.

It is also possible to use such an alkali developer as cited above which further contains an alcohol or a surfactant in an appropriate amount.

The alkali concentration in the alkali developer is usually from 0.1 to 20% by mass.

The pH value of the alkali developer is usually from 10.0 to 15.0.

The development time in this step preferably ranges from 30 to 90 seconds.

In this development step, use may be made of either the paddle development, wherein the developing solution forms paddles on the resist film surface so as to conduct the development, or the paddle-less method without resorting to the paddle formation.

After the development or rinsing, it is also possible to conduct a treatment by which the developing solution or the rinsing solution sticking to the pattern is removed with the use of a supercritical fluid.

The positive resist composition of the invention is applicable to a multilayer resist process (in particular, the three-layer resist process). The multilayer resist process involves the following steps.

(a) A lower resist layer comprising an organic material is formed on a substrate to be processed.
(b) On the lower resist, an intermediate layer and an upper layer, which comprises an organic material undergoing crosslinking or decomposition when irradiated with a radiation, are successively layered.
(c) After forming a definite pattern on the upper resist layer, the intermediate layer, the lower layer and the substrate are successively etched.

As the intermediate layer, use is generally made of organo polysiloxane (a silicone resin) or an $SiO_2$ coating solution (SOG). As the lower resist, use may be made of an appropriate organic polymer film and various publicly known photoresists may be used therefor. As examples thereof, there can be enumerated FH series and FHi series manufactured by Fuji Film Arch and PFI series manufactured by Sumitomo Chemical Co., Ltd.

The film thickness of the lower resist layer is preferably from 0.1 to 4.0 µm, more preferably from 0.2 to 2.0 µm and particularly preferably from 0.25 to 1.5 µm. A film thickness of 0.1 µm or more is preferable from the viewpoints of anti-reflection and dry etching properties, while a film thickness of 4.0 µm or less is preferable from the viewpoint of the aspect ratio and pattern misshaping of the fine pattern thus formed.

As the rinsing solution, purified water is employed and an appropriate amount of a surfactant may be added thereto.

After the development or rinsing treatment, it is possible to conduct a treatment whereby the developing solution or the rinsing solution sticking to the pattern is removed with the use of a supercritical fluid.

Moreover, a step of washing the resist film surface may be employed before or after the exposure. Although purified water is preferable as the solvent to be used in the washing, the washing solvent is not restricted thereto so long as the resist film is not dissolved therein.

EXAMPLES

Next, the invention will be illustrated by reference to the following Examples, though the contents of the invention are not restricted thereto.

Synthesis Example 1

Synthesis of Resin (RA-15)

Monomer-1, monomer-2 and monomer-3 respectively represented by the following structural formulae were fed at a ratio (by mol) of 40/20/20 and dissolved in PGMEA (propylene glycol monomethyl ether acetate)/PGME (propylene glycol monomethyl ether)=7/3 (by mass) to give 450 g of a solution having a solid concentration of 15% by mass. To this solution, 1% by mol of a polymerization initiator V-601 (manufactured by Wako Pure Chemical Industries, Ltd.) was added. The resulting mixture was dropped under a nitrogen atmosphere for 6 hours into 50 g of a solution mixture of PGMEA (propylene glycol monomethyl ether acetate)/PGME (propylene glycol monomethyl ether)=7/3 (by mass) heated to 100° C. After the completion of dropping, the liquid reaction mixture was stirred for 2 hours. After the completion of the reaction, the liquid reaction mixture was cooled to room temperature and subjected to crystallization from a solvent mixture of hexane/ethyl acetate=9/1. The white powder thus precipitated was collected by filtration so that the target resin (RA-15) was recovered.

The polymer composition ratio (by mol) determined by NMR was 40/20/40. The weight-average molecular weight, calculated in terms of standard polystyrene by the GPC method, was 8,000 while the degree of dispersion was 2.0.

monomer-1
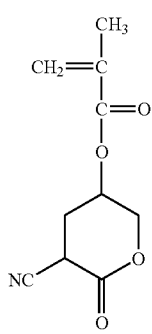
monomer-2
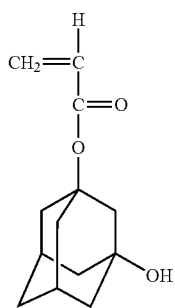
monomer-3
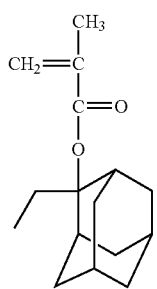
Other resins of the component (A) were prepared as in Synthesis Example 1 but altering the monomer types, feeding amounts, solid concentration, solvent for reprecipitation, etc.
The structures of the resins (RA-1) to (RA-22) to be used as the component (A) in the invention are as follows.
(RA-1)
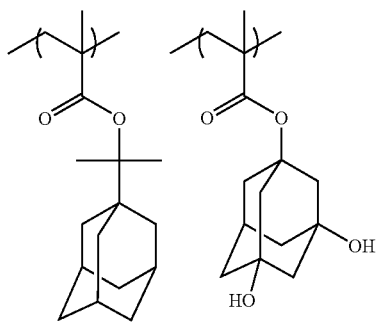
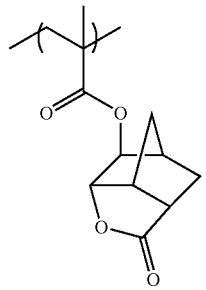
(RA-2)
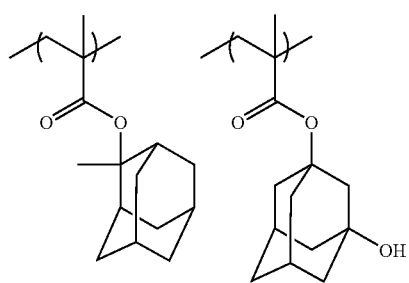
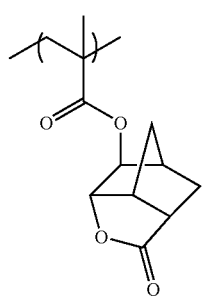
(RA-3)
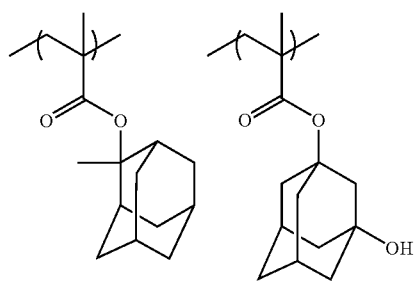
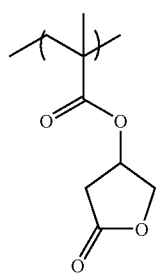

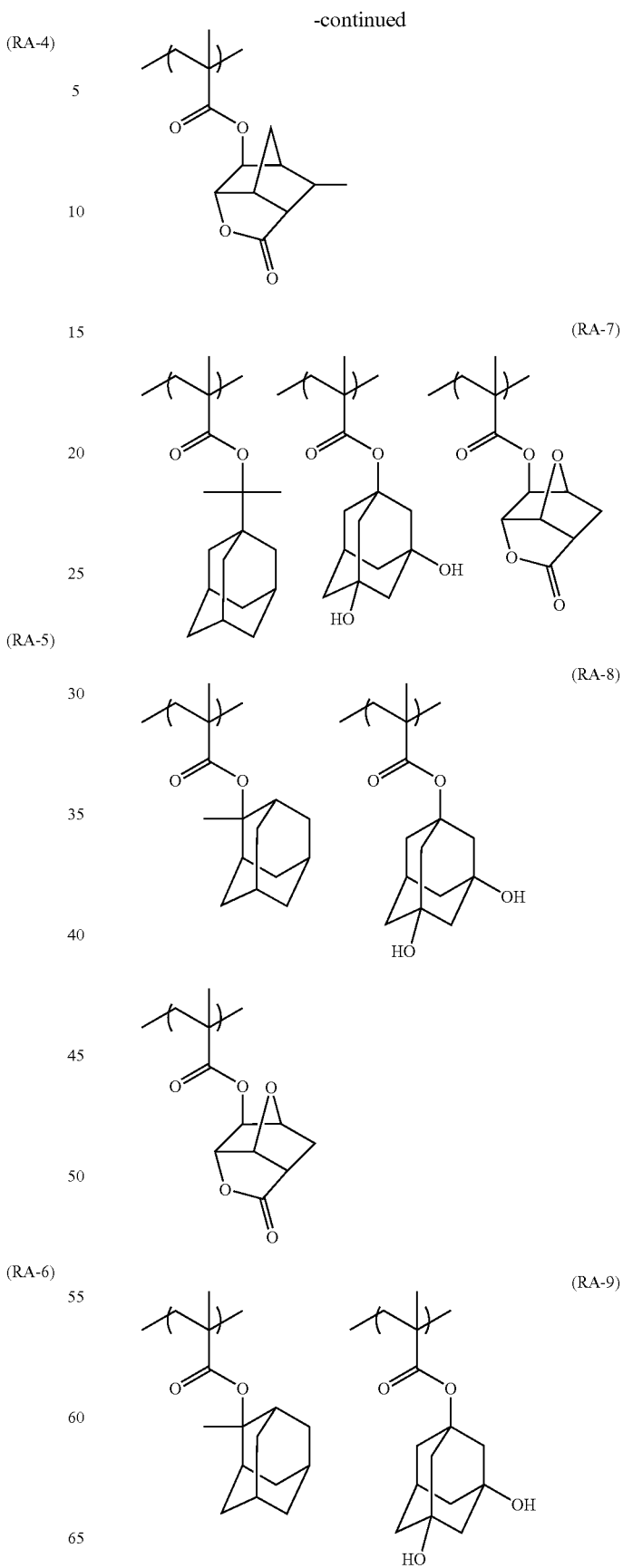

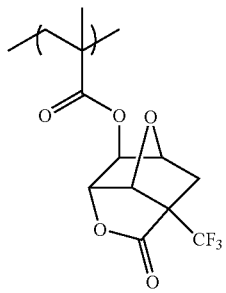
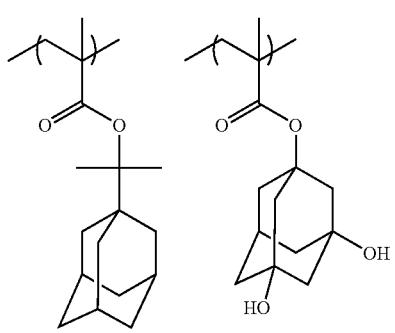
(RA-10)
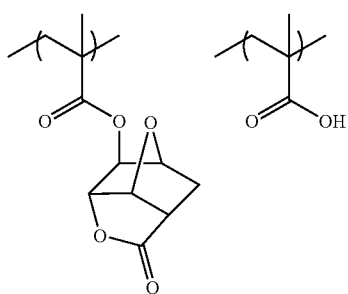
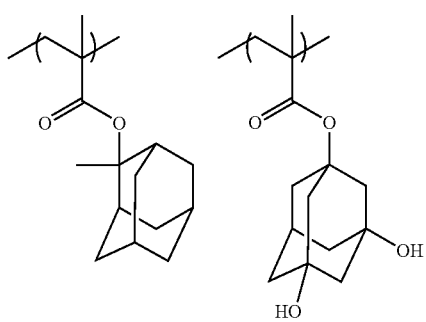
(RA-11)
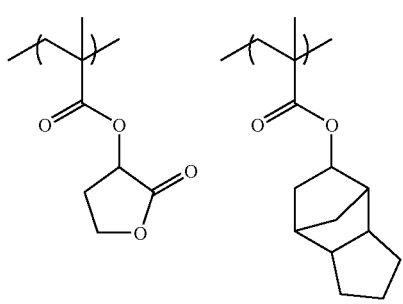
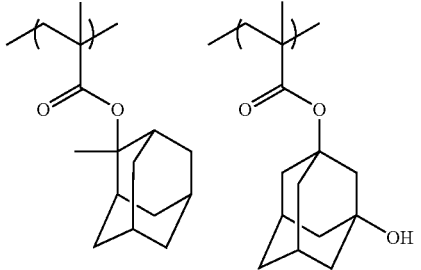
(RA-12)
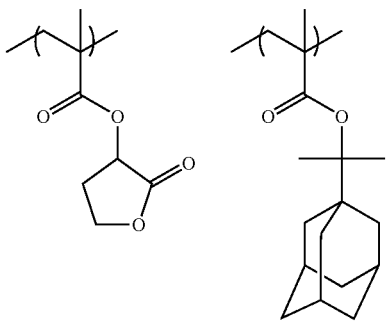
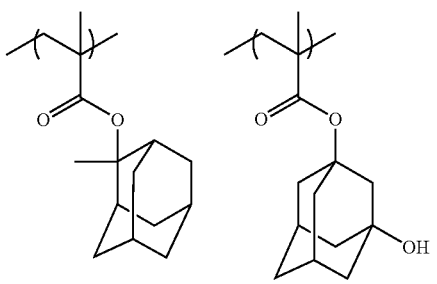
(RA-13)
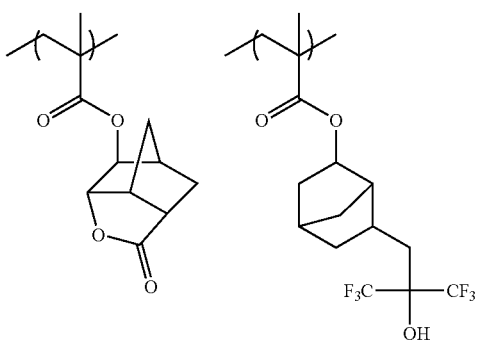
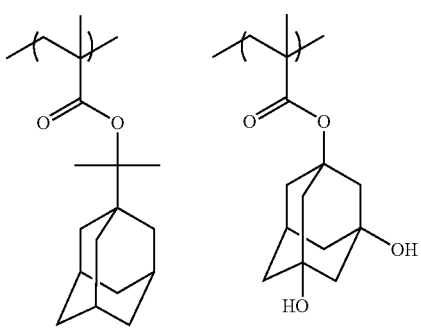
(RA-14)

-continued
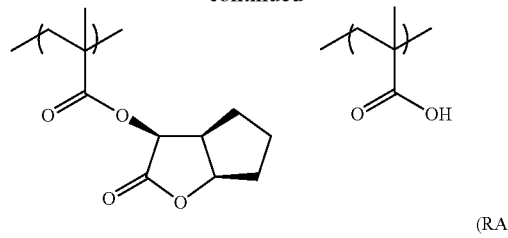
(RA-15)
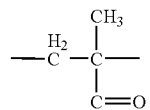 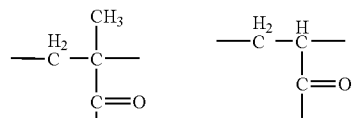
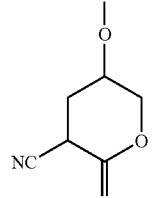
(RA-16)
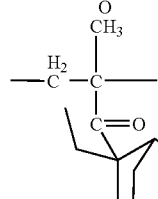
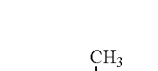
(RA-17)
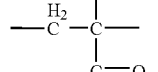
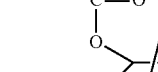
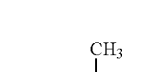
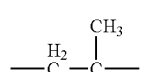
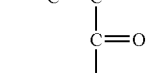
-continued
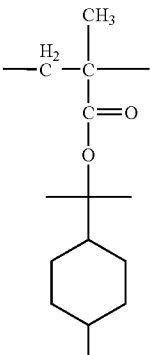
(RA-18)
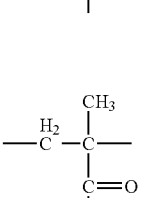
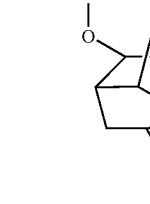
(RA-19)
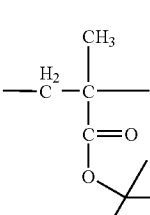
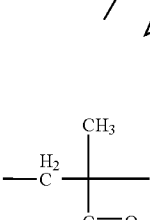
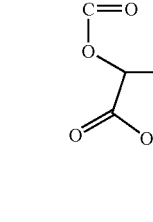
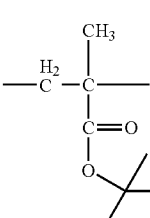

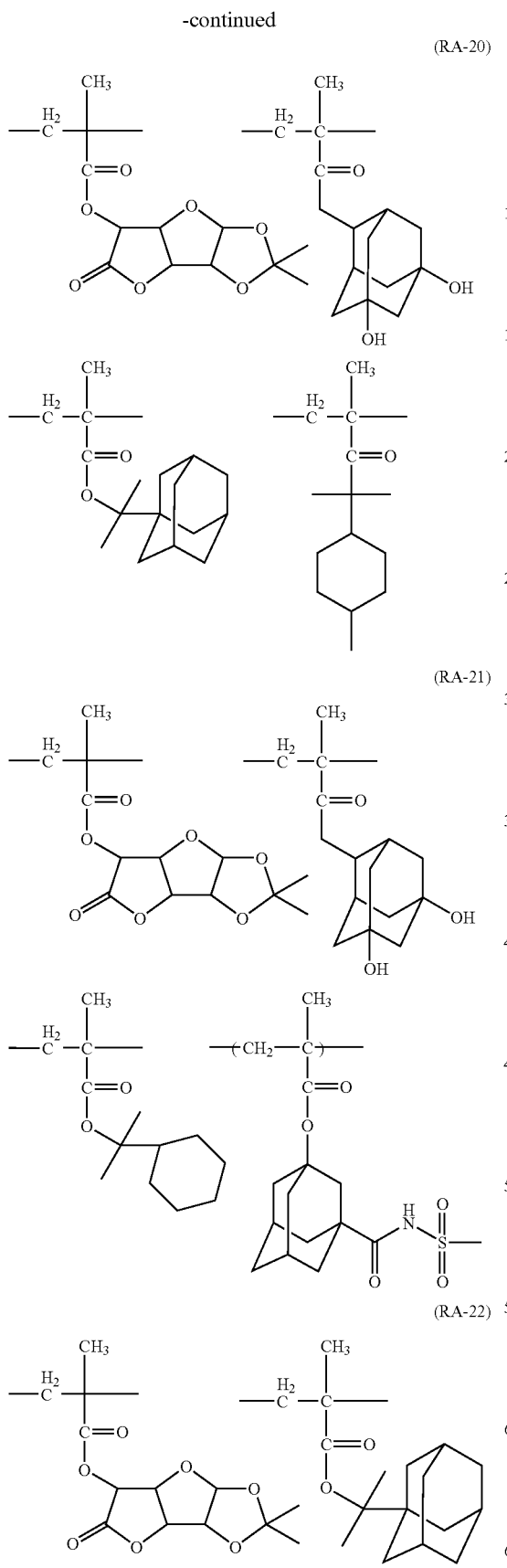
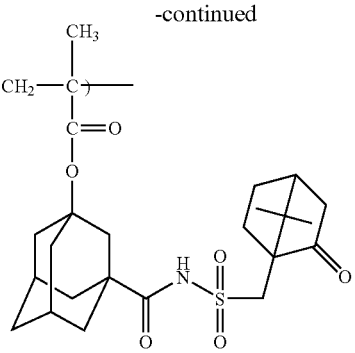

The following Tables 1 to 3 indicate the composition ratios (by mol), weight average-molecular weights (Mw) and dispersion degrees (Mw/Mn) of the resins (RA-1) to (RA-22) to be used as the component (A). The composition ratio of each of the resins (RA-1) to (RA-22) corresponds to the individual repeating units from the left.

TABLE 1

| Resin | Composition ratio | Mw | Mw/Mn |
|---|---|---|---|
| RA-1 | 30/30/40 | 9800 | 2.2 |
| RA-2 | 20/40/40 | 6400 | 1.5 |
| RA-3 | 40/25/35 | 40000 | 2.5 |
| RA-4 | 25/35/50 | 30000 | 2.4 |
| RA-5 | 35/45/20 | 18000 | 2.1 |
| RA-6 | 30/30/40 | 2500 | 1.5 |
| RA-7 | 20/40/40 | 5500 | 3.3 |
| RA-8 | 40/20/40 | 6900 | 2.4 |
| RA-9 | 25/45/30 | 32000 | 3.2 |
| RA-10 | 40/20/30/10 | 4500 | 1.4 |
| RA-11 | 30/20/30/20 | 15000 | 2.2 |
| RA-12 | 25/25/35/15 | 20000 | 2.5 |
| RA-13 | 30/30/20/20 | 8500 | 1.8 |
| RA-14 | 40/15/25/20 | 4500 | 1.9 |

TABLE 2

| Resin | Composition ratio | Mw | Mw/Mn |
|---|---|---|---|
| RA-15 | 40/20/40 | 8000 | 2.0 |
| RA-16 | 40/20/35/5 | 9000 | 1.7 |
| RA-17 | 50/10/40 | 12000 | 1.8 |
| RA-18 | 50/10/30/10 | 10000 | 1.9 |

TABLE 3

| Resin | Composition ratio | Mw | Mw/Mn |
|---|---|---|---|
| RA-19 | 30/10/20/20 | 8800 | 1.4 |
| RA-20 | 30/10/20/20 | 18500 | 2.2 |
| RA-21 | 40/10/20/10 | 6000 | 2.9 |
| RA-22 | 40/50/10 | 8000 | 2.3 |

Synthesis Example 2

Synthesis of Resin (RC-1-A)

(Trimethylsilyl)propyl methacrylate and methyl methacrylate were fed at a ratio (by mol) of 50/50 and dissolved in propylene glycol monomethyl ether acetate to give 450 g of a solution having a solid concentration of 22% by mass. To this solution, 5% by mol of a polymerization initiator V-601

(manufactured by Wako Pure Chemical Industries, Ltd.) was added. The resulting mixture was dropped under a nitrogen atmosphere for 2 hours into 50 mL of propylene glycol monomethyl ether acetate heated to 80° C. After the completion of dropping, the liquid reaction mixture was stirred for 2 hours. After the completion of the reaction, the liquid reaction mixture was cooled to room temperature and subjected to crystallization from 10 times as much a solvent mixture of hexane/ethyl acetate=90/10. The white powder thus precipitated was collected by filtration so that the target resin (RC-1-A) was recovered.

The polymer composition ratio (by mol) determined by $^{13}$CNMR was 50/50. The weight-average molecular weight, calculated in terms of standard polystyrene by the GPC method, was 25,000 while the degree of dispersion was 2.2.

Other resins (RC-1-B) to (RC-1-D) and (RC-2) to (RC-15) were prepared as in Synthesis Example 2 but appropriately altering the monomer types, feeding amounts, solid concentration, solvent for reprecipitation, etc.

The structures of the resins (RC-1-A) to (RC-1-D) and (RC-2) to (RC-15) to be used as the component (C) in the invention are as follows.

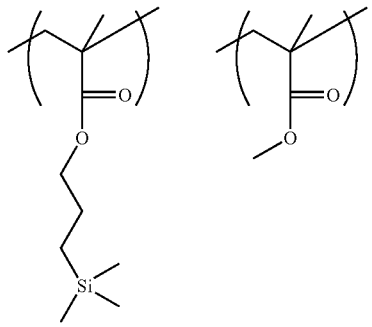
(RC-1-A) (RC-1-B) (RC-1-C) (RC-1-D)

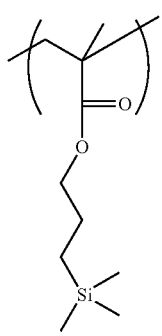
(RC-2)

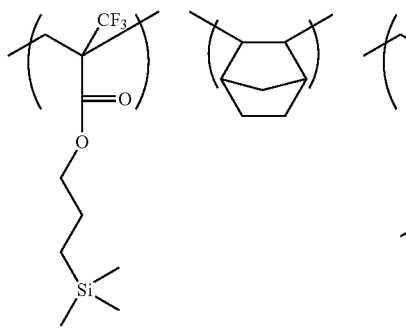
(RC-3)

-continued

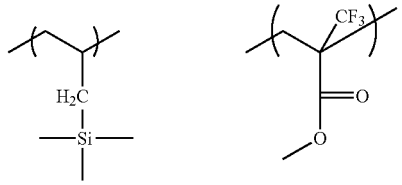
(RC-4)

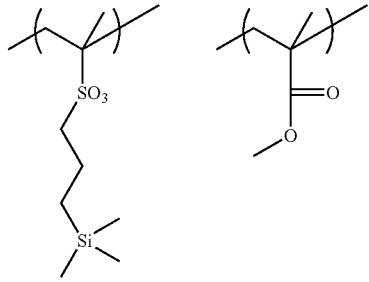
(RC-5)

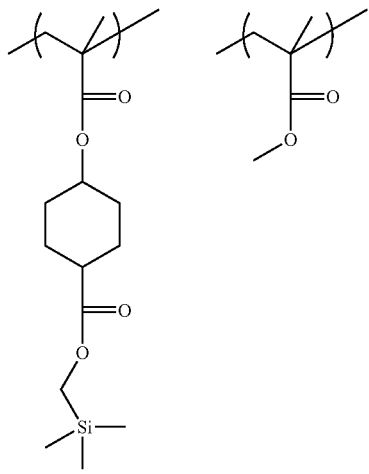
(RC-6)

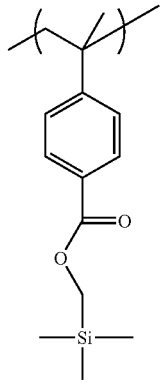
(RC-7)

-continued
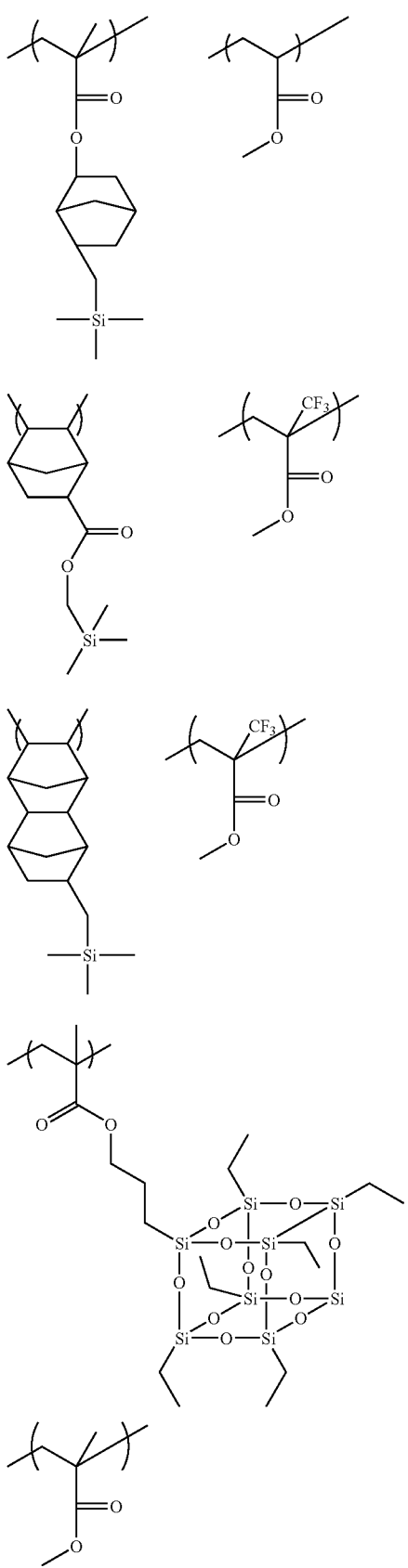
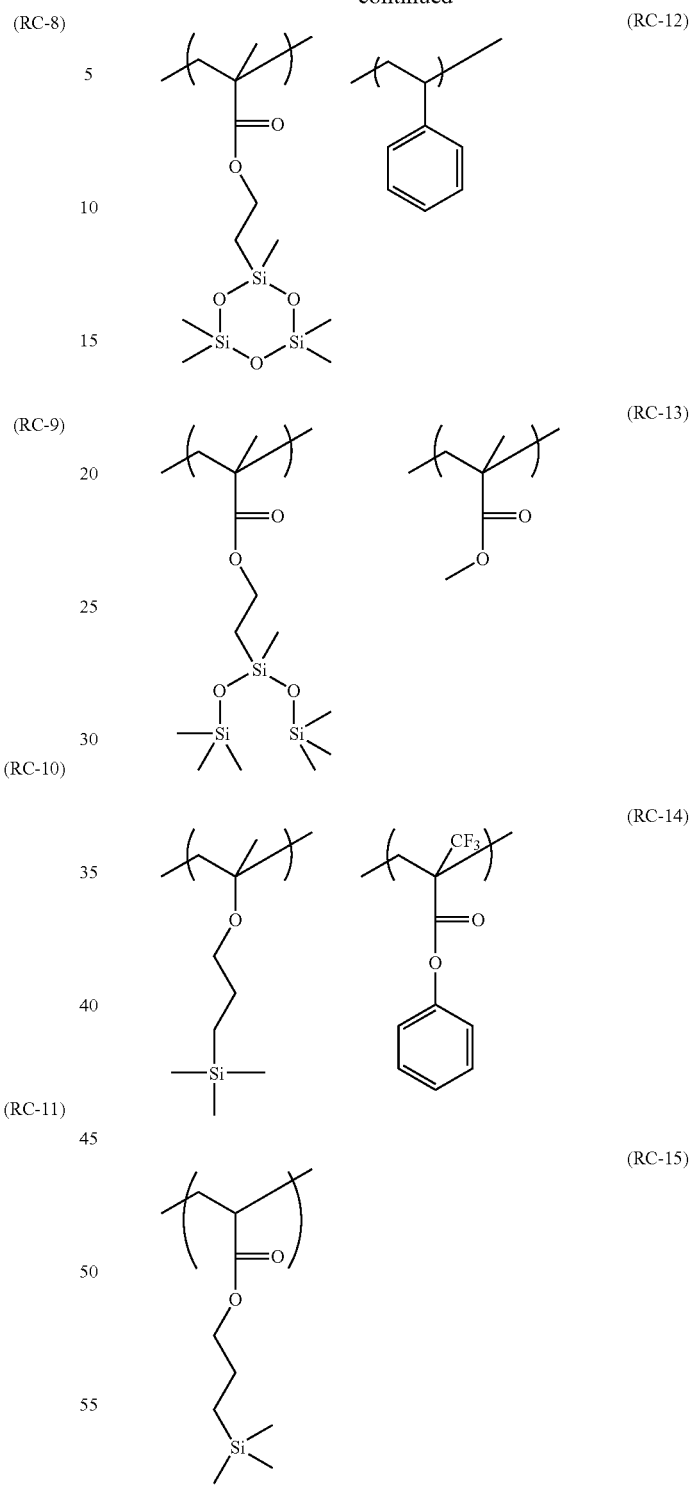
The following Table 4 indicates the composition ratios (by mol), weight average-molecular weights (Mw) and dispersion degrees (Mw/Mn) of the resins (RC-1-A) to (RC-1-D) and (RC-2) to (RC-15) to be used as the component (C). The composition ratio of each of the resins (RC-1-A) to (RC-1-D) and (RC-2) to (RC-15) corresponds to the individual repeating units from the left.

TABLE 4

| Resin | Composition ratio | Mw | Mw/Mn |
|---|---|---|---|
| RC-1-A | 50/50 | 25000 | 2.2 |
| RC-1-B | 50/50 | 800 | 1.3 |
| RC-1-C | 50/50 | 60000 | 2.9 |
| RC-1-D | 50/50 | 25000 | 3.5 |
| RC-2 | — | 5000 | 1.5 |
| RC-3 | 30/50/20 | 25000 | 2.3 |
| RC-4 | 50/50 | 9000 | 1.5 |
| RC-5 | 30/70 | 4000 | 1.6 |
| RC-6 | 45/55 | 20000 | 2.5 |
| RC-7 | — | 35000 | 3.3 |
| RC-8 | 30/70 | 9000 | 2.4 |
| RC-9 | 50/50 | 15000 | 2.5 |
| RC-10 | 50/50 | 40000 | 2.9 |
| RC-11 | 20/80 | 10000 | 2.2 |
| RC-12 | 25/75 | 23000 | 2.2 |
| RC-13 | 30/60 | 2500 | 1.4 |
| RC-14 | 50/50 | 25000 | 2.4 |
| RC-15 | 100 | 5000 | 1.1 |

Examples 1 to 45 and Comparative Examples 1 and 2

Preparation of Resist

The components listed in the following Tables 5 to 8 were dissolved in the solvents and thus individual solutions having a solid concentration of 7% by mass were prepared. These solutions were filtered through a 0.1 mm polyethylene filter to give a positive resist composition solutions. The positive resist composition solutions thus prepared were evaluated by the following methods. Tables 5 to 8 show the results. In the case of using two or more components listed in Tables 5 to 8, the ratio thereof is expressed by mass.

Examples 1 to 31 and Comparative Examples 1 and 2

Image Performance Test (Exposure Conditions (1))

An organic antireflective film ARC29A (manufactured by Nissan Chemical Industries, Ltd.) was applied to a silicone wafer and baked at 205° C. for 60 seconds to thereby form an antireflective film of 78 nm. Then the positive resist composition solution prepared above was coated thereon and baked at 120° C. for 60 seconds to form a resist film of 250 nm. The obtained wafer was subjected to pattern exposure with the use of an ArF excimer laser scanner (manufactured by ASML, PASS 5500/1100, NA 0.75, o/i=0.85/0.55). Next, it was heated at 120° C. for 60 seconds and developed by using an aqueous tetramethylammonium hydroxide solution (2.38% by mass) for 30 seconds, rinsed with purified water and dried by spinning to give a resist pattern.

(Exposure Conditions (2))

The present conditions were employed to form a resist pattern by the immersion exposure method with the use of purified water.

An organic antireflective film ARC29A (manufactured by Nissan Chemical Industries, Ltd.) was applied to a silicone wafer and baked at 205° C. for 60 seconds to thereby form an antireflective film of 78 nm. Then the positive resist composition solution prepared above was coated thereon and baked at 120° C. for 60 seconds to form a resist film of 250 nm. The obtained wafer was subjected to pattern exposure with the use of an ArF excimer laser immersion scanner (NA 0.75). As the immersion liquid, extra-purified water with a concentration of contaminants of 5 ppb or less was employed. Next, it was heated at 120° C. for 60 seconds and developed by using an aqueous tetramethylainmonium hydroxide solution (2.38% by mass) for 30 seconds, rinsed with purified water and dried by spinning to give a resist pattern.

Examples 32 to 45

Image Performance Test (Exposure Conditions (1))

An organic antireflective film ARC29A (manufactured by Nissan Chemical Industries, Ltd.) was applied to a silicone wafer and baked at 205° C. for 60 seconds to thereby form an antireflective film of 78 nm. Then the positive resist composition solution prepared above was coated thereon and baked at the pre-exposure baking temperature listed in Table 9 for 60 seconds to form a resist film of 250 nm. The obtained wafer was subjected to pattern exposure with the use of an ArF excimer laser scanner (manufactured by ASML, PASS 5500/1100, NA 0.75, o/i=0.85/0.55). Next, it was heated at the post-exposure baking temperature listed in Table 9 for 60 seconds and developed by using an aqueous tetramethylammonium hydroxide solution (2.38% by mass) for the time period listed in Table 9, rinsed with purified water and dried by spinning to give a resist pattern.

(Exposure Conditions (2))

The present conditions were employed to form a resist pattern by the immersion exposure method with the use of purified water.

An organic antireflective film ARC29A (manufactured by Nissan Chemical Industries, Ltd.) was applied to a silicone wafer and baked at 205° C. for 60 seconds to thereby form an antireflective film of 78 nm. Then the positive resist composition solution prepared above was coated thereon and baked at the pre-exposure baking temperature listed in Table 9 for 60 seconds to form a resist film of 250 nm. The obtained wafer was subjected to pattern exposure with the use of an ArF excimer laser immersion scanner (NA 0.75). As the immersion liquid, extra-purified water with a concentration of contaminants of 5 ppb or less was employed. Next, it was heated at the post-exposure baking temperature listed in Table 9 for 60 seconds and developed by using an aqueous tetramethylammonium hydroxide solution (2.38% by mass) for the time period listed in Table 9, rinsed with purified water and dried by spinning to give a resist pattern.

[Evaluation of Pattern Misshaping]

Using the resist patterns obtained by the two exposure methods as described above, the difference between the limiting pattern misshaping line width obtained under the exposure conditions 1 and that obtained under the exposure conditions 2 was referred to as the difference in limiting pattern misshaping line width. The term "limiting pattern misshaping line width" as used herein means the line width at which a pattern can be resolved at a fine mask size without misshaping, when the exposure dose enabling the reproduction of a 130 nm line-and-space 1:1 mask pattern is referred to as the optimum exposure dose and a dense pattern of line-and space 1:1 and an isolated pattern of line-and-space 1:10 are exposed at the optimum exposure dose. A smaller difference means the less effect of the water-treatment on the pattern misshaping, i.e., being suitable for immersion exposure.

[Follow-Up to Water]

The positive resist composition solution prepared above was coated on a silicone wafer and baked at 115° C. for 60 seconds to form a resist film of 200 nm. Next, 15 ml of distilled water was pipetted onto the center of the obtained wafer 1 coated with the positive resist solution, as shown in FIG. 1. Then, a quartz plate 3 (10 cm×10 cm) provided with a kite string 2 was placed on the distilled water paddle so that the entire space between the wafer 1 and the quartz plate 3 was filled with the distilled water 4.

Next, the kite string 2 attached to the quartz plate 3 was wound around a rotating member of a motor 5 rotating at a speed of 30 cm/sec while fixing the wafer 1. The motor 5 was driven for 0.5 second so that the quartz plate 3 was shifted. After shifting the quartz plate 3, the amount of the distilled water remaining under the quartz plate 3 was determined in accordance with the following criteria and employed as an indication of follow-up to water.

FIGS. 2A to 2D schematically show various patterns observed the quartz plate 3 from top after shifting the quartz plate 3. A shaded part 6 shows an area in which the distilled water remains under the quartz plate 3, while an open part 7 shows an area in which the distilled water fails to follow-up and air enters therein.

Figure 2A:
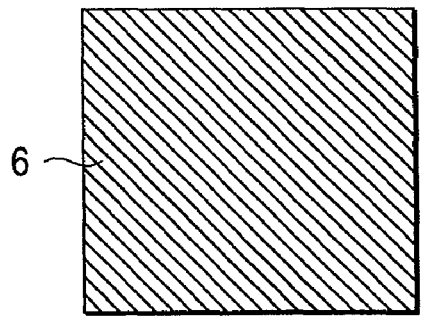
FIGS. 2A to 2D are schematic diagrams which shows the follow-up to water to a quartz plate.
Figure 2B:
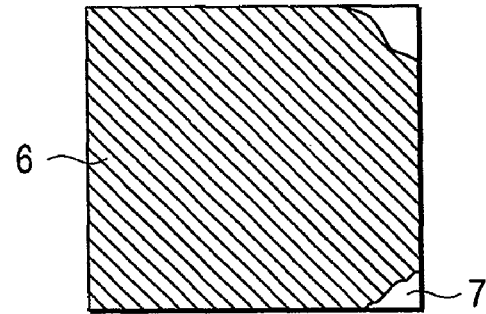
Figure 2C:
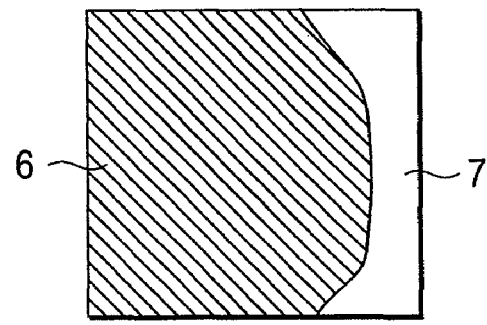
Figure 2D:
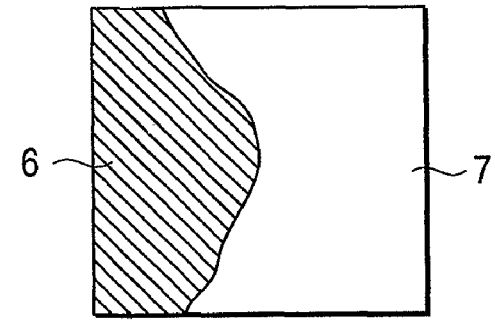

The case in FIG. 2A wherein the distilled water remains on the whole face of the substrate after shifting the quartz plate 3 is referred to as having follow-up to water A; the case in FIG. 2B wherein the area having air entering therein amounts to about 10% of the whole substrate area is referred to as having follow-up to water B; the case in FIG. 2C wherein the area having air entering therein amounts to 20% or more but not more than 50% of the whole substrate area is referred to as having follow-up to water C; and the case in FIG. 2D wherein the area having air entering therein amounts to about 50% or more of the whole substrate area is referred to as having follow-up to water D.

TABLE 5

| | Composition | | | | | | Exposure conditions (1) Pattern misshaping line width | Exposure conditions (2) | | |
|---|---|---|---|---|---|---|---|---|---|---|
| | Resin of component (A) (2 g) | Acid-generator (mg) | Solvent | Basic compound (mg) | Resin of component (C) (mg) | Surfactant (mg) | | Pattern misshaping line width | Follow-up to water | Difference in pattern misshaping line width |
| Ex. 1 | RA-1 | z2 (80) | SL-1/SL-2 60/40 | N-5 (7) | RC-1-A (80) | W-1 (3) | 80 | 85 | A | 5 |
| Ex. 2 | RA-1 | z2 (80) | SL-1/SL-2 60/40 | N-5 (7) | RC-1-B (80) | W-1 (3) | 85 | 90 | B | 5 |
| Ex. 3 | RA-1 | z2 (80) | SL-1/SL-2 60/40 | N-5 (7) | RC-1-C (80) | W-1 (3) | 90 | 100 | B | 10 |
| Ex. 4 | RA-1 | z2 (80) | SL-1/SL-2 60/40 | N-5 (7) | RC-1-D (80)) | W-1 (3) | 85 | 90 | B | 5 |
| Ex. 5 | RA-1 | z2 (80) | SL-1/SL-2 60/40 | — | RC-1-A (80) | W-1 (3) | 90 | 100 | B | 10 |
| Ex. 6 | RA-1 | z2 (80) | SL-1/SL-2 60/40 | N-5 (7) | RC-1-A (80) | — | 85 | 90 | B | 5 |
| Ex. 7 | RA-1 | z2 (80) | SL-1/SL-3 60/40 | N-5 (7) | RC-1-A (80) | W-1 (3) | 85 | 90 | B | 5 |
| Ex. 8 | RA-1 | z2 (80) | SL-1/SL-2 60/40 | N-5 (7) | RC-1-A (80) | W-1 (3) | 85 | 90 | B | 5 |
| Ex. 9 | RA-1 | z2 (80) | SL-1/SL-2 60/40 | N-5 (7) | RC-5 (80) | W-1 (3) | 85 | 90 | B | 5 |
| Ex. 10 | RA-1 | z2 (80) | SL-1/SL-2 60/40 | N-5 (7) | RC-14 (80) | W-1 (3) | 85 | 90 | B | 5 |
| Ex. 11 | RA-2 | z60/z65 (80) | SL-2/SL-4/SL-6 40/59/1 | N-2 (9) | RC-2 (35) | W-1 (3) | 80 | 85 | B | 5 |
| Ex. 12 | RA-3 | z51 (100) | SL-2/SL-4 70/30 | N-5 (7) | RC-3 (60) | W-4 (4) | 90 | 100 | A | 10 |
| Ex. 13 | RA-4 | z55/z65 (40/60) | SL-2/SL-4 60/40 | N-1 (7) | RC-4 (90) | W-1 (3) | 80 | 85 | A | 5 |
| Ex. 14 | RA-5 | z55/z65 (20/80) | SL-1/SL-2 50/50 | N-3 (6) | RC-5 (80) | W-4 (3) | 90 | 100 | B | 10 |
| Ex. 15 | RA-6 | z16 (110) | SL-1/SL-2 30/70 | N-5 (7) | RC-6 (30) | W-5 (5) | 85 | 90 | A | 5 |
| Ex. 16 | RA-7 | z62 (120) | SL-2/SL-4/SL-6 40/59/1 | N-1 (7) | RC-7 (7) | W-1 (3) | 90 | 100 | A | 10 |
| Ex. 17 | RA-8 | z55/z51 (40/60) | SL-2/SL-4 60/40 | N-3 (6) | RC-8 (20) | W-2 (3) | 90 | 100 | A | 10 |
| Ex. 18 | RA-9 | z65/z9 (100/10) | SL-2/SL-4 60/40 | — | RC-9 (10) | W-4 (5) | 90 | 100 | A | 10 |
| Ex. 19 | RA-10 | z62 (100) | SL-1/SL-2 60/40 | N-5 (7) | RC-10 (60) | W-2 (3) | 85 | 95 | A | 10 |
| Ex. 20 | RA-11 | z16 (90) | SL-2/SL-4/SL-6 40/59/1 | N-6 (10) | RC-11 (95) | W-1 (4) | 90 | 95 | A | 5 |
| Ex. 21 | RA-12 | z55 (80) | SL-2/SL-4 70/30 | N-3 (6) | RC-12 (65) | W-4 (3) | 85 | 90 | A | 5 |
| Ex. 22 | RA-13 | z51 (100) | SL-2/SL-4 70/30 | — | RC-13 (40) | W-3 (3) | 85 | 90 | A | 5 |
| Ex. 23 | RA-14 | z62 (100) | SL-1/SL-2 60/40 | N-6 (10) | RC-14 (95) | W-1 (4) | 90 | 100 | B | 10 |

TABLE 5-continued

| | Composition | | | | | | Exposure conditions | | | |
|---|---|---|---|---|---|---|---|---|---|---|
| | | | | | | | Exposure conditions (1) | Exposure conditions (2) | | |
| | Resin of component (A) (2 g) | Acid-generator (mg) | Solvent | Basic compound (mg) | Resin of component (C) (mg) | Surfactant (mg) | Pattern misshaping line width | Pattern misshaping line width | Follow-up to water | Difference in pattern misshaping line width |
| C. Ex. 1 | RA-1 | z2 (80) | SL-1/SL-2 60/40 | N-5 (7) | — | W-1 (3) | 100 | 125 | D | 25 |
| C. Ex. 2 | RA-10 | z62 (100) | SL-1/SL-2 60/40 | N-5 (7) | — | W-2 (3) | 105 | 125 | D | 20 |

TABLE 6

| | Composition | | | | | | Exposure conditions | | | |
|---|---|---|---|---|---|---|---|---|---|---|
| | | | | | | | Exposure conditions (1) | Exposure conditions (2) | | |
| | Resin of component (A) (2 g) | Acid-generator (mg) | Solvent | Basic compound (mg) | Resin of component (C) (mg) | Surfactant (mg) | Pattern misshaping line width | Pattern misshaping line width | Follow-up to water | Difference in pattern misshaping line width |
| Ex. 24 | RA-15 | z62 (120) | SL-2/SL-4/SL-6 40/59/1 | N-1 (7) | RC-7 (7) | W-1 (3) | 80 | 85 | A | 5 |
| Ex. 25 | RA-16 | z55/z51 (40/60) | SL-2/SL-4 60/40 | N-3 (6) | RC-8 (20) | W-2 (3) | 85 | 90 | A | 5 |
| Ex. 26 | RA-17 | z65/z9 (100/10) | SL-2/SL-4 60/40 | — | RC-9 (10) | W-4 (5) | 80 | 85 | A | 5 |
| Ex. 27 | RA-18 | z62 (100) | SL-1/SL-2 60/40 | N-6 (10) | RC-14 (95)) | W-1 (4) | 85 | 90 | A | 5 |
| Ex. 28 | RA-1 | z2 (80) | SL-1/SL-2 60/40 | — | RC-1-A (150) | W-1 (3) | 100 | 110 | B | 10 |
| Ex. 29 | RA-1 | z2 (80) | SL-1/SL-2 60/40 | — | RC-1-A (100) | W-1 (3) | 95 | 105 | B | 10 |
| Ex. 30 | RA-1 | z2 (80) | SL-1/SL-2 60/40 | — | RC-1-A (40) | W-1 (3) | 85 | 95 | B | 10 |
| Ex. 31 | RA-1 | z2 (80) | SL-1/SL-2 60/40 | — | RC-1-A (15) | W-1 (3) | 80 | 85 | B | 5 |

TABLE 7

| | Composition | | | | | | Exposure conditions | | | |
|---|---|---|---|---|---|---|---|---|---|---|
| | | | | | | | Exposure conditions (1) | Exposure conditions (2) | | |
| | Resin of component (A) (2 g) | Acid-generator (mg) | Solvent | Basic compound (mg) | Resin of component (C) (mg) | Surfactant (mg) | Pattern misshaping line width (nm) | Pattern misshaping line width (nm) | Follow-up to water | Difference in pattern misshaping line width (nm) |
| Ex. 32 | RA-19 | z23/z42 (100/10) | SL-2/SL-4/SL-6 40/59/1 | N-1/N-5 (7/3) | RC-15 (7) | W-1 (3) | 80 | 85 | A | 5 |
| Ex. 33 | RA-20 | z23/z31 (40/60) | SL-2/SL-4 60/40 | N-1/N-4 (4/3) | RC-13/RC-15 (70/30) | W-2 (3) | 85 | 90 | A | 5 |
| Ex. 34 | RA-21 | z23/z37 (100/10) | SL-2/SL-4 60/40 | N-3/N-5 (5/3) | RC-14/RC-15 (40/30) | W-4 (5) | 80 | 85 | A | 5 |
| Ex. 35 | RA-22 | z3 (100) | SL-1/SL-2 60/40 | N-4/N-5 (7/2) | RC-1-A/RC-15 (40/30) | W-6 (4) | 85 | 90 | A | 5 |
| Ex. 36 | RA-10/RA-21 (1.5 g/0.5 g) | z23 (80) | SL-1/SL-3 60/40 | N-4/N-6 (7/1) | RC-1-A/RC-5 (40/10) | W-7 (3) | 100 | 110 | B | 10 |
| Ex. 37 | RA-9/RA-21 (1.0 g/1.0 g) | z53 (80) | SL-1/SL-4 60/40 | — | RC-1-A/RC-5 (40/50) | w-1 (3) | 95 | 105 | B | 10 |
| Ex. 38 | RA-1/RA-10 (1.0 g/1.0 g) | z62 (80) | SL-1/SL-5 60/40 | — | RC-1-A (40) | W-1 (3) | 85 | 95 | B | 10 |
| Ex. 39 | RA-1 | z65 (80) | SL-2/SL-3 60/40 | — | RC-1-A (15) | W-1 (3) | 80 | 85 | B | 5 |

TABLE 8

| | Composition | | | | | | Exposure conditions | | | |
|---|---|---|---|---|---|---|---|---|---|---|
| | | | | | | | Exposure conditions (1) | Exposure conditions (2) | | |
| | Resin of component (A) (2 g) | Acid-generator (mg) | Solvent | Basic compound (mg) | Resin of component (C) (mg) | Surfactant (mg) | Pattern misshaping line width (nm) | Pattern misshaping line width (nm) | Follow-up to water | Difference in pattern misshaping line width (nm) |
| Ex. 40 | RA-1 | z68 (80) | SL-2/SL-4 60/40 | N-7 (6) | RC-1-A (15) | W-7/W-1 (4/3) | 80 | 85 | B | 5 |
| Ex. 41 | RA-1 | Z69 (80) | SL-2/SL-5 60/40 | — | RC-1-C/RC-3 (20/30) | W-3/W-1 (2/3) | 80 | 85 | B | 5 |
| Ex. 42 | RA-1 | z23/z41 (100/10) | SL-2/SL-8 60/40 | N-4/N-7 (7/3) | RC-1-A (15) | W-6/W-7 (4/1) | 80 | 85 | B | 5 |
| Ex. 43 | RA-1 | z4 (80) | SL-2/SL-6 60/40 | N-3/N-5 (7/3) | RC-1-A (15) | W-6/W-7 (4/1) | 80 | 85 | B | 5 |
| Ex. 44 | RA-19 | z5/58 (40/60) | SL-2/SL-4 60/40 | N-7 (6) | RC-1-A (15) | W-7/W-1 (4/3) | 80 | 85 | B | 5 |
| Ex. 45 | RA-19 | z5/61 (40/60) | SL-1/SL-2 60/40 | N-1/N-5 (7/1) | RC-15 (7) | w-7 (3) | 100 | 110 | B | 10 |

TABLE 9

| | Pre-exposure baking temperature (° C.) | Post-exposure baking temperature (° C.) | Development time (s) |
|---|---|---|---|
| Ex. 32 | 120 | 120 | 60 |
| Ex. 33 | 90 | 90 | 90 |
| Ex. 34 | 130 | 100 | 30 |
| Ex. 35 | 110 | 110 | 30 |
| Ex. 36 | 100 | 100 | 30 |
| Ex. 37 | 120 | 110 | 60 |
| Ex. 38 | 120 | 100 | 90 |
| Ex. 39 | 90 | 130 | 30 |
| Ex. 40 | 130 | 90 | 60 |
| Ex. 41 | 110 | 100 | 60 |
| Ex. 42 | 100 | 130 | 90 |
| Ex. 43 | 110 | 100 | 60 |
| Ex. 44 | 130 | 120 | 90 |
| Ex. 45 | 90 | 100 | 90 |

The symbols employed in Tables 5 to 8 have each the following meaning. The acid-generating agents correspond to those which are exemplified above.
N-1: N,N'-dibutylaniline
N-2: N,N-dihexylaniline
N-3: 2,6-diisopropylaniline
N-4: tri-n-octylamine
N-5: N,N-dihydroxyethylaniline
N-6: 2,4,5-triphenylimidazole
N-7: triethanolamine
W-1: Megafac F176 (manufactured by Dainippon Ink & Chemicals, Inc.) (fluorine-based)
W-2: Megafac R08 (manufactured by Dainippon Ink & Chemicals, Inc.) (fluorine/silicone-based)
W-3: Polysiloxane polymer KP341 (manufactured by Shin-Etsu Chemical Industry Col., Ltd.) (silicone-based)
W-4: Troysol S-366 (manufactured by Troy Chemical Industries, Inc.)
W-5: PF656 (manufactured by OMNOVA, fluorine-based)
W-6: PF6320 (manufactured by OMNOVA, fluorine-based)
W-7: PF6520 (manufactured by OMNOVA, fluorine-based)
SL-1: cyclohexanone
SL-2: propylene glycol monomethyl ether acetate
SL-3: ethyl lactate
SL-4: propylene glycol monomethyl ether
SL-5: γ-butyrolactone
SL-6: propylene carbonate The results shown in Tables 5 to 8 clearly indicate that the positive resist compositions of the invention are excellent in follow-up to water in immersion exposure and show favorable pattern misshaping both in usual exposure and immersion exposure.

According to the invention, it is possible to provide a positive resist composition which shows relieved pattern misshaping caused by usual exposure or immersion exposure and has excellent follow-up to water in immersion exposure, and a pattern making method using the same.

The entire disclosure of each and every foreign patent application from which the benefit of foreign priority has been claimed in the present application is incorporated herein by reference, as if fully set forth.

What is claimed is:

1. A positive resist composition comprising:
(A) a resin that increases its solubility in an alkali developer by the action of an acid, and has a repeating unit having a lactone group;
(B) a compound being capable of generating an acid when irradiated with an actinic ray or a radiation;
(C) a resin having at least one of a silicon-containing repeating unit represented by general formula (I) and a silicon-containing repeating unit represented by general formula (II) and being stable to acids but insoluble in an alkali developer; and
(D) a solvent:

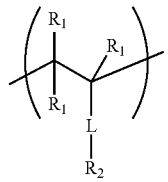

(I)

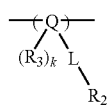

(II)

wherein L represents a single bond or a divalent linking group;
$R_1$'s each independently represents a hydrogen atom, a halogen atom, an alkyl group, a cycloalkyl group, an alkoxy group or an alkoxycarbonyl group;
$R_2$ represents a monovalent organic group having at least one silicon atom;

$R_3$ represents a hydrogen atom, a halogen atom, a cyano group or a monovalent organic group;

Q represents an alicyclic structure; and k represents an integer of from 0 to 3.

2. The positive resist composition according to claim 1, wherein the content of the resin (C) is from 0.1 to 5% by mass based on a total solid content of the positive resist composition.

3. A positive resist film having a sweepback contact angle of from 50° to 90° produced from a composition comprising:
   (A) a resin that increases its solubility in an alkali developer by the action of an acid, and has a repeating unit having a lactone group;
   (B) a compound being capable of generating an acid when irradiated with an actinic ray or a radiation;
   (C) a resin having at least one of a silicon-containing repeating unit represented by general formula (I) and a silicon-containing repeating unit represented by general formula (II) and being stable to acids but insoluble in an alkali developer; and
   (D) a solvent:

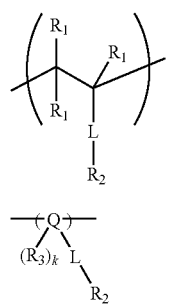

wherein L represents a single bond or a divalent linking group;

$R_1$'s each independently represents a hydrogen atom, a halogen atom, an alkyl group, a cycloalkyl group, an alkoxy group or an alkoxycarbonyl group;

$R_2$ represents a monovalent organic group having at least one silicon atom;

$R_3$ represents a hydrogen atom, a halogen atom, a cyano group or a monovalent organic group;

Q represents an alicyclic structure; and k represents an integer of from 0 to 3; and wherein the content of the resin (C) is from 0.1 to 5% by mass based on a total solid content of the positive resist composition.

4. The positive resist film according to claim 3, wherein the sweepback contact angle is from 60° to 80°.

5. The positive resist composition according to claim 1, wherein the resin (C) contains not more than 10% by mass of monomers remaining therein (residual monomers).

6. The positive resist composition according to claim 1, wherein the resin (C) contains not more than 5% by mass of monomers remaining therein (residual monomers).

7. The positive resist composition according to claim 1, wherein the solvent (D) comprises a solvent having no hydroxyl group.

8. The positive resist composition according to claim 1, wherein the solvent (D) comprises γ-butyrolactone.

9. The positive resist composition according to claim 1, wherein the solvent (D) comprises propylene carbonate.

10. The positive resist composition according to claim 1, further comprising a surfactant.

11. The positive resist composition according to claim 1, wherein the repeating unit having a lactone group is represented by the following formula (AI):

wherein $Rb_0$ represents a hydrogen atom, a halogen atom or an alkyl group having from 1 to 4 carbon atoms, Ab represents an alkylene group, a divalent linking group having a monocyclic or polycyclic alicyclic hydrocarbon structure, a single bond, an ether group, an ester group, a carbonyl group, a carboxyl group or a divalent group comprising a combination thereof, and V represents a group having a lactone structure represented by any one of the general formulae (LC1-1) to (LC 1-16):

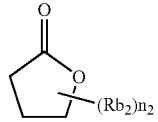
LC1-1

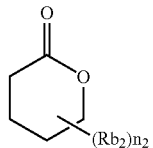
LC1-2

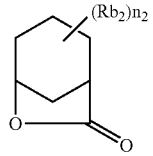
LC1-3

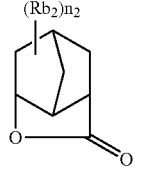
LC1-4

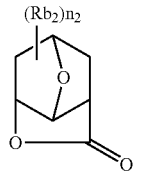
LC1-5

-continued
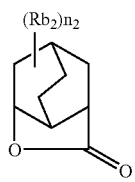
LC1-6
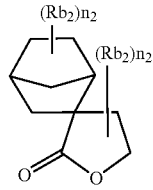
LC1-12
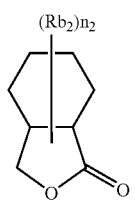
LC1-7
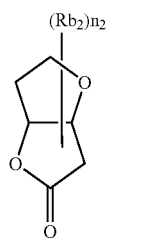
LC1-13
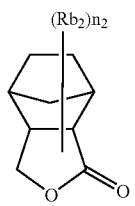
LC1-8
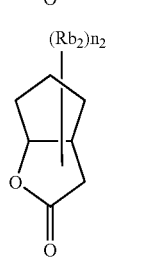
LC1-14
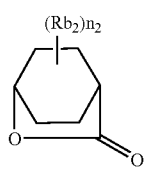
LC1-9
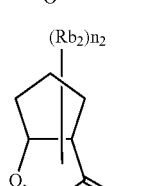
LC1-15
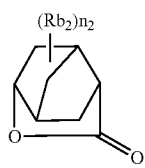
LC1-10
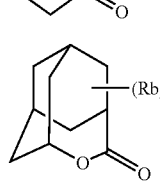
LC1-16
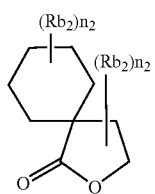
LC1-11
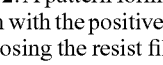
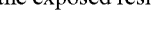
12. A pattern forming method comprising: forming a resist film with the positive resist composition according to claim 1, exposing the resist film in an immersion liquid, and developing the exposed resist film.
* * * * *